United States Patent
Lee et al.

(10) Patent No.: US 12,143,008 B2
(45) Date of Patent: Nov. 12, 2024

(54) VOLTAGE DIVIDING CAPACITOR CIRCUITS AND SUPPLY MODULATORS INCLUDING THE SAME

(71) Applicant: Samsung Electronics Co., Ltd., Suwon-si (KR)

(72) Inventors: Jeongkwang Lee, Hwaseong-si (KR); Ikhwan Kim, Hwaseong-si (KR); Takahiro Nomiyama, Suwon-si (KR); Youngho Jung, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 254 days.

(21) Appl. No.: 17/702,163

(22) Filed: Mar. 23, 2022

(65) Prior Publication Data
US 2023/0050531 A1    Feb. 16, 2023

(30) Foreign Application Priority Data

Aug. 13, 2021   (KR) .......................... 10-2021-0107126

(51) Int. Cl.
*H02M 3/07*       (2006.01)
*H02M 1/00*       (2006.01)
(Continued)

(52) U.S. Cl.
CPC .............. *H02M 3/07* (2013.01); *H02M 1/009* (2021.05); *H02M 3/158* (2013.01);
(Continued)

(58) Field of Classification Search
CPC ......... H02M 3/07; H02M 1/009; H02M 3/158
See application file for complete search history.

(56) References Cited

U.S. PATENT DOCUMENTS

| 7,696,735 B2 | 4/2010 | Oraw et al. |
| 9,075,673 B2 | 7/2015 | Khlat et al. |
(Continued)

FOREIGN PATENT DOCUMENTS

| EP | 3965277 A1 | 3/2022 |
| WO | WO-2020/205046 A1 | 10/2020 |

OTHER PUBLICATIONS

Extended European Search Report dated Oct. 27, 2022 for corresponding European Application No. 22174429.5.
(Continued)

*Primary Examiner* — Jue Zhang
*Assistant Examiner* — Afework S Demisse
(74) *Attorney, Agent, or Firm* — Harness, Dickey & Pierce, P.L.C.

(57) ABSTRACT

A voltage dividing capacitor circuit includes first capacitor through third capacitor dividers and first through fourth load capacitors. The first capacitor divider includes a first flying capacitor and a plurality of first switches connected in series between a first voltage node and a ground node, and is connected to a second voltage node. The second capacitor divider is connected to the first voltage node, the second voltage node, and a first intermediate voltage node. The third capacitor divider is connected to the second voltage node, the ground voltage node, and a second intermediate voltage node. The first through fourth load capacitors are connected in series between the first voltage node and the ground node. The second capacitor divider includes a second flying capacitor and a plurality of second switches connected in series between the first voltage node and the second voltage node.

20 Claims, 33 Drawing Sheets

(51) Int. Cl.
  *H02M 3/158*  (2006.01)
  *H03F 1/02*  (2006.01)
  *H03F 3/195*  (2006.01)
  *H03F 3/24*  (2006.01)
(52) U.S. Cl.
  CPC ........... *H03F 1/0227* (2013.01); *H03F 3/195* (2013.01); *H03F 3/245* (2013.01); *H03F 2200/102* (2013.01); *H03F 2200/451* (2013.01)

(56) References Cited

U.S. PATENT DOCUMENTS

| | | |
|---|---|---|
| 9,247,496 B2 | 1/2016 | Khlat |
| 9,614,477 B1 | 4/2017 | Rozenblit et al. |
| 9,755,672 B2 | 9/2017 | Perreault et al. |
| 10,171,038 B1 | 1/2019 | Chen et al. |
| 10,855,228 B2 | 12/2020 | Eichler et al. |
| 2009/0322384 A1* | 12/2009 | Oraw ................. H02M 3/07 327/112 |
| 2016/0308493 A1* | 10/2016 | Ayraud ................. H03F 3/211 |
| 2018/0152144 A1* | 5/2018 | Choo ................. H03F 1/0227 |
| 2021/0257971 A1* | 8/2021 | Kim ................. H03F 3/245 |
| 2022/0075401 A1 | 3/2022 | Lee et al. |

OTHER PUBLICATIONS

S.Xiong, et al. 'A Series of Exponential Step-Down Switched-Capacitor Converters and Their Applications in Two-Stage Converters' *IEEE*, 978-1-4673-5762, 2013, pp. 701-704.

\* cited by examiner

Φ1:HIGH, Φ1B:LOW

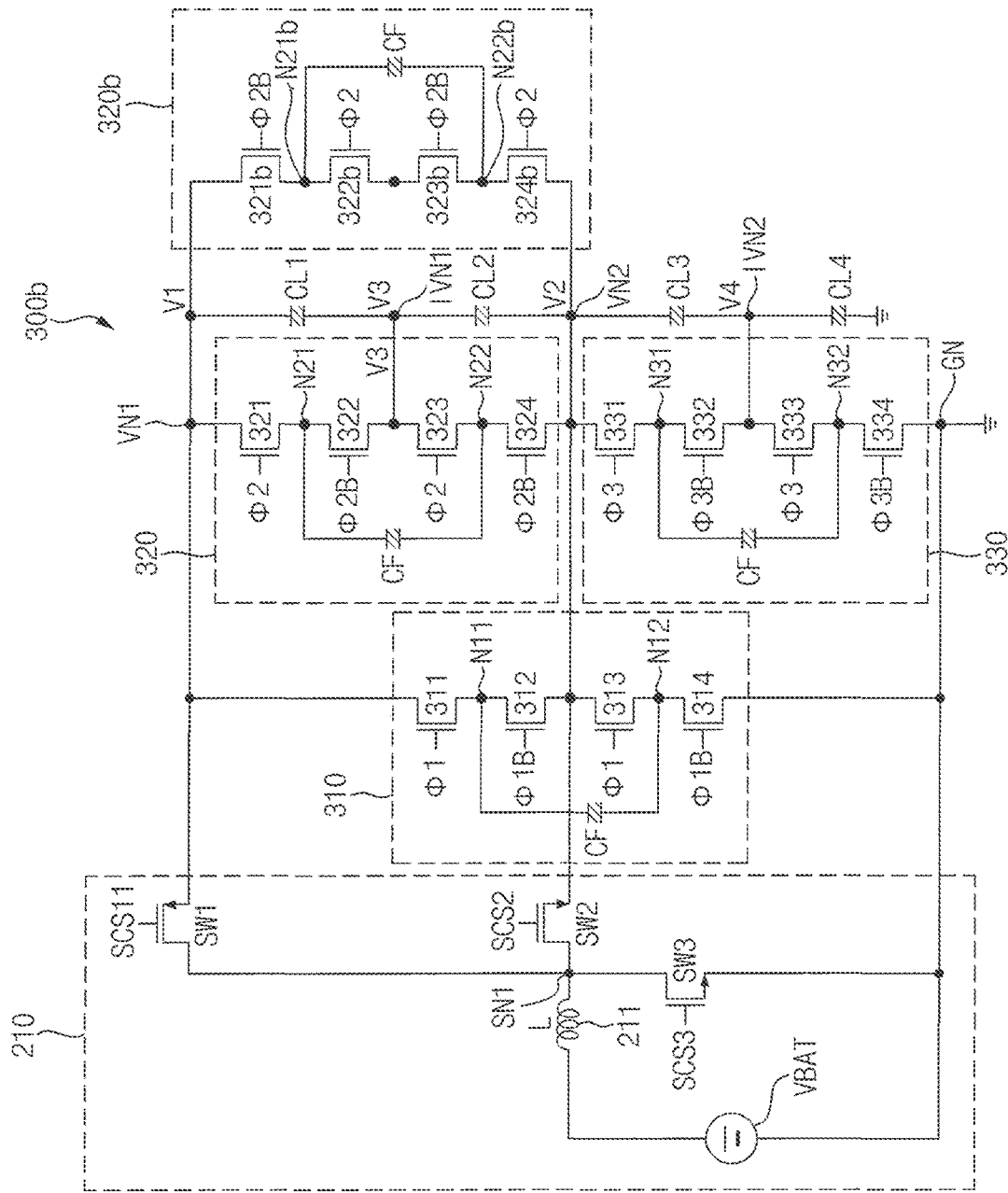

VOLTAGE DIVIDING CAPACITOR CIRCUITS AND SUPPLY MODULATORS INCLUDING THE SAME

CROSS-REFERENCE TO RELATED APPLICATIONS

This US application claims the benefit of priority under 35 USC § 119 to Korean Patent Application No. 10-2021-0107126, filed on Aug. 13, 2021 the disclosure of which is incorporated by reference in its entirety.

BACKGROUND

1. Technical Field

Example embodiments generally relate to voltage converters in integrated circuits, and more particularly to voltage dividing capacitor circuits and supply modulators including the same.

2. Discussion of the Related Art

Wireless communication devices, such as smartphones, tablets, and Internet of Things (IoT) devices, etc., use WCDMA (3G), LTE, LTE Advanced (4G), 5G New Radio (NR), etc., technology for high speed communication. As communication technology has advanced, transmission and/or reception signals having a higher peak-to-average power ratio (PAPR) and a greater bandwidth have become desired and/or required. If a power supply of a power amplifier of a transmission end is connected to a battery, the efficiency of the power amplifier decreases. Average power tracking (APT) and/or envelope tracking (ET) is used in order to increase the efficiency of a power amplifier having a high PAPR and a large bandwidth. A chip that supports the APT technique and/or ET technique is referred to as a supply modulator.

SUMMARY

Some example embodiments may provide a voltage dividing capacitor circuit capable of enhancing efficiency.

Some example embodiments may provide a supply modulator capable of performing discrete ET and enhancing efficiency.

According to some example embodiments, a voltage dividing capacitor circuit includes a first capacitor, a second capacitor divider, a third capacitor divider and first through fourth load capacitors. The first capacitor divider includes a first flying capacitor and a plurality of first switches. The first capacitor divider is connected to a first voltage node, a ground node, and a second voltage node between the first voltage node and the ground node. The plurality of first switches is connected in series between the first voltage node and the ground node. The ground node coupled to a ground voltage. The second capacitor divider is connected to the first voltage node, the second voltage node, and a first intermediate voltage node between the first voltage node and the second voltage node. The second capacitor divider includes a second flying capacitor and a plurality of second switches. The plurality of second switches is connected in series between the first voltage node and the second voltage node. The third capacitor divider is connected to the second voltage node, the ground voltage node, and a second intermediate voltage node between the second voltage node and the ground node. The first through fourth load capacitors are connected in series between the first voltage node and the ground node.

According to some example embodiments, a voltage dividing capacitor circuit includes a first capacitor divider, a second capacitor divider, a third capacitor divider and first through sixth load capacitors. The first capacitor divider includes a first flying capacitor and a plurality of first switches. The first capacitor divider is connected to a first voltage node, a second voltage node, and a first intermediate voltage node between the first voltage node and the second voltage node. The plurality of first switches is connected in series between the first voltage node and the second voltage node. The second capacitor divider includes a second flying capacitor and a plurality of second switches. The second capacitor divider is connected to the second voltage node, a third voltage node and a second intermediate voltage node between the second voltage node and the third voltage node. The plurality of second switches is connected in series between the second voltage node and the third voltage node. The third capacitor divider includes a third flying capacitor and a plurality of third switches. The third capacitor divider is connected to the third voltage node and a ground node, and a third intermediate voltage node between the third voltage node and the ground node. The plurality of third switches is connected in series between the third voltage node and the ground node. The ground node is coupled to a ground voltage. The first through sixth load capacitors are connected in series between the first voltage node and the ground node.

According to some example embodiments, a supply modulator includes a voltage dividing capacitor circuit and a DC-DC converter. The voltage dividing capacitor circuit includes at least two capacitor dividers and at least two load capacitors. The least two capacitor dividers are connected to a first voltage node, a ground node coupled to a ground voltage and a second voltage node between the first voltage node and the ground node, and the at least two load capacitors is connected in series between the first voltage node and the ground node. The DC-DC converter generates a current based on a battery voltage, and outputs the current to at least one of the first voltage node and the second voltage node. The voltage dividing capacitor circuit generates a plurality of voltages based on the current, and outputs the plurality of voltages to the first voltage node, the second voltage node and first and second intermediate voltage nodes, respectively. The plurality of voltages has a plurality of respective levels. The first intermediate voltage node is connected between the first voltage node and the second voltage node, and the second intermediate voltage node is connected between the second voltage node and the ground node.

Accordingly, the voltage dividing capacitor circuit includes a plurality of capacitor dividers connected to a first voltage node, a second voltage node and a ground node, and each of the capacitor dividers performs voltage conversion in response to phase control signal set. The DC-DC converter provides current at least one of the first and second voltage nodes based on battery voltage and the capacitor dividers provide output voltages to load capacitors using voltage based on the current. Therefore, the SIMO converter may rapidly provide a current to a target voltage node to obtain quick response characteristic and since each of the voltage nodes is coupled each of a plurality of load capacitors connected in series between a first voltage nod and the ground voltage, a size of each of the load capacitors may be reduced.

BRIEF DESCRIPTION OF THE DRAWINGS

Illustrative, non-limiting example embodiments will be more clearly understood from the following detailed description in conjunction with the accompanying drawings.

FIG. 8A is a circuit diagram illustrating an example of the voltage dividing capacitor circuit in the SIMO converter of FIG. 5A according to some example embodiments.

DETAILED DESCRIPTION OF THE EMBODIMENTS

Various example embodiments will be described more fully hereinafter with reference to the accompanying drawings, in which some example embodiments are shown.

Figure 1:
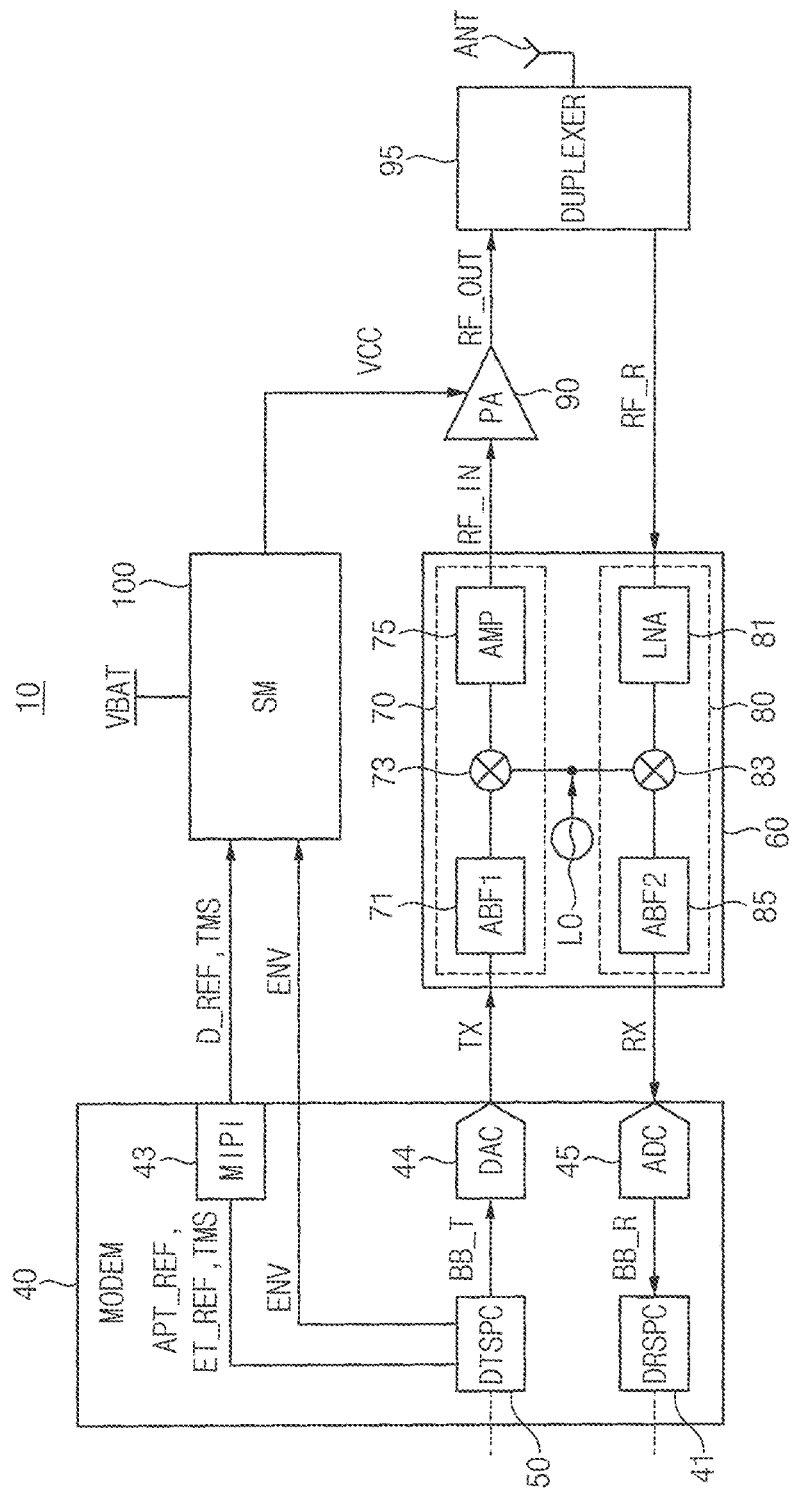
FIG. 1 is a block diagram illustrating a wireless communication device according to some example embodiments.

FIG. 1 is a block diagram illustrating a wireless communication device according to some example embodiments.

Referring to FIG. 1, a wireless communication device 10 may include a modem 40, a supply modulator (SM) 100, a radio frequency integrated circuit (RFIC) 60, a power amplifier (PA) 90 and an antenna ANT.

The modem 40 may include a digital transmission signal processing circuit (DTSPC) 50, a digital reception signal processing circuit (DRSPC) 40, a digital-to-analog converter (DAC) 44, an analog-to-digital converter (ADC) 45, and a mobile industry processor interface (MIPI) 43.

The modem 40 may process a baseband signal BB_T including information to be transmitted, the information including an in-phase (I) signal and/or a quadrature phase (Q) signal, etc., based on a desired and predetermined communication protocol using the DTSPC 50. The modem 40 may process a received baseband signal BB_R based on a desired and/or predetermined communication protocol using the DRSPC 41. For example, the modem 40 may process a signal to be transmitted according to a communication scheme, such as orthogonal frequency division multiplexing (OFDM), orthogonal frequency division multiple access (OFDMA), wideband code multiple access (WCDMA), and/or high speed packet access+(HSPA+). In addition, the modem 400 may process the baseband signal BB_T and/or BB_R according to and/or based on various types of communication schemes, e.g., radio access technologies (RATs), to which a technique of modulating the amplitude and frequency of a transmission signal is applied.

The modem 40 may extract at least one envelope of the baseband signal BB_T using the DTSPC 50, and may generate at least one envelope signal ENV based on the extracted envelope. The modem 40 may generate an average power tracking (APT) signal APT_REF based on APT table stored in a memory (not illustrated), may generate an envelope tracking (ET) reference signal ET_REF based on the envelope signal ENV, and may provide the APT signal APT_REF and the ET reference signal ET_REF to the supply modulator 100 through the MIPI 43. The extracted envelope may correspond to an amplitude (e.g., the magnitude of the I signal and Q signal) of the baseband signal BB_T. The modem 40 may generate a tracking mode signal TMS.

The APT table may store information on desired and/or required power supply voltage of the power amplifier 90 based on expected (e.g., anticipated, configured, designed, desired, etc.) power of the antenna ANT and may store information on average power signal corresponding to the desired and/or required power supply voltage. When the expected power of the antenna ANT is determined, the modem 40 may generate the average power signal based on the APT table and may provide the APT signal APT_REF to the supply modulator 100.

Figure 2A:
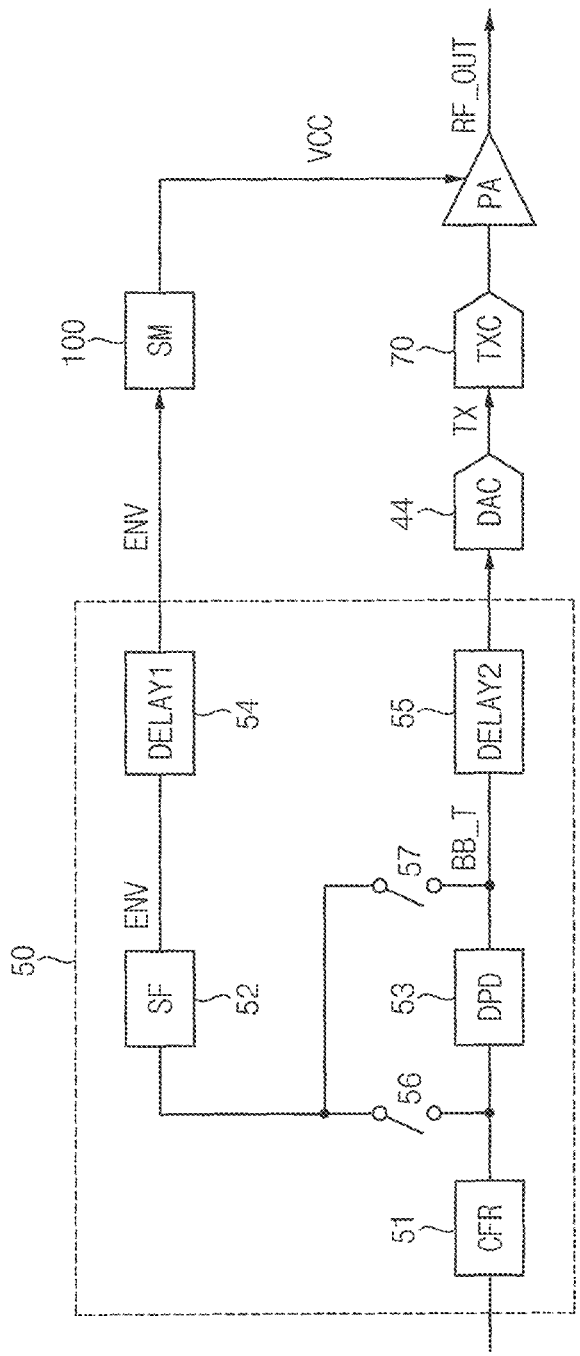
FIG. 2A illustrates an example of the digital transmission signal processing circuit (DTSPC) in FIG. 1.

FIG. 2A illustrates an example of the digital transmission signal processing circuit (DTSPC) in FIG. 1 according to some example embodiments.

Referring to FIG. 2A, the DTSPC 50 may perform various operations through crest factor reduction (CFR) 51, shaping function (SF) 52, digital pre-distortion (DPD) 53, a first delay (DELAY1) 54, and a second delay (DELAY2) 55 in addition to processing the baseband signal, envelope extraction, and/or generation of digital envelope signal. The DTSPC 50 may further include a plurality of switches 56 and 57.

The CFR 51 may reduce a PAPR of at least one transmission signal, for example, the baseband signal BB_T. The SF 52 may shape the envelope signal ENV such that the efficiency and/or linearity of the power amplifier 90 is enhanced. The DPD 53 may compensate for distortion of the power amplifier 90 in a digital region (e.g., a digital domain, etc.). The first delay 54 may adjust a delay of the envelope signal ENV and the second delay 56 may adjust a delay of the baseband signal BB_T.

The DTSPC 50 may output the envelope signal ENV and the baseband signal BB_T.

The envelope signal ENV may be directly provided to the supply modulator 100 and/or may be provided to the supply modulator 100 via the MIPI 43. The DVC 44 may convert the baseband signal BB_T to a transmission signal TX to be provided to a transmission circuit (TXC) 70.

Referring back to FIG. 1, the modem 40 may receive an analog reception signal RX from the RFIC 60. The ADC 45 in the modem 40 may convert the reception signal RX to the baseband signal BB_R. The reception signal RX may be a differential signal.

The RFIC 60 may generate a radio frequency (RF) input signal RF_IN by performing a frequency up-conversion on the transmission signal TX, and/or may generate a RF output signal RF_OUT by performing a frequency down-conversion on the reception signal RX. The RFIC 60 may include a transmission circuit 70 to perform the frequency up-conversion, a reception circuit 80 to perform the frequency down-conversion, and a local oscillator LO. Moreover, one or more of the transmission circuit 70, reception circuit, and/or the local oscillator LO may be combined into a single circuit.

The transmission circuit 70 may include a first analog baseband filter ABF1 71, a first mixer 73 and an amplifier (AMP) 75. The ABF1 71 may include a low pass filter. The ABF1 71 filters the transmission signal TX and provides the filtered transmission signal to the first mixer 73. The first mixer 73 may mix a frequency from the local oscillator LO with the filtered transmission signal and may perform the frequency up-conversion on the transmission signal TX. The transmission signal TX may be provided to the AMP 75, and the AMP 75 amplifies an output of the first mixer 73 and provide the RF input signal RF_IN to the power amplifier 90.

The power amplifier 90 may receive a supply voltage VCC from the supply modulator 100, and amplifies the RF input signal RF_IN based on the supply voltage VCC to generate the RF output signal RF_OUT. The power amplifier 90 may provide the RF output signal RF_OUT to the duplexer 95.

The reception circuit 80 may include a second analog baseband filter ABF2 85, a second mixer 83, and a low noise amplifier (LNA) 81. The ABF2 85 may include a low pass filter.

The LNA 81 may amplify a RF reception signal RF_R received from the duplexer 95 to provide the amplified signal to the second mixer 83. The second mixer 83 may mix a frequency from the local oscillator LO with the amplified signal and may perform the frequency down-conversion on the mixed signal to generate the reception signal RX. The ABF2 filters the reception signal RX and provides the filtered signal to the modem 40.

In some example embodiments, the wireless communication device 10 may transmit at least one transmission signal through a plurality of frequency bands by using carrier aggregation (CA). To this end, the wireless communication device 10 may include a plurality of power amplifiers for power-amplifying a plurality of RF input signals corresponding to a plurality of carriers. However, one power amplifier 90 is illustrated in the wireless communication device 10 of the Figures for the convenience of explanation, and in one or more example embodiments, the wireless communication device 10 may include a plurality of power amplifiers to support carrier aggregation.

The supply modulator 100 may generate the supply voltage VCC whose level is dynamically varied (e.g., changed, modified, etc.) based on the envelope signal ENV and the ET reference signal ET_REF in an ET mode, and may provide the supply voltage VCC to the power amplifier 90. The supply modulator 100 may adjust the supply voltage VCC based on the average power signal APT_REF in an APT mode and may provide the supply voltage VCC to the power amplifier 90.

The supply modulator 100 may generate a plurality of voltages having different levels, voltage levels, voltage values, etc., based on a battery voltage VBAT (e.g., the battery voltage VBAT may also be referred to as a power supply voltage, etc.), and may provide one of the plurality of voltages to the power amplifier 90 as the supply voltage VCC based on the envelope signal ENV when in the ET mode (e.g., the wireless communication device 10 and/or the DTSPC 50 is in the ET mode). The supply modulator 100 may select a voltage corresponding to a level (e.g., voltage level, voltage value, etc.) of the envelope signal ENV and may provide the selected voltage to the power amplifier 90 as the supply voltage VCC.

When a level (e.g., voltage level, etc.) of the envelope signal ENV is small (e.g., less than a desired voltage ENV threshold, etc.), the supply modulator 100 may provide a voltage having a small level (e.g., a first voltage level, a corresponding voltage level, etc.) to the power amplifier 90 as the supply voltage VCC. When a level of the envelope signal ENV is great (e.g., greater than the desired voltage ENV threshold, etc.), the supply modulator 100 may provide a voltage having a great level (e.g., a second voltage level, a corresponding voltage level, etc.) to the power amplifier 90 as the supply voltage VCC. Therefore, the supply modulator 100 may enhance the efficiency of power consumption of the wireless communication device 10 and the DTSPC 50 and may increase the length of battery use and increase the battery capacity of the wireless communication device 10.

The technique to adjust the level (e.g., voltage level) of the supply voltage adaptively based on the envelope signal ENV is referred to as ET. The ET according to some example embodiments may be referred to as a discrete ET because a voltage having a level which is most similar with a level of the envelope signal ENV is selected.

The supply modulator 100 may select ET and/or APT based on a selected transmission power set in a communication device including the supply modulator 100. Hereinafter, the example embodiments will be described assuming the supply modulator 100 performs ET operation for the sake of brevity and clarity and the operation of the supply modulator 100 may apply equally to APT operation as well.

The duplexer 95 is coupled to the antenna ANT and may separate a transmission frequency and a reception frequency. The duplexer 95 may divide the RF output signal RF_OUT according to frequency bands and may provide the RF output signal RF_OUT to a corresponding antenna ANT. The duplexer 95 may provide the LNA 81 in the reception circuit 80 of the RFIC 60 with a signal received from the antenna ANT.

According to some example embodiments, the wireless communication device may include at least one switch to separate a transmission frequency and/or a reception frequency instead of the duplexer 65. According to other example embodiments, the wireless communication device may include both a switch and a duplexer.

The antenna ANT may transmit the RF output signal RF_OUT whose frequency is separated to an outside (e.g., may transmit the RF output signal RF_OUT to an external device) and/or may provide the RF reception signal RF_R from the outside (e.g., external source, etc.) to the duplexer 95. The antenna ANT may include an array antenna.

Figure 2B:
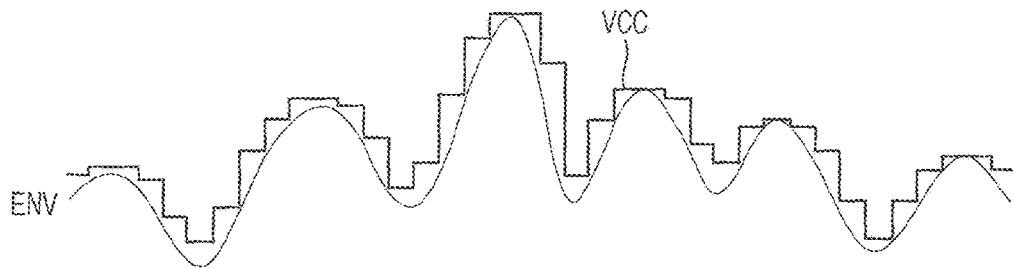
FIG. 2B is a graph of an example operation of a supply modulator in FIG. 1.

FIG. 2B is a graph of an example operation of a supply modulator in FIG. 1 according to at least one example embodiment.

Referring to FIG. 2B, the supply modulator 100 may modulate the supply voltage VCC to be provided to the power amplifier 90, based on the envelope signal ENV by using DC voltages having different voltage levels. In other words, the supply modulator 100 may generate the supply voltage VCC to have different voltage levels based on the envelope signal ENV. The supply voltage VCC provided to the power amplifier 90 may be referred to as a bias voltage.

Figure 3A:
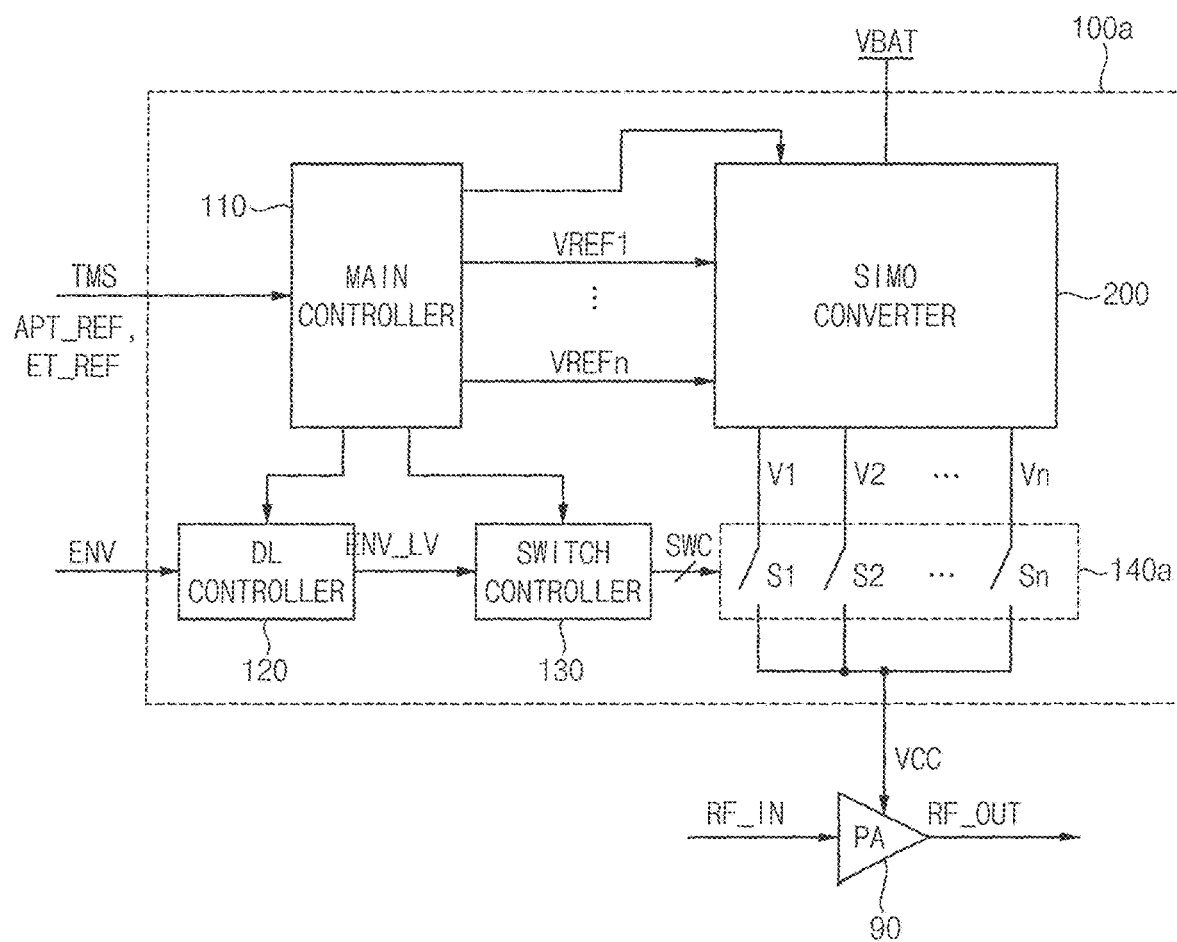
FIG. 3A is a block diagram illustrating an example of a supply modulator according to some example embodiments.

FIG. 3A is a block diagram illustrating an example of a supply modulator according to some example embodiments.

Referring to FIG. 3A, a supply modulator 100a may include a main controller 110, a discrete level (DL) controller 120, a switch controller 130, a switch array 140a, and a single inductor multiple output (SIMO) converter 200. According to some example embodiments, the supply modulator 100a may be implemented as processing circuitry, or in other words, processing circuitry included in the supply modulator 100a may be capable of performing the functionality of one or more of the supply modulator 100a, main controller 110, DL controller 120, switch controller 130, switch array 140a, and SIMO converter 200. Other elements such as the modem 40 (and its sub-components), PCSG 235 and PSCSG 230 may also include processing circuitry. The processing circuitry may include hardware, such as processors, processor cores, logic circuits, storage devices, etc.; a hardware/software combination such as at least one processor core executing software and/or executing any instruction set, etc.; or a combination thereof. For example, the processing circuitry more specifically may include, but is not limited to, a field programmable gate array (FPGA), a programmable logic unit, an application-specific integrated circuit (ASIC), a System-on-Chip (SoC), etc.

The main controller 110 may receive the tracking mode signal TMS, the average power signal ART_REF, and/or the ET reference signal ET_REF from the modem 40 in FIG. 1, and may determine a tracking mode of the supply modulator 100a based on the tracking mode signal TMS. Additionally, the main controller 110 may generate a plurality of reference voltages VREF1~VREFn (where n is an integer greater than one) based on the ET reference signal ET_REF in the ET mode, and may provide the plurality of reference voltages VREF1~VREFn to the SIMO converter 200. The main controller 110 may control the discrete level controller 120, the switch controller 130 and/or the SIMO converter 200.

The SIMO converter 200 may generate a plurality of voltages V1~Vn based on the battery voltage VBAT under control of and/or based on instructions from the main controller 110, and may provide the plurality of voltages V1~Vn to the switch array 140a. The SIMO converter 200 may generate the plurality of voltages V1~Vn having different levels (e.g., voltage levels, voltage values, etc.) based on the plurality of reference voltages VREF1~VREFn and the battery voltage VBAT and may output the plurality of voltages V1~Vn to the switch array 140a.

The switch array 140a may include a plurality of switches S1~Sn corresponding to the plurality of voltages V1~Vn having different levels (e.g., voltage levels, etc.). The opening and closing operation of the plurality of switches S1~Sn may be controlled by and/or based on a switch control signal SWC provided from the switch controller 130. The switch array 140a may select one or more voltages among the plurality of voltages V1~Vn having different levels (i.e., each of the voltages V1-Vn may have a different respective level) based on the switch control signal SWC, and may provide the selected voltage(s) to the power amplifier 90.

The discrete level controller 120 may generate a level control signal ENV_LV including envelope level information based on the envelope signal ENV from the modem 40. The discrete level controller 120 may provide the level control signal ENV_LV to the switch controller 130.

The switch controller 130 may receive the level control signal ENV_LV from the discrete level controller 120, and may control on/off (e.g., the opening and/or closing) of one or more of the plurality of switches S1~Sn based on the level control signal ENV_LV. The switch controller 130 may generate the switch control signal SWC for controlling on/off of one or more of the plurality of switches S1~Sn and may provide the switch control signal SWC to the switch array 140a.

In the ET mode, the switch controller 130 may select a voltage corresponding to a level (e.g., voltage level, etc.) of the envelope signal ENV among the plurality of voltages V1~Vn having different levels and may control the on/off (e.g., control the operation) of the plurality of switches S1~Sn such that the selected voltage is provided to the power amplifier 90. In addition, in the APT mode, the switch controller 130 may control at least one of the plurality of switches S1~Sn such that a voltage having a nearest level (closest voltage level) is selected. The nearest voltage is a voltage among the plurality of voltages V1~Vn greater than the level of the desired and/or required level with a closest voltage level to the desired and/or required level.

In some example embodiments, the supply modulator 100a may further include at least one switch Sa, and the switch Sa may provide the power amplifier 90 with an APT voltage APT_V provided from the SIMO converter 200 based on the average power signal APT_REF in the APT mode. In the APT mode the switch controller 130 may turn on the switch Sa, by applying a switch control signal SWCa to the switch Sa. In the ET mode the switch controller 130 may turn off the switch Sa, by applying the switch control signal SWCa to the switch Sa. In the APT mode, the switch controller 130 may turn off the plurality of switches S1~Sn.

Although not illustrated, either in the ET mode or in the APT mode, the switch array 140a may connect a load capacitor corresponding to the controlled switch among load capacitors coupled to a plurality of voltage nodes in the SIMO converter 200 to the power amplifier 90. The load capacitor corresponding to the controlled switch may serve as a decoupling capacitor connected to the supply voltage VCC.

Figure 3B:
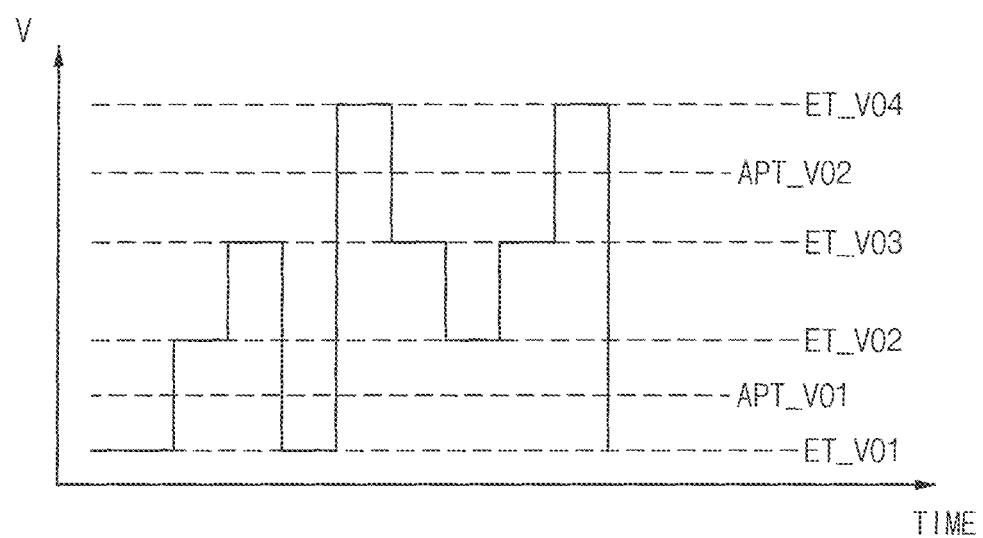
FIG. 3B illustrates an example of an ET reference signal and an average power signal provided to the main controller in FIG. 3A.

FIG. 3B illustrates an example of an ET reference signal and an average power signal provided to the main controller in FIG. 3A.

Referring to FIG. 3B, the ET reference signal ET_REF may include a plurality of reference signals, e.g., ET_VO1, ET_VO2, ET_VO3, and/or ET_VO4, etc., corresponding to levels (e.g., voltage levels) of the envelope signal ENV, and the average power signal APT_REF may include average power voltages, e.g., APT_VO1 and APT_VO2.

Figure 4:
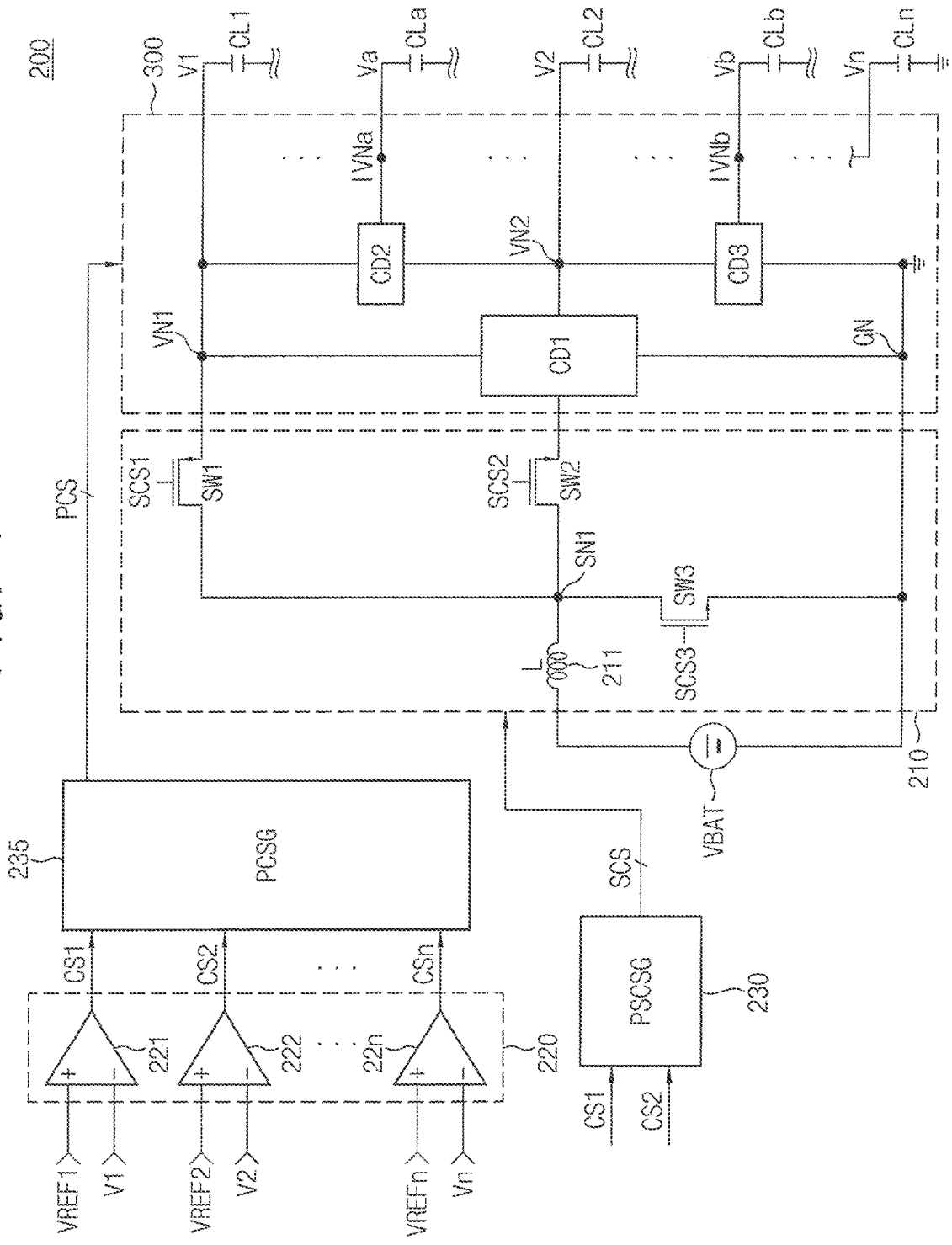
FIG. 4 is a block diagram illustrating an example of the SIMO converter in the supply modulator in FIG. 3A according to some example embodiments.

FIG. 4 is a block diagram illustrating an example of the SIMO converter in the supply modulator in FIG. 3A according to some example embodiments.

Referring to FIG. 4, the SIMO converter 200 may include a DC-DC converter 210 and/or a voltage dividing capacitor circuit 300. The SIMO converter 200 may further include a comparator block 220, a power switch control signal generator (PSCSG) 230, and/or a phase control signal generator (PCSG) 235.

The comparator block 220 may include a plurality of comparators, e.g., comparators 221, 22, . . . , 22n that compare each of a plurality of voltages, e.g., voltages V1, Va, V2, Vb and Vn, etc., output from the voltage dividing capacitor circuit 300 with respect to one of the plurality of reference voltages VREF1~VREFn. The comparator block 220 may generate and/or output a plurality of comparison signals, e.g., CS1, CS2, . . . , CSn, etc., based on the results of the comparisons.

The PSCSG 230 may generate a first set of switch control signals SCS based on a first comparison signal CS1 associated with the first voltage V1 and a second comparison signal CS2 associated with the second voltage V2 among the plurality of comparison signals CS1, CS2, . . . , CSn. The PSCSG 230 may provide the first set of switch control signal SCS to the DC-DC converter 210.

The PCSG 235 may generate a phase control signal PCS based on the plurality of comparison signals CS1, CS2, . . . , CSn and may provide the phase control signal PCS to the voltage dividing capacitor circuit 300.

The DC-DC converter 210 may include an inductor (L) 211 connected to a battery voltage VBAT to store energy, and the DC-DC converter 210 may transfer a current based on the battery voltage VBAT to at least one of a first voltage node VN1 and/or a second voltage node VN2 between the first voltage node VN1 and a ground node VN connected to a ground voltage, in response to the first set of power switch control signal SCS.

The voltage dividing circuit 300 may include a plurality of capacitor dividers (each of the capacitor dividers may be referred to as a capacitor voltage divider that divides a voltage with a ratio greater than one or smaller than one using at least one capacitor), such as, CD1, CD2, CD3, . . . , etc., which are connected between the first voltage node VN1, the second voltage node VN2 and the ground node GN. Each of the plurality of capacitor dividers CD1, CD2, CD3, . . . , etc., may perform one of a voltage boosting operation and a voltage drop operation, individually, in response to receiving a phase control signal set. The voltage dividing circuit 300 may output the plurality of voltages V1, Va, V2, Vb, and Vn, etc., at the first voltage node VN1, the second voltage node VN2 and intermediate voltage nodes IVNa, and IVNb between the first voltage node VN1 and the second voltage node VN2, and between the second voltage node VN2 and the ground node GN. A plurality of load capacitors CL1, CLa, CL2, CLb, and CLn may be connected in series between the first voltage node VN1 and the ground node GN.

The DC-DC converter 210 may include the inductor 211 and first through third power switches SW1, SW2 and SW3.

The inductor 211 is connected between the battery voltage VBAT and a first switching node SN1, and stores energy when a current based on the battery voltage VBAT flows through the inductor 211.

The first power switch SW1 may be connected between the first switching node SN1 and the first voltage node VN1, and may transfer the energy stored in the inductor 211 to the first voltage node VN1 in the form of current in response to a first switch control signal SCS1. The second power switch SW2 may be connected between the first switching node SN1 and the second voltage node VN2, and may transfer the energy stored in the inductor 211 to the second voltage node VN2 in the form of current in response to a second switch control signal SCS2.

The third power switch SW3 may be connected between the first switching node SN1 and the ground node GN, and may couple the first switching node SN1 to the ground node GN in response to a third switch control signal SCS3. When a level of the battery voltage VBAT is smaller than or equal to a voltage level of the second voltage node VN2, the third power switch SW3 may perform a current build-up operation by coupling the first switching node SN1 to the ground voltage.

In some example embodiments, the first power switch SW1 may include a p-channel metal-oxide semiconductor (PMOS) transistor, the second power switch SW2 may include an n-channel metal-oxide semiconductor (NMOS) transistor and the third power switch SW3 may include an NMOS transistor.

Figure 5A:
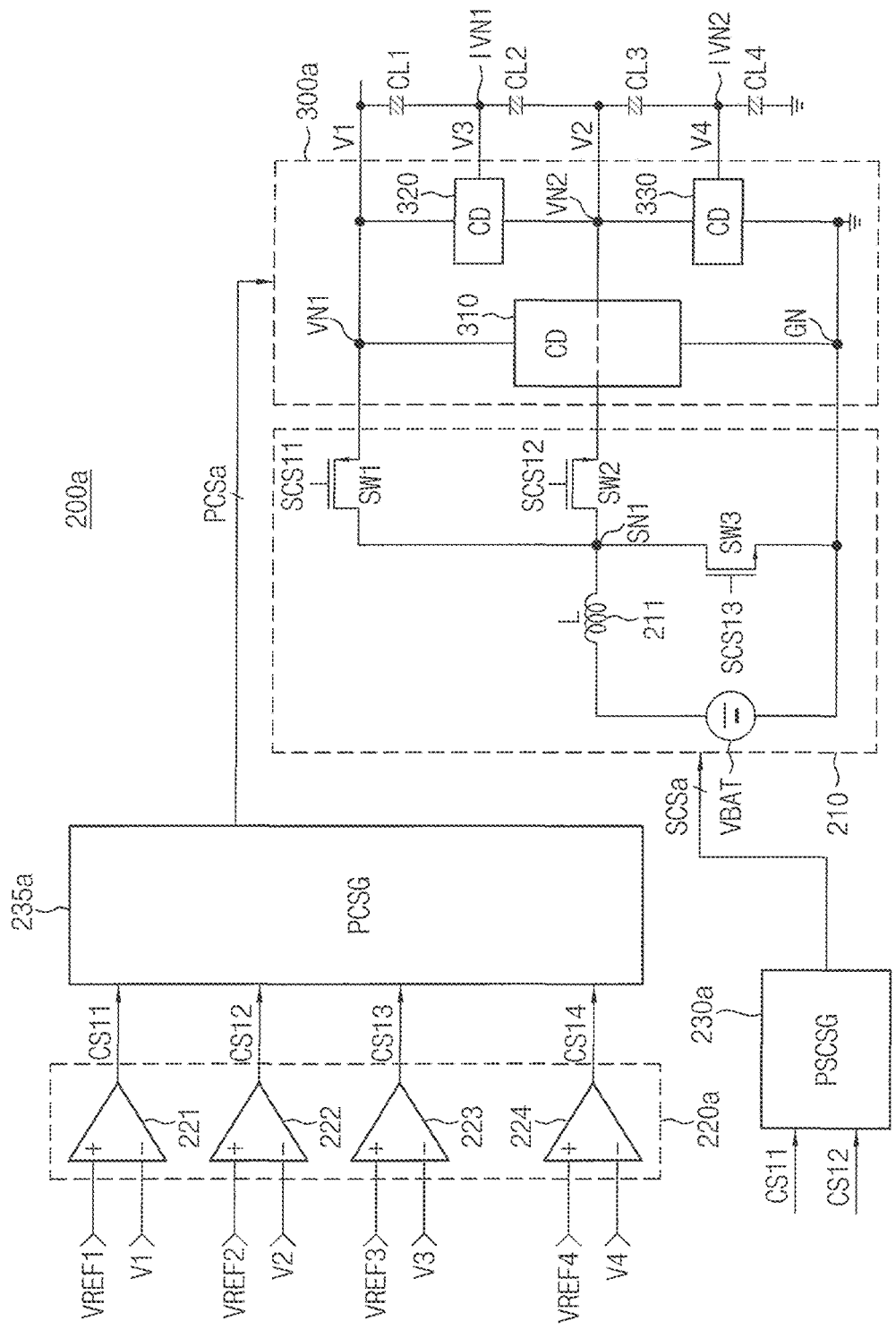
FIG. 5A is a block diagram illustrating an example of the SIMO converter of FIG. 4 according to some example embodiments.

FIG. 5A is a block diagram illustrating an example of the SIMO converter of FIG. 4 according to some example embodiments.

FIG. 5A illustrates an example in which a SIMO converter 200a generates four output voltages, but is not limited thereto, and may generate a greater or lesser number of output voltages.

Referring to FIG. 5A, the SIMO converter 200a may include the DC-DC converter 210, a voltage dividing capacitor circuit 300a, a comparator block 220a, PSCSG 230a and a PCSG 235a.

The DC-DC converter 210 may be the same as the DC-DC converter 210 in FIG. 4, and duplicate description with FIG. 4 will be omitted.

The comparator block 220a may include a plurality of comparators 221, 222, 223 and 224 that compare each of a plurality of voltages V1, V2, V3 and V4 with respective one of a plurality of reference voltages VREF1, VREF2, VREF3 and VREF4 and the comparator block 220a may generate and output a plurality of comparison signals CS11, CS12, CS13 and CS14 based on the results of the comparisons.

The PSCSG 230a may generate a first set of switch control signals SCSa based on a first comparison signal CS11 and a second comparison signal CS12 and may provide the first set of switch control signals SCSa to the DC-DC converter 210. The first set of switch control signals SCSa may include switch control signals SCS1, SCS2 and SCS3.

The PCSG 235a may generate a phase control signal PCSa based on the plurality of comparison signals CS1, CS2, CS3 and CS4, etc., and may provide the phase control signal PCSa to the voltage dividing capacitor circuit 300a.

The voltage dividing circuit 300a may include first through third capacitor dividers 310, 320 and 330.

The first capacitor divider 310 may be connected between the first voltage node VN1 and the ground node GN coupled to the ground voltage. The second capacitor divider 320 may be connected between the first voltage node VN1, a first intermediate voltage node IVN1 and the second voltage node VN2. The third capacitor divider 330 may be connected between the second voltage node VN2, a second intermediate voltage node IVN2 and the ground node GN. First through fourth load capacitors CL1, CL2, CL3 and CL4 may be connected in series between the first voltage node VN1 and the ground node GN, and each of the first through fourth load capacitors CL1, CL2, CL3 and CL4 may be connected between the first voltage node VN1, the first intermediate voltage node IVN1, the second voltage node VN2, the second intermediate voltage node IVN2 and the ground node GN, respectively. The capacitance of each of the first through fourth load capacitors CL1, CL2, CL3 and CL4 may be the same.

When the DC-DC converter 210 generates (and/or, provides) a first voltage V1 to the first voltage node VN1 coupled to the first load capacitor CL1 through the first power switch SW1, the first capacitor divider 310 may provide a second voltage V2 based on the first voltage V1 at the second voltage node VN2. The second voltage V2 may correspond to a desired percentage of the first voltage V1, for example, a half (e.g., one half, 50%, etc.) of the first voltage V1. When the level of the battery voltage VBAT is smaller than or equal to the second voltage V2, the DC-DC converter 210 may supply the first voltage V1 to the first voltage node VN1 through the first power switch SW1. The PSCSG 230a may determine a level (e.g., voltage level) of the battery voltage VBAT based on the first comparison signal CS11 and the second comparison signal CS12.

The second voltage divider 320 may provide (and/or output) a third voltage at the first intermediate voltage node IVN1 based on the first voltage V1 and the second voltage V2. The third voltage V3 may correspond to a desired percentage of a sum of the first voltage V1 and second voltage V2, for example, a half of a sum of the first voltage V1 and the second voltage V2. The third capacitor divider 330 may provide (and/or, output) a fourth voltage V4 based on the second voltage V2 to the second intermediate voltage node IVN2. The fourth voltage V4 may correspond to a desired percentage of the second voltage V2, for example, a half of the second voltage V2.

Therefore, the voltage dividing capacitor circuit 300a may output voltages corresponding to, e.g., V1, (3/4)*V1, (2/4)*V1 and (1/4)*V1 at the first voltage node VN1, the intermediate voltage node IVN1, the second node VN2 and the second intermediate voltage node IVN2, respectively. The voltages corresponding to V1, (3/4)*V1, (2/4)*V1 and (1/4)*V1 have different levels (e.g., voltage levels).

When the DC-DC converter 210 generates (and/or, provides) the second voltage V2 to the second voltage node VN2, the first capacitor divider 310 may provide the first voltage V1 to the first voltage node VN1 based on the second voltage V2.

The DC-DC converter 210 may provide a voltage to one or more of the first voltage node VN1 and the second voltage node VN2, and the voltage dividing capacitor circuit 300a may generate a voltage at another node based on the voltage which is generated by the DC-DC converter 210 and is provided to at one node.

Figure 5B:
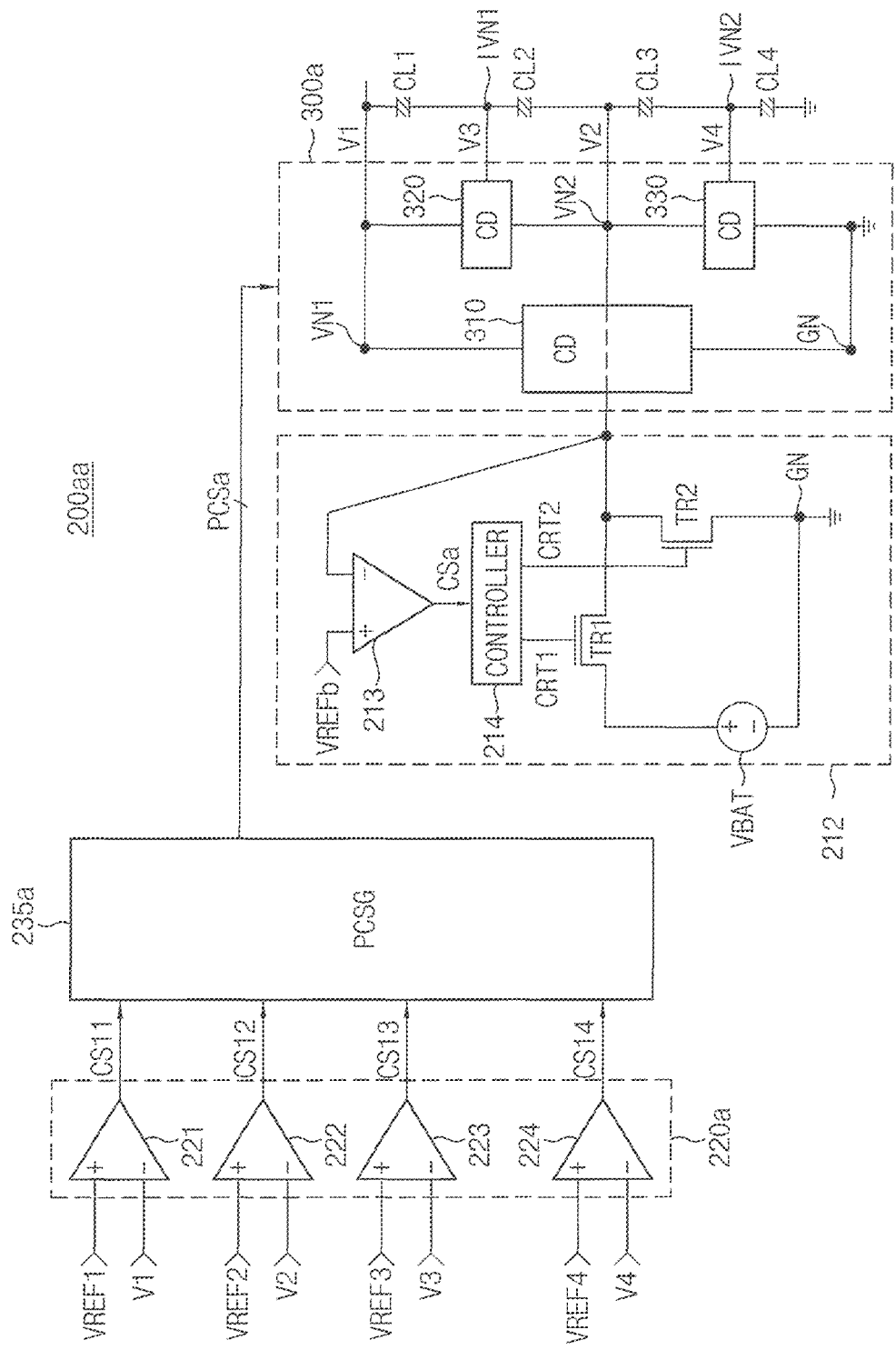
FIG. 5B is a block diagram illustrating another example of the SIMO converter of FIG. 4 according to some example embodiments.

FIG. 5B is a block diagram illustrating another example of the SIMO converter of FIG. 4 according to some example embodiments.

A SIMO converter 200aa of FIG. 5B differs from the SIMO converter 200a of FIG. 5A in that the SIMO converter 200aa does not includes the PCSG 235a and the SIMO converter 200aa includes a DC-DC converter 212 instead of the DC-DC converter 210. Duplicate description with FIG. 5A will be omitted.

Referring to FIG. 5B, the SIMO converter 200aa may include the DC-DC converter 212, the voltage dividing capacitor circuit 300a, the comparator block 220a and the PSCSG 230a.

The DC-DC converter 212 may include a first transistor TR1, a second transistor TR2, a comparator 213 and a controller 214.

The first transistor TR1 may be connected between the battery voltage VBAT and the second voltage node VN2 and have a gate to receive a first switch control signal CRT1. The second transistor TR2 may be connected between the second voltage node VN2 and the ground node GN and have a gate to receive a second switch control signal CRT2.

The comparator 213 may compare a second voltage V2 at the second voltage node VN2 with a reference voltage VREFb and may generate an internal comparison signal CSa based on the comparison. The controller 214 may generate the first switch control signal CRT1 and the second switch control signal CRT2 based on the internal comparison signal CSa and may provide the first switch control signal CRT1 and the second switch control signal CRT2 to the first transistor TR1 and the second transistor TR2, respectively. The reference voltage VREFb may be the same as the second reference voltage VREF2.

The DC-DC converter 212 may provide a current to the second voltage node VN2 based on the battery voltage VBAT or may sink a current at the second voltage node VN2 to the ground node GN.

In some example embodiments, a DC-DC converter based on a capacitor may be connected to the voltage dividing capacitor circuit 300a.

Figure 6A:
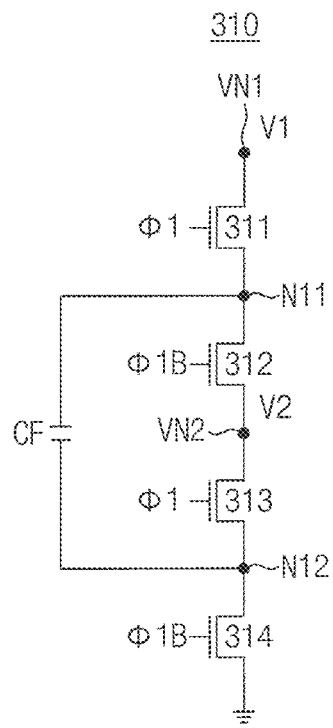
FIG. 6A illustrates a configuration of the first capacitor divider in the voltage dividing capacitor circuit in FIG. 5A according to some example embodiments.

FIG. 6A illustrates a configuration of the first capacitor divider in the voltage dividing capacitor circuit in FIG. 5A according to some example embodiments.

Figure 6B:
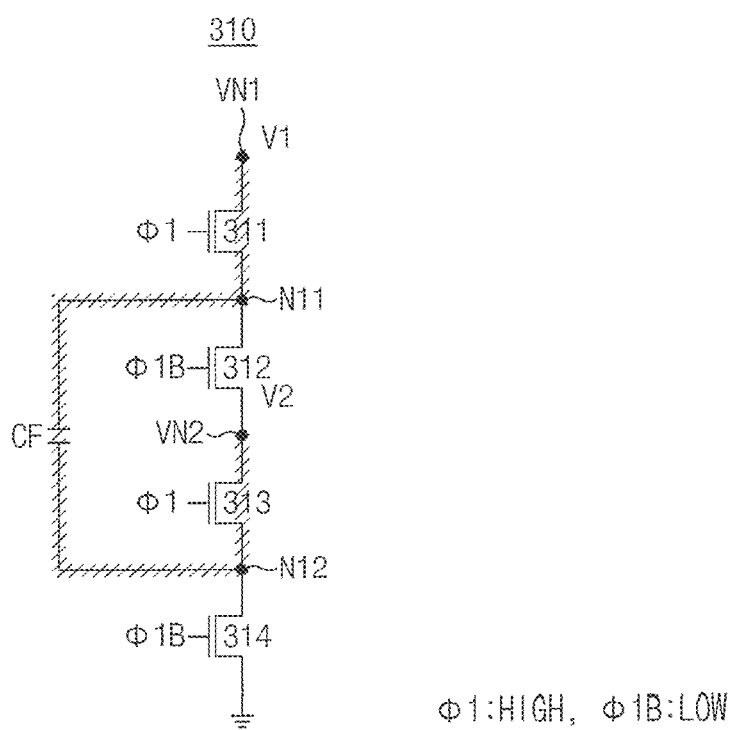
FIGS. 6B and 6C illustrate operation of the first capacitor divider in FIG. 6A, respectively according to some example embodiments.
Figure 6C:
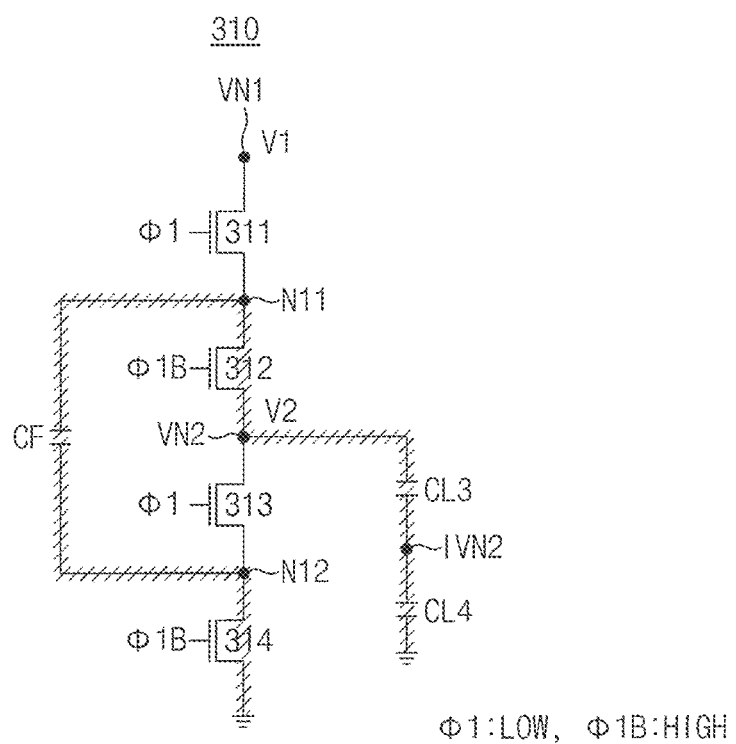

FIGS. 6B and 6C illustrate operation of the first capacitor divider in FIG. 6A, respectively according to some example embodiments.

Referring to FIG. 6A, the first capacitor divider 310 may include a plurality of transistors, e.g., transistors 311, 312, 313 and 314 which are connected in series between the first voltage node VN1 and the ground node GN, and a flying capacitor CF which is connected between a node N11 and a node N12. The flying capacitor CF may be connected in parallel to one or more transistors, such as the transistors 312 and/or 313. Each of the transistors 311, 312, 313 and 314 may be referred to as a switch.

The transistor 311 is connected between the first voltage node VN1 and the node N11, the transistor 312 is connected between the node N11 and the second voltage node VN2, the transistor 313 is connected between the second voltage node VN2 and the node N12 and the transistor 314 is connected between the second voltage node VN2 and the ground node GN, etc.

As illustrated in FIG. 6B, when the transistors 311 and 313 are turned on and the transistors 312 and 314 are turned off in response to first state of phase control signals Φ1 and Φ1B, the first capacitor divider 310 stores, in the flying capacitor CF, a voltage corresponding to a difference between the first voltage V1 and the second voltage V2, but is not limited thereto. In this case, a relationship of a voltage VCF stored in the flying capacitor CF, the first voltage V1 and the second voltage V2 may be represented as VCF=V1−V2.

As illustrated in FIG. 6C, when the transistors 311 and 313 are turned off and the transistors 312 and 314 are turned on in response to second state of the phase control signals Φ1 and Φ1B, the voltage stored in the flying capacitor CF is provided to the second voltage node VN2 and is stored in the second load capacitor CL2 coupled to the second voltage node VN2. In this case, a relationship between the voltage VCF and the second voltage V2 is represented as VCF=V2. Therefore, a representation of V1−V2=V2 then V2=(1/2) *V1.

When the DC-DC converter 210 provides the first voltage V1 to the first voltage node VN1 through the first power switch SW1, the first capacitor divider 310 performs a voltage drop operation based on the first voltage V1 in response to the phase control signals. The DC-DC converter 210 then outputs the second voltage V2 to the second voltage node VN2. In addition, when the DC-DC converter 210 provides the second voltage V2 to the second voltage node VN2 through the second power switch SW2, the first capacitor divider 310 performs a voltage boosting operation based on the second voltage V2 in response to the phase control signals and outputs the first voltage V1 at the first voltage node VN1.

Therefore, the SIMO converter 200a may rapidly generate and/or provide a current to a target voltage node that desires and/or needs to supply a load current through the plurality of capacitor dividers, e.g., capacitor dividers 310, 320 and 330, and thus a response characteristic of the SIMO converter 200a is fast. In addition, the SIMO converter 200a may increase, maintain and/or prevent efficiency from being reduced, because a number of capacitors from the DC-Dc converter 200 to the target node is smaller than a number of capacitors in a SIMO converter in which capacitor dividers are sequentially connected. In addition, since each of the plurality of capacitor dividers 310, 320 and 330 may be controlled based on individual phase control signals, the switching loss may be reduced. In addition, since load capacitors are connected in series between the first voltage node VN1 and the ground voltage, capacitance of each of the load capacitors needs not to be great and each of the load capacitors may have a similar effective capacitance.

Figure 7A:
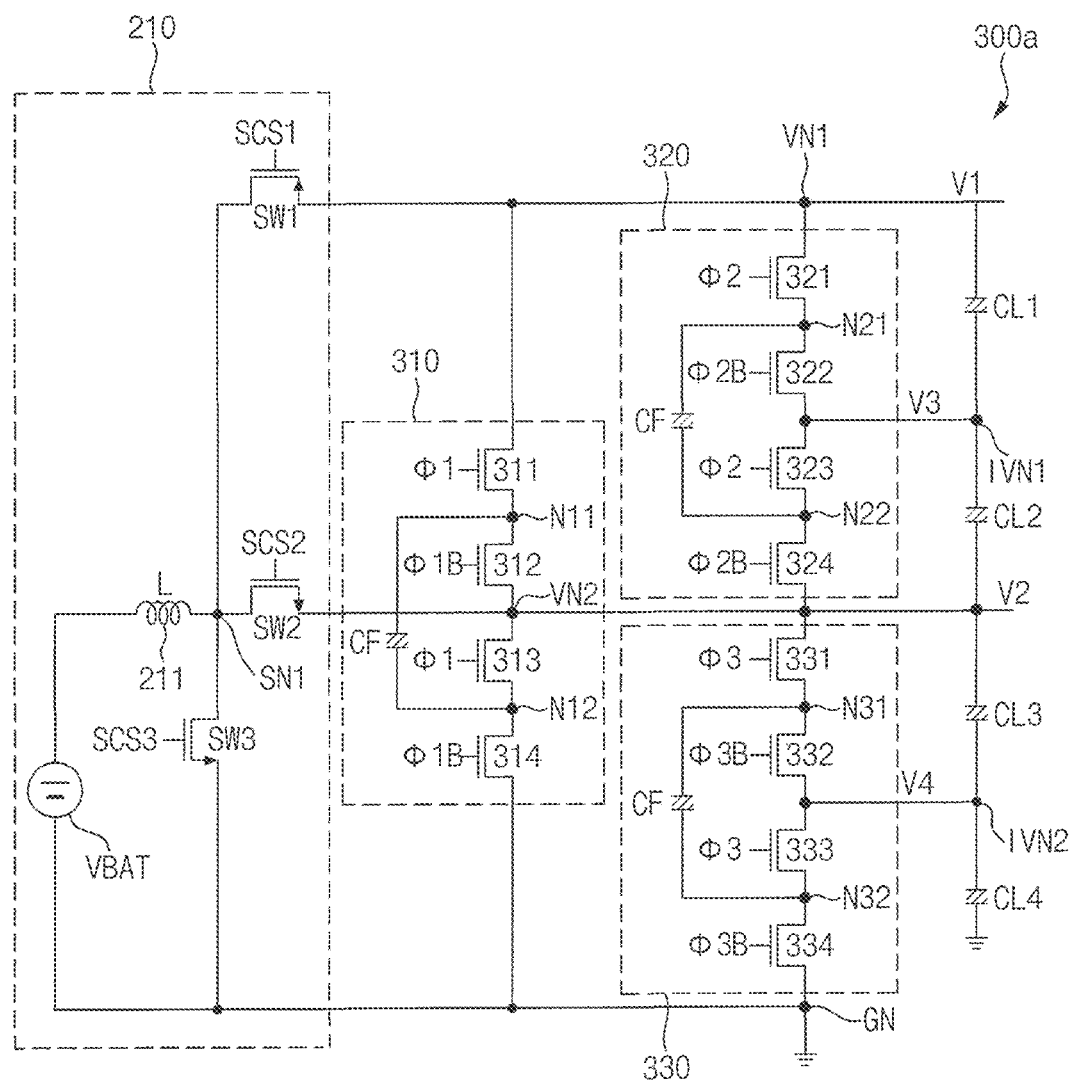
FIG. 7A is a circuit diagram illustrating an example of the voltage dividing capacitor circuit in the SIMO converter of FIG. 5A according to some example embodiments.

FIG. 7A is a circuit diagram illustrating an example of the voltage dividing capacitor circuit in the SIMO converter of FIG. 5A according to some example embodiments.

In FIG. 7A, the DC-DC converter 210 is illustrated together for the convenience of explanation.

Referring to FIG. 7A, the voltage dividing circuit 300a may include the first through third capacitor dividers 310, 320 and 330 and first through fourth load capacitors CL1, CL2, CL3 and CL4.

The first capacitor divider 310 may include a plurality of transistors 311, 312, 313 and 314 which are connected in series between the first voltage node VN1 and the ground node GN, and a flying capacitor CF which is connected between a node N11 and a node N12. According to some example embodiments, the flying capacitor CF may be in parallel to one or more transistors, e.g., transistors 312 and 313.

The transistor 311 is connected between the first voltage node VN1 and the node N11, the transistor 312 is connected between the node N11 and the second voltage node VN2, the transistor 313 is connected between the second voltage node VN2 and the node N12, and the transistor 314 is connected between the second voltage node VN2 and the ground node GN.

Each gate of the transistors 311 and 313 receives a first phase control signal Φ1, and each gate of the transistors 312 and 314 receives a first inversion phase control signal Φ1B which has a phase difference of 180 degrees with respect to the first phase control signal Φ1. When the transistors 311 and 313 are turned on, and the transistors a 312 and 314 are turned off, the first capacitor divider 310 stores, in the flying capacitor CF, a voltage corresponding to a difference between the first voltage V1 and the second voltage V2. When the transistors 311 and 313 are turned off, and the transistors 312 and 314 are turned, the voltage stored in the flying capacitor CF is provided to the second voltage node VN2 and is stored in the second load capacitor CL2.

The second capacitor divider 320 may include a plurality of transistors 321, 322, 323 and 324 which are connected in series between the first voltage node VN1 and the second voltage node VN2, and a flying capacitor CF connected between a node N21 and a node N22. According to some example embodiments, the flying capacitor CF may be connected in parallel to one or more transistors, e.g., transistors 322 and/or 323. Each gate of the transistors 321 and 323 receives a second phase control signal Φ2, and each gate of the transistors 322 and 324 receives a second inversion phase control signal Φ2B which has a phase difference of 180 degrees with respect to the second phase control signal Φ2.

As described with reference to FIGS. 6B and 6C, the second capacitor divider 320 may provide the third voltage V3 based on the first voltage V1 and the second voltage V2, in response to the second phase control signal Φ2 and the second inversion phase control signal Φ2B, etc.

The third capacitor divider 330 may include a plurality of transistors 331, 332, 333 and 334 which are connected in series between the second voltage node VN2 and the ground node GN, and a flying capacitor CF which is connected between a node N31 and a node N32, etc. According to some example embodiments, the flying capacitor CF may be connected in parallel to one or more transistors, e.g., transistors 332 and/or 333. Each gate of the transistors 331 and 333 receives a third phase control signal Φ3, and each gate of the transistors 332 and 334 receives a third inversion phase control signal Φ3B which has a phase difference of 180 degrees with respect to the third phase control signal Φ3.

As described with reference to FIGS. 6B and 6C, the third capacitor divider 330 may provide the fourth voltage V4 based on the second voltage V2, in response to the third phase control signal Φ3 and the third inversion phase control signal Φ3B, but is not limited thereto.

When the DC-DC converter 210 provides current to the first voltage node VN1 and the second voltage node VN2, the second capacitor divider 320 generates the third voltage V3 based on the first voltage V1 and the second voltage V2, and the second capacitor divider 320 provides the third voltage V3 to the first intermediate voltage node IVN1. In addition, while the second capacitor divider 320 generates the third voltage V3, the third capacitor divider 330 generates the fourth voltage V4 based on the second voltage V2, and provides the fourth voltage V4 to the second intermediate voltage node IVN2. In this case, the current provided to the first voltage node VN1 and the second voltage node VN2 via the first power switch SW1 and the second power switch SW2 has a magnitude corresponding to, for example, a half of a magnitude of current provided to either the first voltage node VN1 or the second voltage node VN2 through one current path and efficiency of the SIMO converter 300a may increase by four times.

When the DC-DC converter 210 performs a converting operation (e.g., conversion operation) using the first power switch SW1 and the third power switch SW3, the DC-DC converter 210 may increase a magnitude of current provided to the first voltage node VN1 by performing a current build-up operation using the inductor 211. In this case, the first capacitor divider 310 generates the second voltage V2 based on the first voltage V1. In addition, the second capacitor divider 320 generates the third voltage V3 based on the first voltage V1 and the second voltage V2, and provides the third voltage V3 to the first intermediate voltage node IVN1. In addition, while the second capacitor divider 320 generates the third voltage V3, the third capacitor divider 330 generates the fourth voltage V4 based on the second voltage V2, and provides the fourth voltage V4 to the second intermediate voltage node IVN2.

When the second power switch SW2 and the third power switch SW3 are turned on in the DC-DC converter 210, the DC-DC converter 210 performs a current build-up operation using the inductor 211. Additionally, the first capacitor divider 310 and the third capacitor divider 330 generate the first voltage V1 and the third voltage V3 based on the second voltage V2, respectively. In this case, the SIMO converter 300a may increase efficiency of the entire circuit by reducing the amount of current from the battery voltage VBAT.

When the level of the battery voltage VBAT is smaller than the level of the second voltage V2 and/or when the battery voltage VBAT is not enough (e.g., the battery voltage VBAT does not meet a desired threshold voltage and/or the power demands of the electronic device, etc.), the first power switch SW1, the second power switch SW2 and the third power switch SW3 may be turned on in the DC-DC converter 210. In this case, the second capacitor divider 320 generates the third voltage V3 based on the first voltage V1 and the second voltage V2, and provides the third voltage V3 to the first intermediate voltage node IVN1. In addition, while the second capacitor divider 320 generates the third voltage V3, the third capacitor divider 330 generates the fourth voltage V4 based on the second voltage V2, and provides the fourth voltage V4 to the second intermediate voltage node IVN2.

Figure 7B:
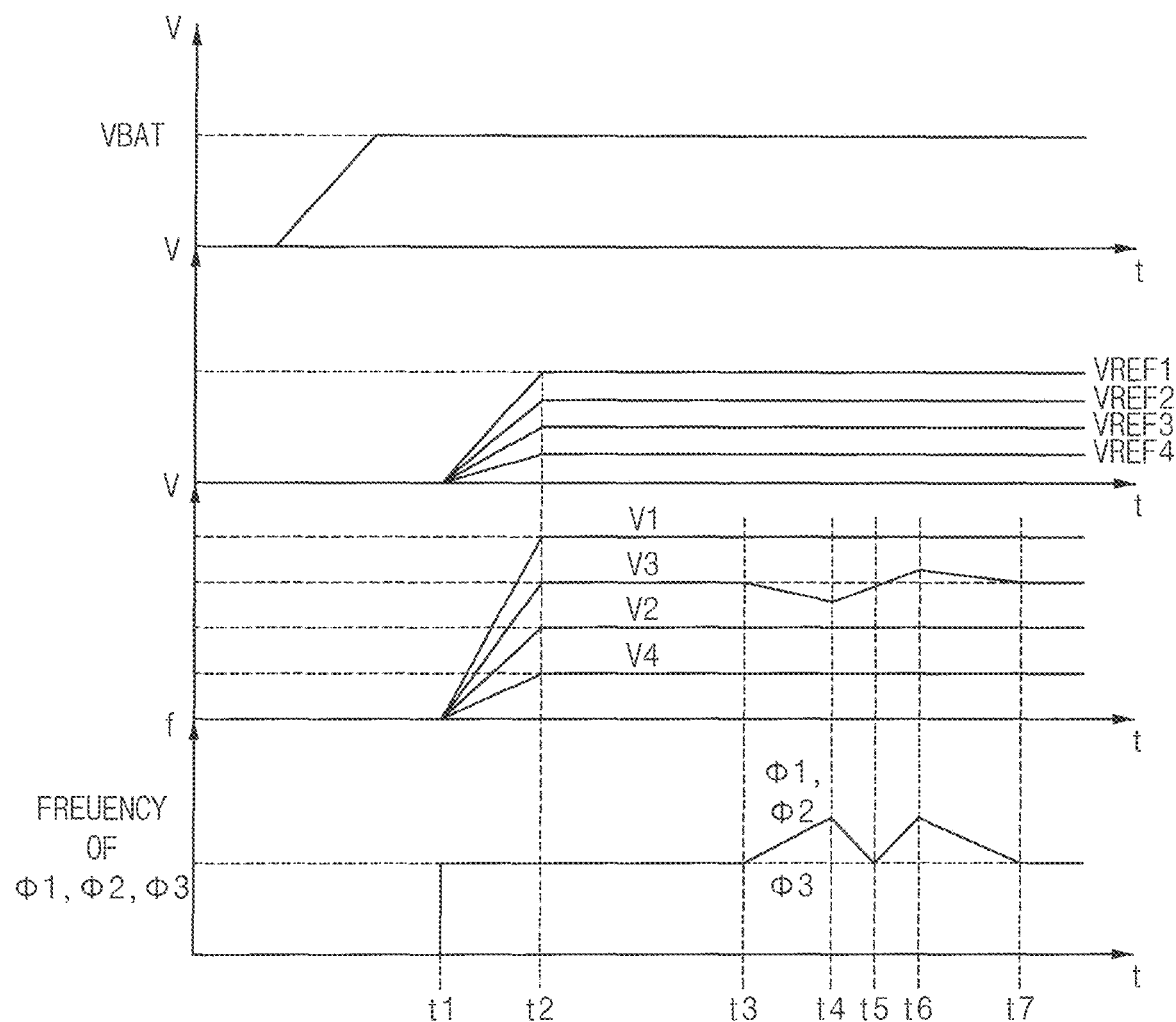
FIG. 7B is a timing diagram illustrating operation of the SIMO converter of FIG. 7A according to at least one example embodiment.

FIG. 7B is a timing diagram illustrating operation of the SIMO converter of FIG. 7A according to at least one example embodiment.

Referring to FIG. 7B, the battery voltage VBAT and the plurality of reference voltages VREF1, VREF2, VREF3 and VREF4 are illustrated. FIG. 7B illustrates a case when the DC-DC converter 210 provides current to the first voltage node VN1 and the second voltage node VN2, and the second capacitor divider 320 and the third capacitor divider 330 generates the third voltage V3 and the fourth voltage V4, respectively, but the example embodiments are not limited thereto.

When the reference voltage VREF1 begins to increase at time t1 and reaches a constant level at time t2, each of the first through fourth voltages V1, V2, V3 and V4 reaches a constant level at time t2 and the constant level is maintained until time t3. Therefore, the operating frequencies of the phase control signals Φ1, Φ2 and Φ3 are constant from times t1 to t3. When the level of the third voltage V3 decreases at time t3 due to a load current provided to a load from the first intermediate voltage node IVN1 increasing at time t3, the operating frequencies of the phase control signals Φ1, Φ1B, Φ2 and Φ2B applied to the capacitor divider 310 and the second capacitor divider 320 associated with the third voltage V3 increase.

Accordingly, the level of the third voltage V3 increase from time t3 to time t5. The operating frequencies of the phase control signals Φ1, Φ1B, Φ2 and Φ2B applied to the capacitor divider 310 and the second capacitor divider 320 decrease from time t4 to time t5, at which the level of the third voltage V3 becomes greater than a level of the reference voltage VREF3. Therefore, the level of the third voltage V2 stops increasing at time t6 and converges to the reference voltage VREF3. When a voltage at the load capacitor varies based on a magnitude of the load current, the SIMO converter 200a may cope with the change of the voltage by increasing or decreasing a frequency of a phase control signal applied to the corresponding capacitor divider. The interval from time t6 to time t7 is similar with the interval from time t4 to time t5, etc.

Figure 7C:
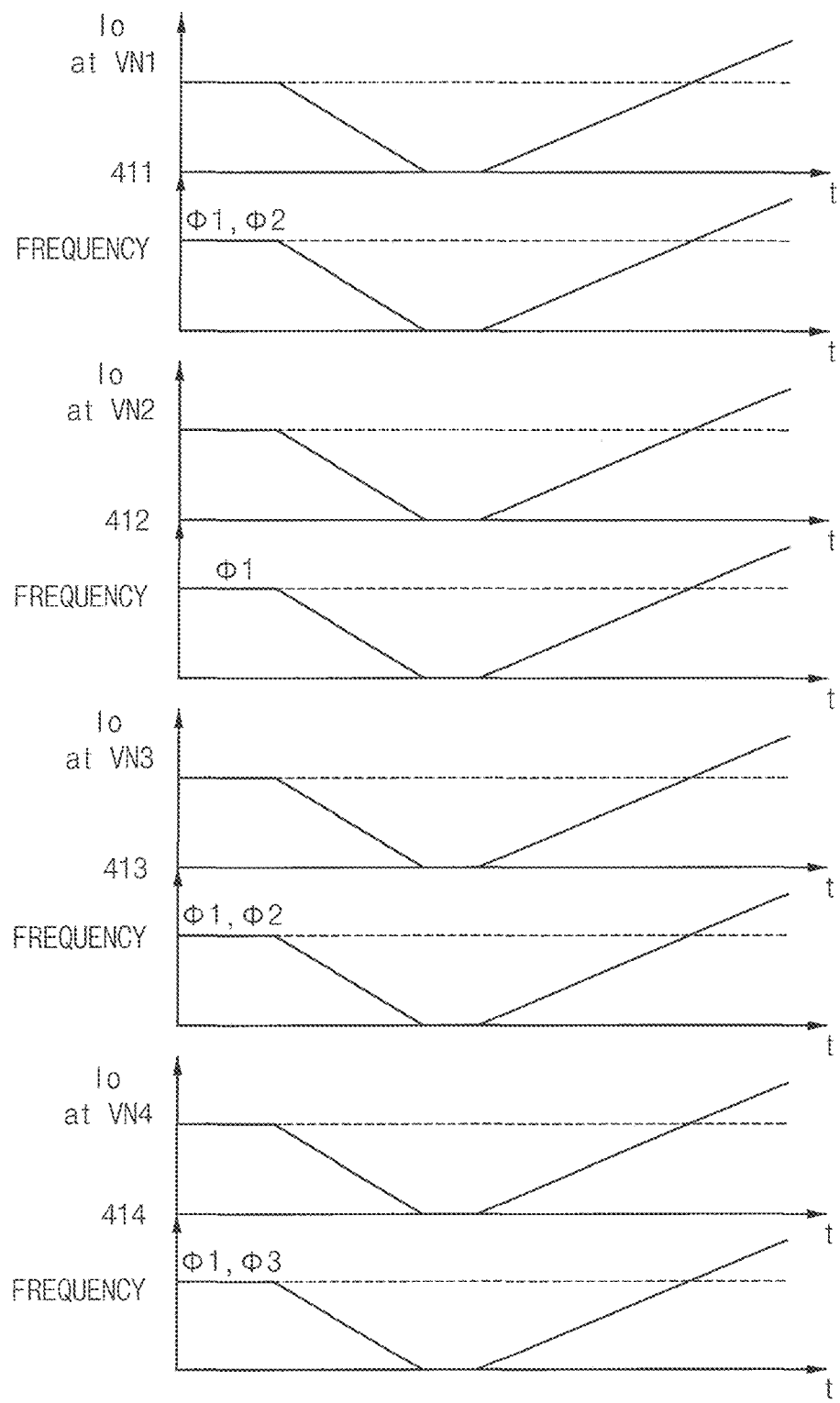
FIG. 7C illustrates example operating frequencies of the first through third capacitor dividers based on currents provided to loads from the voltages nodes in the SIMO converter in FIG. 7A.

FIG. 7C illustrates example operating frequencies of the first through third capacitor dividers based on currents provided to loads from the voltages nodes in the SIMO converter in FIG. 7A.

In FIG. 7C, a reference numeral 411 illustrates a magnitude of a current Jo provided to a load from the first voltage node VN1, and associated operating frequencies of the phase control signal Φ1 applied to the first capacitor divider 310, and the phase control signal Φ2 applied to the second capacitor divider 320. A reference numeral 412 illustrates a magnitude of a current Io provided to a load from the second voltage node VN2 and associated operating frequency of the phase control signal Φ1 applied to the first capacitor divider 310. A reference numeral 413 illustrates a magnitude of a current Io provided to a load from the first intermediate voltage node IVN1 and associated operating frequencies of the phase control signal Φ1 applied to the first capacitor divider 310 and the phase control signal Φ2 applied to the second capacitor divider 320. A reference numeral 414 illustrates a magnitude of a current Io provided to a load from the second intermediate voltage node IVN2 and associated operating frequencies of the phase control signal Φ1 applied to the first capacitor divider 310 and the phase control signal Φ3 applied to the third capacitor divider 330.

Referring to FIG. 7C, it is noted that the operating frequency of a corresponding capacitor divider increases when a load current increases, the load current consumed by a load connected to each of the first voltage node VN1, the second voltage node VN2, the first intermediate voltage node IVN1 and the second intermediate voltage node IVN2 at which one of the first through fourth voltages V1, V2, V3 and V4, respectively, is provided.

FIG. 8A is a circuit diagram illustrating an example of the voltage dividing capacitor circuit in the SIMO converter of FIG. 5A according to some example embodiments.

In FIG. 8A, the DC-DC converter 210 is illustrated together with the voltage dividing circuit 300b for the sake of brevity and convenience of explanation.

A voltage dividing circuit 300b in FIG. 8A differs from the voltage dividing circuit 300a in FIG. 7A in that the voltage dividing circuit 300b further includes at least a fourth capacitor divider 320b.

The fourth capacitor divider 320b may be connected between the first voltage node VN1 and the second voltage node VN2 in parallel with the second capacitor divider 320, and may include a plurality of transistors 321b, 322b, 323b and 324b which are connected in series between the first voltage node VN1 and the second voltage node VN2, and a flying capacitor CF connected between a node N21b and a node N22b. According to some example embodiments, the flying capacitor CF may be connected in parallel to one or more transistors, e.g., transistors 322b and/or 323b. Each gate of the transistors 321b and 323b receives the second inversion phase control signal Φ2B, and each gate of the transistors 322 and 324 receives the second phase control signal Φ2.

Figure 8B:
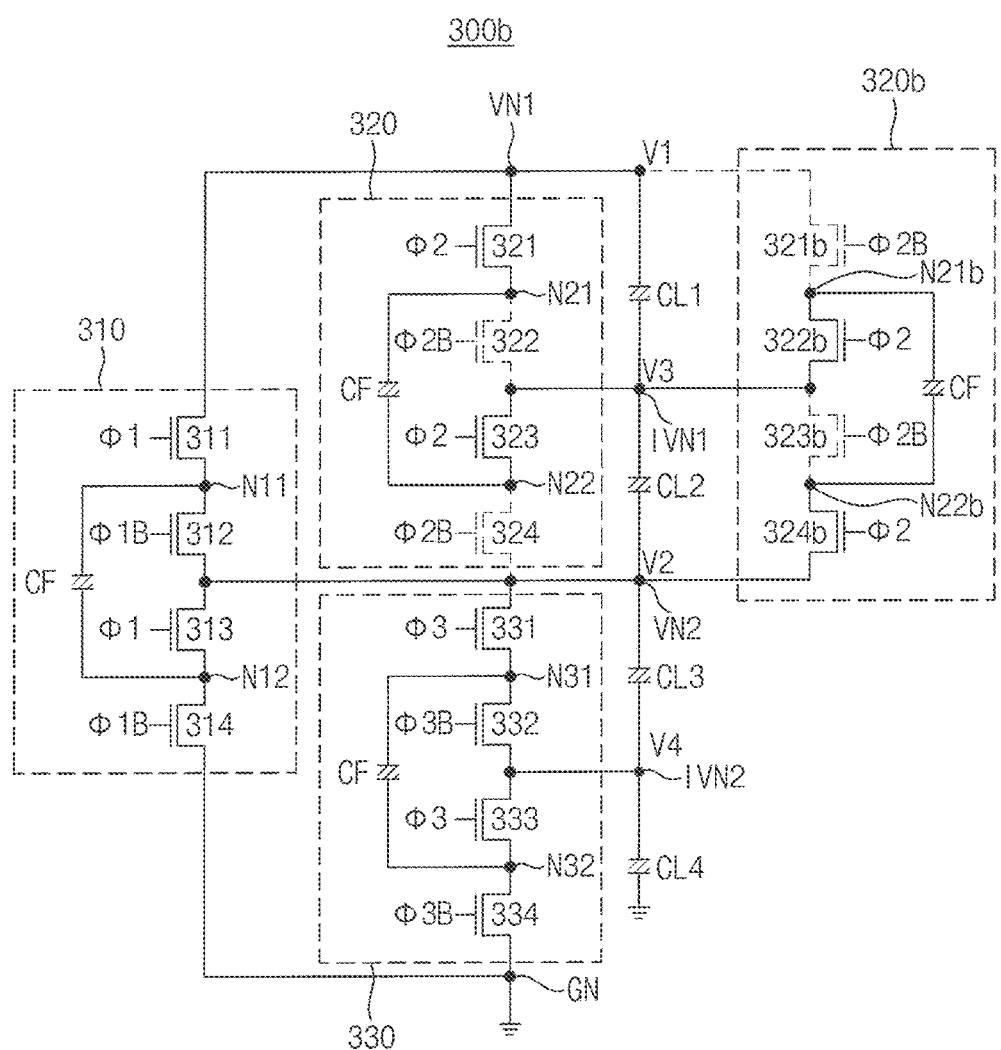
FIGS. 8B and 8C illustrate operations of the second capacitor divider and the fourth capacitor divider in the voltage dividing circuit in FIG. 8A, respectively, according to some example embodiments.
Figure 8C:
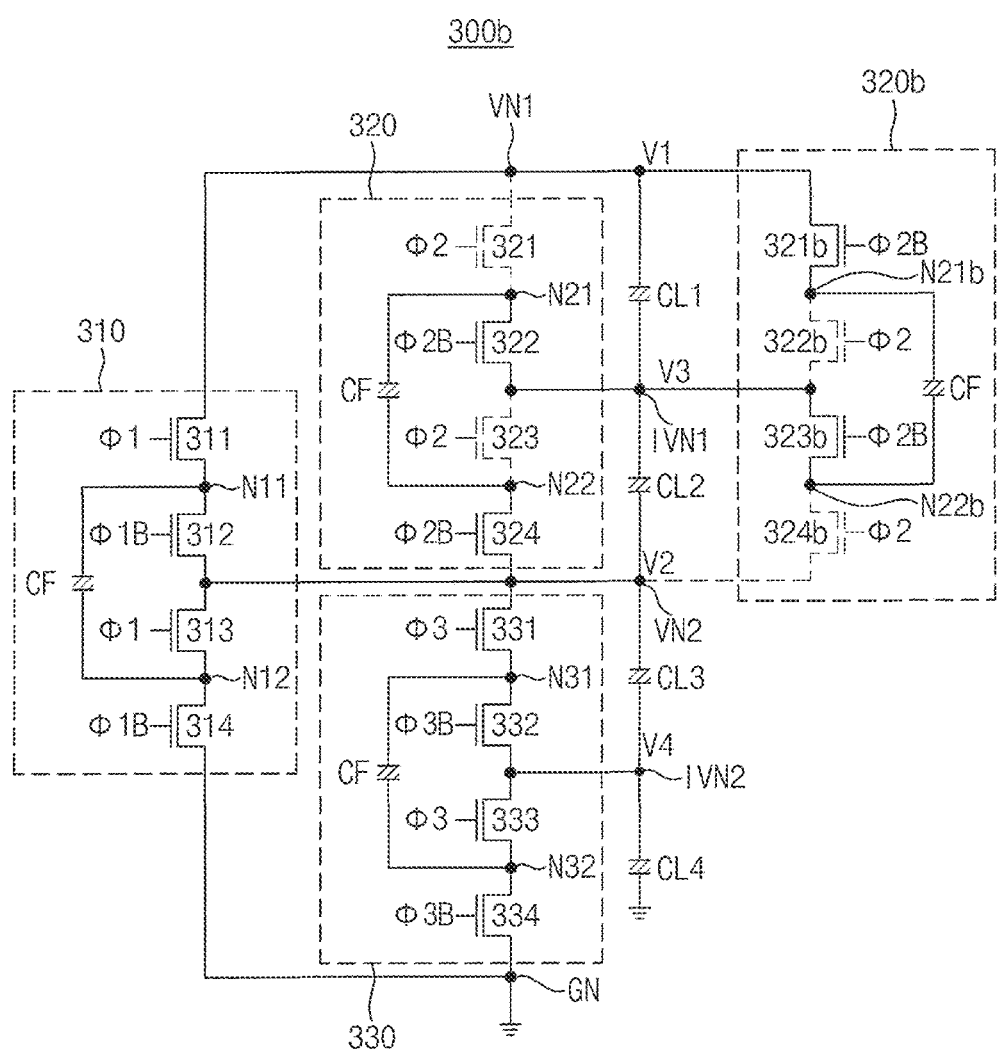

FIGS. 8B and 8C illustrate operations of the second capacitor divider and the fourth capacitor divider in the voltage dividing circuit in FIG. 8A, respectively, according to some example embodiments.

Referring to FIGS. 8B and 8C, the second capacitor divider 320 and the fourth capacitor divider 320b may operate complementarily in response to the second phase control signal Φ2 and the second inversion phase control signal Φ2B, and may provide additional current to the first intermediate voltage node IVN1 when a current provided to the load from the first intermediate voltage node IVN1 increases. When a current provided to the load from the first intermediate voltage node IVN1 increases, additional current is desired and/or needs to be provided to the first intermediate voltage node IVN1. When the fourth capacitor divider 320b supplies the additional current to the first intermediate voltage node IVN1, each of the second capacitor divider 320 and the fourth capacitor divider 320b provide a desired percentage, such as half of current, to be provided to the intermediate voltage node IVN1 and thus transient response becomes fast and power consumption may be reduced.

Figure 9:
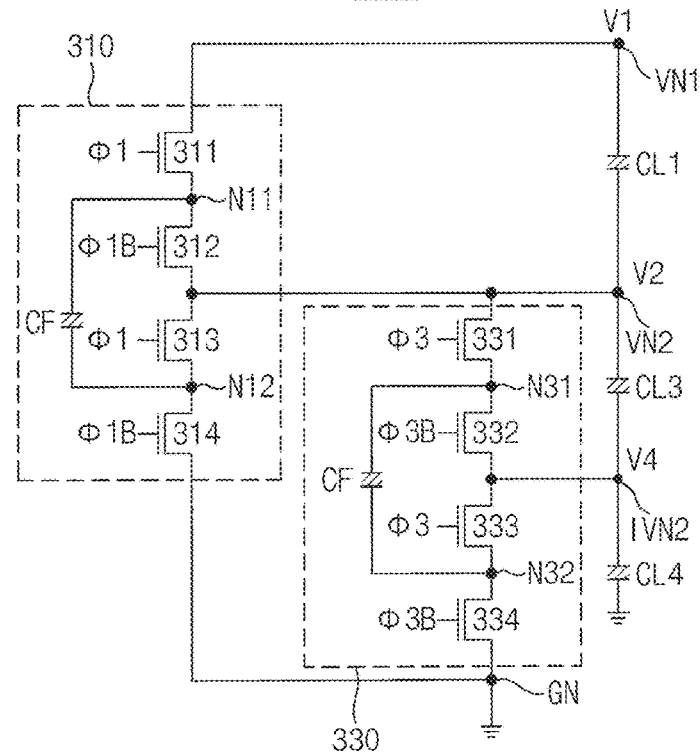
FIG. 9 is a circuit diagram illustrating an example of a voltage dividing capacitor circuit according to some example embodiments.

FIG. 9 is a circuit diagram illustrating an example of a voltage dividing capacitor circuit according to some example embodiments.

A voltage dividing capacitor circuit 300c of FIG. 9 has a configuration in which the second capacitor divider 320 is omitted from the voltage dividing capacitor circuit 300a in FIG. 7A. The voltage dividing capacitor circuit 300g may include the first capacitor divider 310 and the third capacitor divider 330 in FIG. 7A. Therefore, the voltage dividing capacitor circuit 300c may have a reduced number of load capacitors and/or switches.

Figure 10:
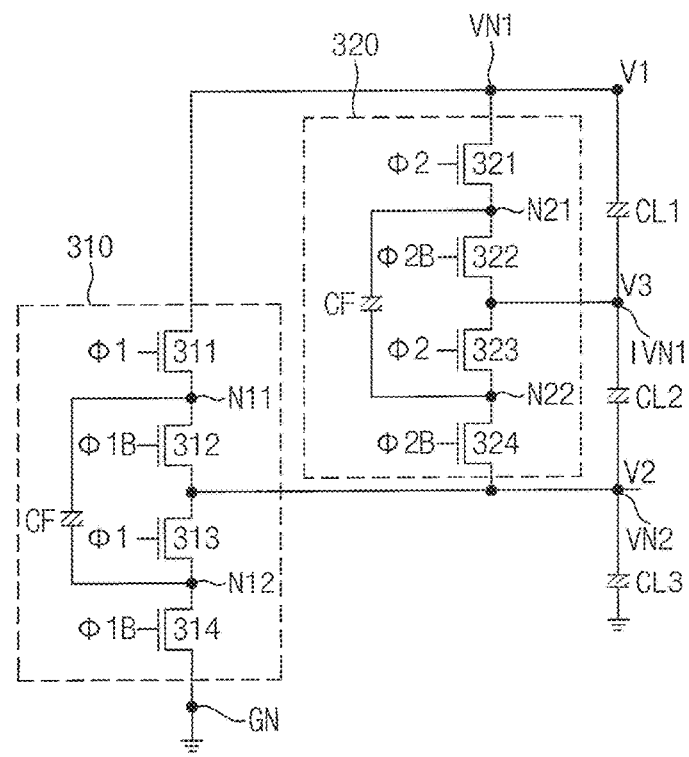
FIG. 10 is a circuit diagram illustrating an example of a voltage dividing capacitor circuit according to some example embodiments.

FIG. 10 is a circuit diagram illustrating an example of a voltage dividing capacitor circuit according to some example embodiments.

A voltage dividing capacitor circuit 300d of FIG. 10 has a configuration in which the third capacitor divider 330 is omitted from the voltage dividing capacitor circuit 300a in FIG. 7A. The voltage dividing capacitor circuit 300d may include the first capacitor divider 310 and the second capacitor divider 320 in FIG. 7A. Therefore, the voltage dividing capacitor circuit 300d may have a reduced number of load capacitors and/or switches.

Referring to FIGS. 9 and 10, at least one capacitor divider associated with a voltage that is not used, may be omitted from a plurality of capacitor dividers included in the voltage dividing capacitor circuit, and the number of load capacitors and/or switches included in the voltage dividing capacitor circuit may be reduced.

Figure 11:
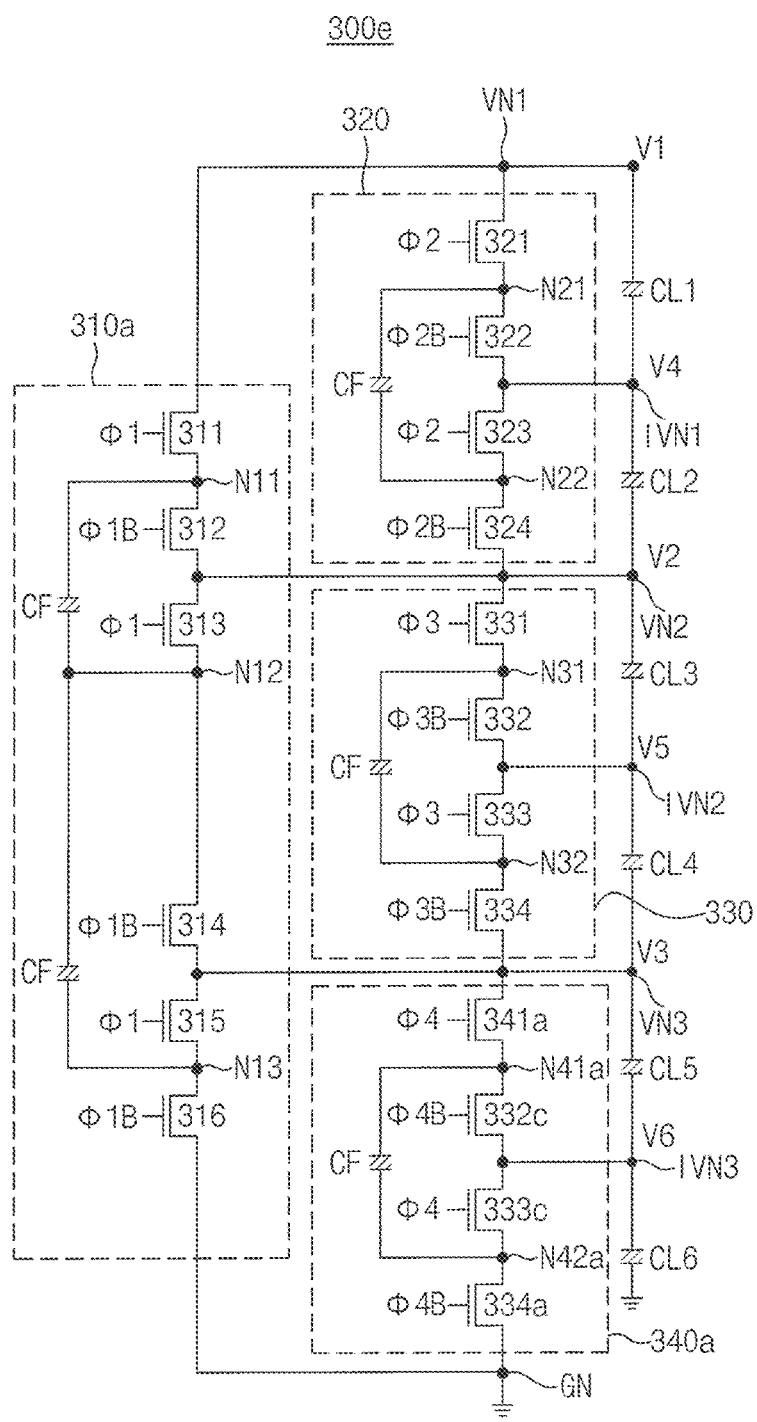
FIG. 11 is a circuit diagram illustrating an example of a voltage dividing capacitor circuit according to some example embodiments.

FIG. 11 is a circuit diagram illustrating an example of a voltage dividing capacitor circuit according to some example embodiments.

Referring to FIG. 11, a voltage dividing capacitor circuit 300e may include first through fourth capacitor dividers 310a, 320, 330 and 340a and first through sixth load capacitors CL1, CL2, CL3, CL4, CL5 and CL6.

The first capacitor divider 310a may include a plurality of transistors 311, 312, 313, 314, 315 and 316, which are connected in series between the first voltage node VN1 and the ground node GN, and two flying capacitor CF which are connected between a node N11 and a node N13.

The transistor 311 is connected between the first voltage node VN1 and the node N11, the transistor 312 is connected between the node N11 and the second voltage node VN2, the transistor 313 is connected between the second voltage node VN2 and the node N12, the transistor 314 is connected between the node N12 and a third voltage node VN3, the transistor 315 is connected between the third voltage node VN3 and a node N13, and the transistor 315 is connected between the node N13 and the ground node GN.

Each gate of the transistors 311, 313 and 315 receives a first phase control signal Φ1, and each gate of the transistors 312, 314 and 316 receives a first inversion phase control signal Φ1B which has a phase difference of 180 degrees with respect to the first phase control signal Φ1, but is not limited thereto. The first capacitor divider 310a may generate the second voltage V2 and the third voltage V3 based on the first voltage V1 at the first voltage node VN1, and may provide the second voltage V2 and the third voltage V3 to the second voltage node VN2 and the third voltage node VN3, respectively.

The configuration and operation of each of the second capacitor divider 320 and the third capacitor divider 330 may be similar to the second capacitor divider 320 and the third capacitor divider 330 described in FIG. 7A.

The fourth capacitor divider 340a may include a plurality of transistors 341a, 342a, 343a and 344a which are connected in series between the third voltage node VN3 and the ground node GN, and a flying capacitor CF which is connected between a node N41a and a node N42a.

The transistor 341a is connected between the third voltage node VN3 and the node N41a, the transistor 342a is connected between the node N41a and the third intermediate voltage node IVN3, the transistor 343a is connected between the third intermediate voltage node IVN3 and the node N42a, and the transistor 344a is connected between the node N42a and the ground node GN.

Each gate of the transistors 341a and 343a receives a fourth phase control signal Φ4, and each gate of the transistors 342a and 344a receives a fourth inversion phase control signal Φ4B which has a phase difference of 180 degrees with respect to the fourth phase control signal Φ4. The fourth capacitor divider 340a may generate a sixth voltage V6 based on the third voltage V3 and may provide the sixth voltage V6 to the third intermediate voltage node IVN3.

The first load capacitor CL1 is connected between the first voltage node VN1 and the first intermediate voltage node IVN1, the second load capacitor CL2 is connected between the first intermediate voltage node IVN1 and the second voltage node VN2, the third load capacitor CL3 is connected between the second voltage node VN2 and the second intermediate voltage node IVN2, the fourth load capacitor CL4 is connected between the second intermediate voltage node IVN2 and a third voltage node VN3, the fifth load capacitor CL5 is connected between the third voltage node VN3 and a third intermediate voltage node IVN3, and the sixth load capacitor CL6 is connected between the third intermediate voltage node IVN3 and the ground voltage. That is, the first through sixth load capacitors CL1, CL2, CL3, CL4, CL5 and CL6 are connected in series between the first voltage node VN1 and the ground voltage.

Therefore, the voltage dividing capacitor circuit 300e may output voltages V1, V2, V3, V4, V5 and V6 having different levels (e.g., voltage levels). The fourth voltage V4 may correspond to 5/6 of the first voltage V1, the second voltage V2 may correspond to 4/6 of the first voltage V1, the fifth voltage V5 may correspond to 3/6 of the first voltage V1, the third voltage V3 may correspond to 2/6 of the first voltage V1 and the sixth voltage V6 may correspond to 1/6 of the first voltage V1.

Figure 12:
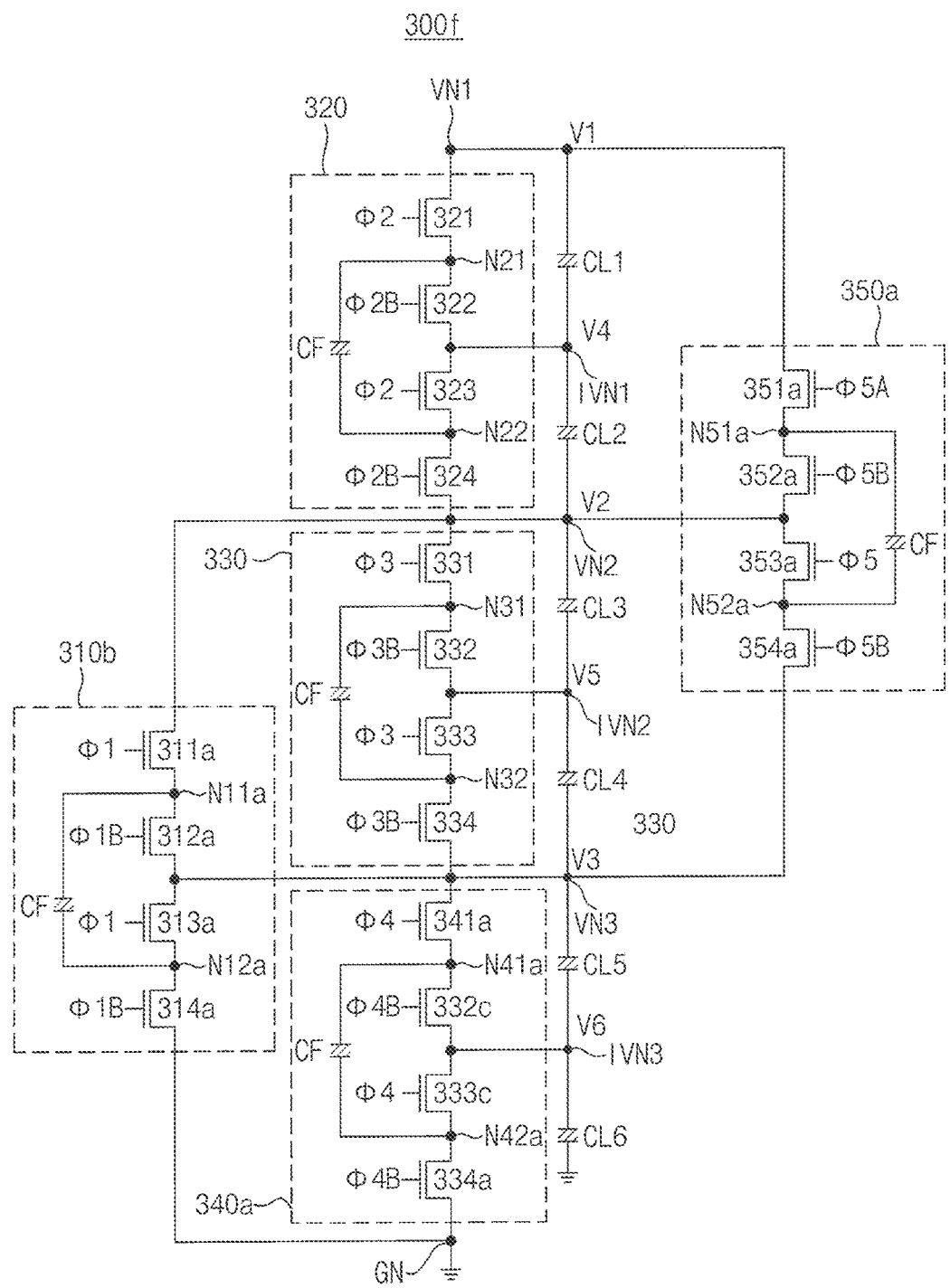
FIG. 12 is a circuit diagram illustrating an example of a voltage dividing capacitor circuit according to some example embodiments.

FIG. 12 is a circuit diagram illustrating an example of a voltage dividing capacitor circuit according to some example embodiments.

Referring to FIG. 12, a voltage dividing capacitor circuit 300f may include first through fifth capacitor dividers 310b, 320, 330, 340a and 350a and first through sixth load capacitors CL1, CL2, CL3, CL4, CL5 and CL6.

The voltage dividing capacitor circuit 300f of FIG. 12 differs from the voltage dividing capacitor circuit 300e of FIG. 11 in that the voltage dividing capacitor circuit 300f includes the first capacitor divider 310b instead of the first capacitor divider 310a and further include the fifth capacitor divider 350a.

The first capacitor divider 310b may include a plurality of transistors 311a, 312a, 313a and 314a which are connected in series between the second voltage node VN2 and the ground node GN, and a flying capacitor CF which is connected between a node N11a and a node N12a.

The transistor 311a is connected between the second voltage node VN2 and the node N11a, the transistor 312a is connected between the node N11a and the third voltage node VN3, the transistor 313a is connected between the third voltage node VN3 and the node N12a, and the transistor 314a is connected between the node N12a and the ground node GN.

Each gate of the transistors 311a and 313a receives the first phase control signal Φ1, and each gate of the transistors 312a and 314a and 316 receives the first inversion phase control signal Φ1B. The first capacitor divider 310b may generate the third voltage V3 based on the second voltage V2 at the second voltage node VN2 and the ground voltage and may provide the third voltage V3 to the third voltage node VN3.

The configuration and operation of each of the second capacitor divider 320, the third capacitor divider 330 and the fourth capacitor divider 340a may be similar to the second capacitor divider 320, the third capacitor divider 330 and the fourth capacitor divider 340a described in FIG. 11.

The fifth capacitor divider 350a may include a plurality of transistors 351a, 352a, 353a and 354a which are connected in series between the first voltage node VN1 and the third voltage node VN3 and a flying capacitor CF which is connected between a node N51a and a node N52a.

Each gate of the transistors 351a and 353a receives a fifth phase control signal Φ5, and each gate of the transistors 352a and 354a receives a fifth inversion phase control signal Φ5B which has a phase difference of 180 degrees with respect to the fifth phase control signal Φ5. The fifth capacitor divider 350a may generate the first voltage V1 based on the second voltage V2 and the third voltage V3 and may provide the first voltage V1 to the first voltage node VN1.

Figure 13:
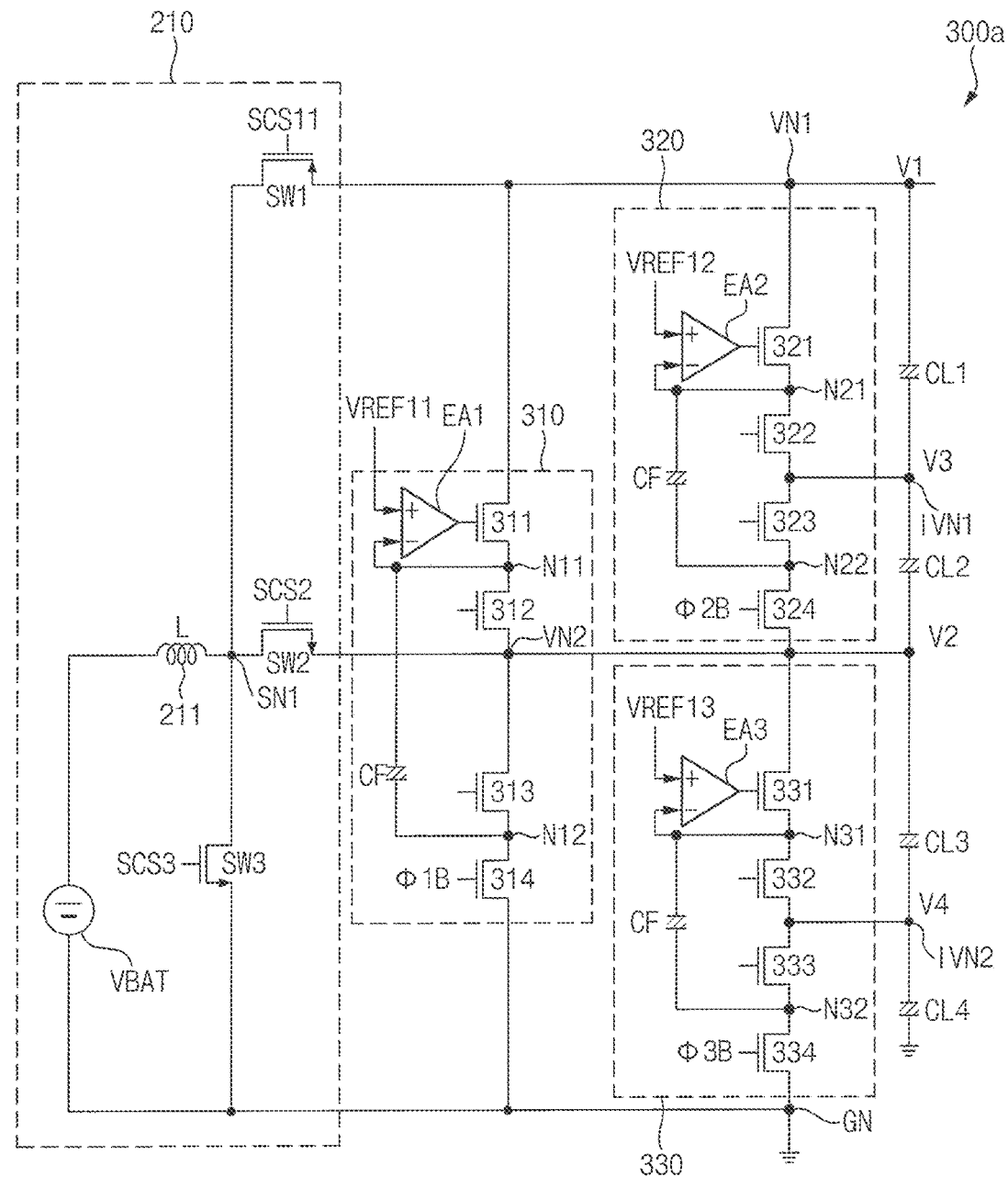
FIG. 13 illustrates an example of the voltage dividing capacitor circuit in FIG. 7A performing a soft-start operation.

FIG. 13 illustrates an example of the voltage dividing capacitor circuit in FIG. 7A performing a soft-start operation.

Referring to FIG. 13, when the DC-DC converter 210 provides the current to the first voltage node VN1 based on the energy stored in the inductor 211, each of the first through fourth load capacitors CL1, CL2, CL3 and CL4 charges a corresponding voltage based on the first voltage V1. When each of the first through fourth load capacitors CL1, CL2, CL3 and CL4 charges the corresponding voltage or after each of the first through fourth load capacitors CL1, CL2, CL3 and CL4 charges the corresponding voltage, a first error amplifier EA1 in the first capacitor divider 310 regulates a target voltage in the flying capacitor CF by comparing a reference voltage VREF11 with a voltage of the node N11, a second error amplifier EA2 in the second capacitor divider 320 regulates a target voltage in the flying capacitor CF by comparing a reference voltage VREF12 with a voltage of the node N21, and a third error amplifier EA3 in the third capacitor divider 330 regulates a target voltage in the flying capacitor CF by comparing a reference voltage VREF12 with a voltage of the node N31. That is, the DC-DC converter 210 may soft-start the voltage dividing capacitor circuit 300a by providing the current to the first voltage node VN1, regulating the (first) voltage charged in the flying capacitor CF using the first error amplifier EA1, regulating the (second) voltage charged in the flying capacitor CF using the second error amplifier EA2, and regulating the (third) voltage charged in the flying capacitor CF using the third error amplifier EA3.

Each of the switches 314, 324 and 334 is turned-on in response to respective one of the first inversion phase control signal Φ1B, the second inversion phase control signal Φ2B and the third inversion phase control signal Φ3B. Each of the first through third capacitor dividers 310, 320 and 330 may perform the voltage boosting operation and/or the voltage drop operation, individually, after charging the target voltage in the flying capacitor CF, using a linear regulator configuration.

In other example embodiments, each of the first through third capacitor dividers 310, 320 and 330 may not include each of the error amplifiers EA1, EA2 and EA3 and may perform the voltage boosting operation and/or the voltage drop operation, individually, after charging each of the first through fourth load capacitors CL1, CL2, CL3 and CL4.

Figure 14:
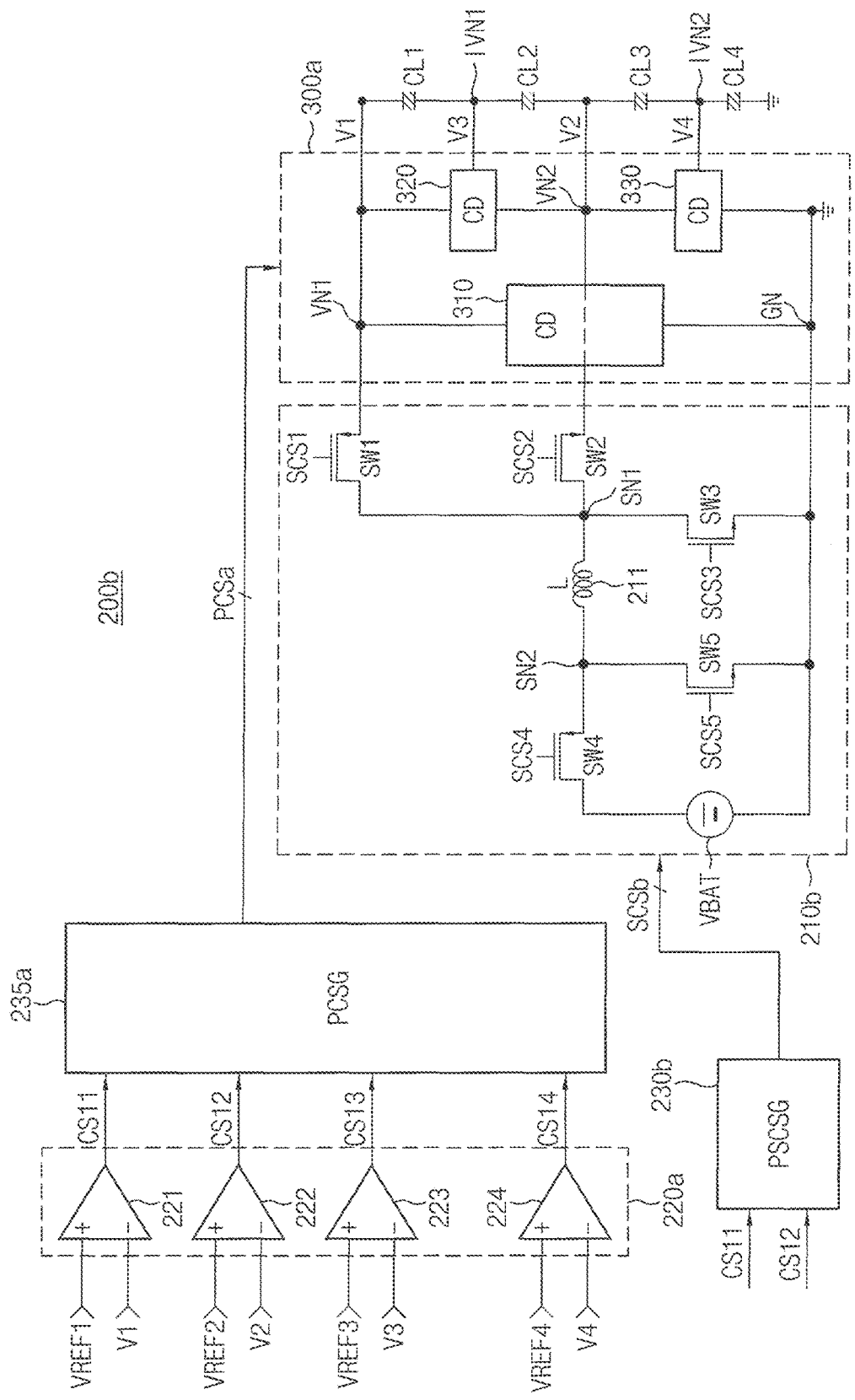
FIG. 14 is a block diagram illustrating an example of the SIMO converter of FIG. 4 according to some example embodiments.

FIG. 14 is a block diagram illustrating an example of the SIMO converter of FIG. 4 according to some example embodiments.

Referring to FIG. 14, a SIMO converter 200b may include a DC-DC converter 210b, a voltage dividing capacitor circuit 300a, a comparator block 220a, a PSCSG 230c, and/or a PCSG 235a.

The SIMO converter 200b of FIG. 14 differs from the SIMO converter 200a of FIG. 5A in the DC-DC converter 210b and the PSCSG 230b.

The PSCSG 230b may generate a first set of switch control signal SCSb based on a first control signal CTL1 received from the modem 40, the first comparison signal CS11, and the second comparison signal CS12 received from the comparator block 220a. The PSCSG 230b may provide the first set of switch control signal SCSb to the DC-DC converter 210b. The first set of switch control signal SCSb may include switch control signals SCS1, SCS2, SCS3, SCS4 and SCS5. The first control signal CTL1 may designate an operation mode of the DC-DC converter 210b, e.g., the operation mode may be one of a buck mode or a boost mode.

The DC-DC converter 210b may include an inductor 211, first through fifth power switches SW1, SW2, SW3, SW4 and SW5.

The inductor 211 may be connected between a first switching node SN1 and a second switching node SN2. The first power switch SW1 may be connected between the first switching node SN1 and the first voltage node VN1. The second power switch SW2 may be connected between the first switching node SN1 and the second voltage node VN2. The third power switch SW3 may be connected between the first switching node SN1 and the ground node GN. The fourth power switch SW4 may be connected between the second switching node SN2 and the battery voltage VBAT, and may have a gate to receive a fourth switch control signal SCS4. The fifth power switch SW5 may be connected between the second switching node SN2 and the ground node GN, and may have a gate to receive a fifth switch control signal SCS5.

In the SIMO converter 200b of FIG. 14, the DC-DC converter 210b further includes the fourth power switch SW4 and the power switch SW5, and the DC-DC converter 210b may operate either in a buck mode in which the DC-DC converter 210b generates a voltage whose level is smaller than a level of the battery voltage VBAT, or in a boost mode in which the DC-DC converter 210b generates a voltage whose level is greater than a level of the battery voltage VBAT.

When a voltage equal to or smaller than the second voltage V2 is to be used, the DC-DC converter 210b operates in the buck mode by turning on the second power switch SW2, and a battery current provided to the first voltage node VN1 may be reduced because the first capacitor divider 310 generates the second voltage V2 based on the first voltage V1. In this case, when the first voltage V1 is generated, the second voltage V2 is generated based on the first voltage V1, and the second voltage V2 is transferred causing an increase in power loss. However, when the DC-DC converter 210b directly generates the second voltage V2 based on the battery voltage VBAT, the first voltage V1 may be maintained by the first capacitor divider 310, and thus the power loss may be reduced.

Figure 15:
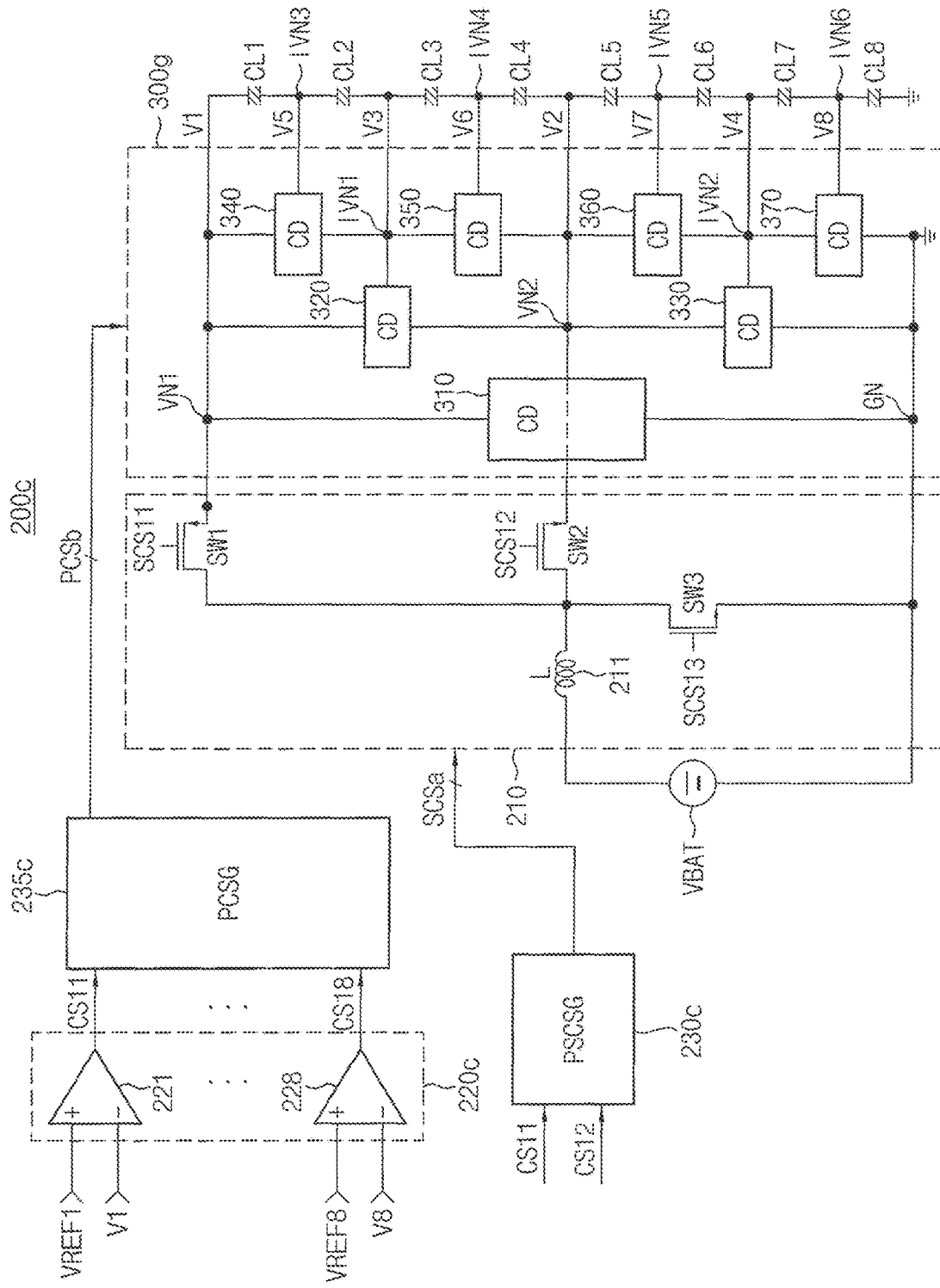
FIG. 15 is a block diagram illustrating an example of the SIMO converter of FIG. 4 according to some example embodiments.

FIG. 15 is a block diagram illustrating an example of the SIMO converter of FIG. 4 according to some example embodiments.

Referring to FIG. 15, a SIMO converter 200f may include a DC-DC converter 210, a voltage dividing capacitor circuit 300g, a comparator block 220c, a PSCSG 230c, a PCSG 235c and first through eighth load capacitors CL1, CL2, CL3, CL4, CL5, CL6, CL7 and CL8.

The configuration and operation of the DC-DC converter 210 and the PSCSG 230c of FIG. 15 may be the same as the configuration and operation of the DC-DC converter 210 and the PSCSG 230 in FIG. 4.

The comparator block 220c may include a plurality of comparators 221-228 that compare each of a plurality of voltages V1-V4 with a respective reference voltage from a plurality of reference voltages VREF1-VREF8, and the comparator block 220c may generate and/or output a plurality of comparison signals CS21-CS28. The PCSG 235c may generate a phase control signal PCSb based on the plurality of comparison signals CS21-CS28, and may provide the phase control signal PCSb to the voltage dividing capacitor circuit 300c.

The voltage dividing circuit 300f may include first through seventh capacitor dividers 310-370.

The first through third capacitor dividers 310, 320 and 330 of FIG. 15 may be the same as the first through third capacitor dividers 310, 320 and 330 in FIG. 5A.

The fourth capacitor divider 340 may be connected to the first voltage node VN1, the first intermediate voltage node IVN1, and a third intermediate voltage node IVN3, and the fourth capacitor divider 340 may generate and output a fifth voltage V5 to the third intermediate voltage node IVN3. The fifth capacitor divider 350 may be connected to the first intermediate voltage node IVN1, the second voltage node VN2, and a fourth intermediate voltage node IVN4, and the fifth capacitor divider 340 may generate and output a sixth voltage V6 to the fourth intermediate voltage node IVN4.

The sixth capacitor divider 360 may be connected to the second voltage node VN2, the second intermediate voltage node IVN2, and a fifth intermediate voltage node IVN5, and the sixth capacitor divider 360 may generate and output a seventh voltage V7 to the fifth intermediate voltage node IVN5. The seventh capacitor divider 370 may be connected to the second intermediate voltage node IVN2, the ground node GN, and a sixth intermediate voltage node IVN6, and seventh capacitor divider 370 may output an eighth voltage V8 at the sixth intermediate voltage node IVN6.

The first load capacitor CL1 is connected between the first voltage node VN1 and the third intermediate voltage node IVN3, the second load capacitor CL2 is connected between the third intermediate voltage node IVN3 and the first intermediate voltage node IVN1, the third load capacitor CL3 is connected between the first intermediate voltage node IVN1 and the fourth intermediate voltage node IVN4, the fourth load capacitor CL4 is connected between the fourth intermediate voltage node IVN4 and the second voltage node VN2, the fifth load capacitor CL5 is connected between the second voltage node VN2 and the fifth intermediate voltage node IVN5, the sixth load capacitor CL6 is connected between the fifth intermediate voltage node IVN5 and the second intermediate voltage node IVN2, the seventh load capacitor CL7 is connected between the second intermediate voltage node IVN2 and the sixth intermediate voltage node IVN6 and the eighth load capacitor CL8 is connected between the sixth intermediate voltage node IVN6 and the ground voltage. The first through eighth load capacitors CL1, CL2, CL3, CL4, CL5, CL6, CL7 and CL8 may be connected in series between the first voltage node VN1 and the ground voltage.

Each of the first through seventh capacitor dividers 310-370 may perform and/or operate one of a voltage drop operation and a voltage booting operation.

Therefore, when the DC-DC converter 210 provides a current to the first voltage node VN1 through the first power switch SW1, and the first voltage V1 is present at the first voltage node VN1, the first capacitor divider 310 provides the second voltage V2 to the second voltage node VN2 based on the first voltage VN1 as described with reference to FIGS. 6B and 6C. The second capacitor divider 320 provides the third voltage V3 to the first intermediate voltage node IVN1 based on the first voltage V1 and the second voltage V2, and the third capacitor divider 330 provides the fourth voltage V4 to the second intermediate voltage node IVN2 based on the second voltage V2.

In addition, the fourth capacitor divider 340 provides the fifth voltage V5 to the third intermediate voltage node IVN3 based on the first voltage V1 and the third voltage V3, and the fifth capacitor divider 350 provides the sixth voltage V6 to the fourth intermediate voltage node IVN4 based on the third voltage V3 and the second voltage V2. The sixth capacitor divider 360 provides the seventh voltage V7 to the fifth intermediate voltage node IVN5 based on the second voltage V2 and the fourth voltage V4, and the seventh capacitor divider 370 provides the eighth voltage V8 to the sixth intermediate voltage node IVN6 based on the fourth voltage V4.

Therefore, the voltage dividing capacitor circuit 300g may generate and output a plurality of voltages corresponding to V1, (7/8)*V4, (6/8)*V1, (5/8)*V1, (4/8)*V1, (3/8)*V1, (2/8)*V1 and (1/8)*V1 to the first voltage node VN1, the third voltage node VN3, the first intermediate voltage node IVN3, the fourth intermediate voltage node IVN4, the second voltage node VN2, the fifth intermediate voltage node IVN5, the second intermediate voltage node IVN2 and the sixth intermediate voltage node IVN6, respectively. The plurality of voltages corresponding to V1, (7/8)*V4, (6/8)*V1, (5/8)*V1, (4/8)*V1, (3/8)*V1, (2/8)*V1 and (1/8)*V1 have different voltage levels.

Figure 16:
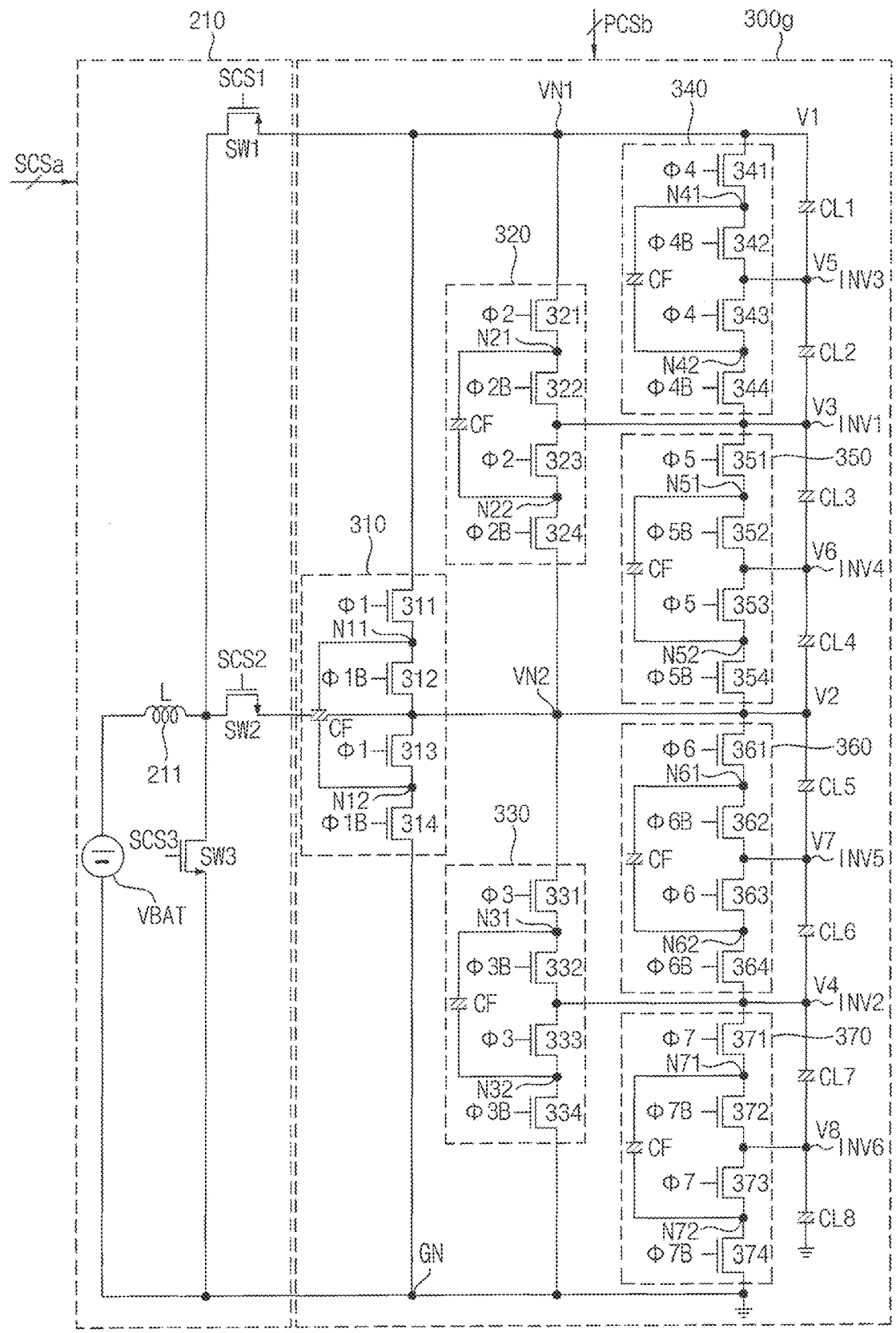
FIG. 16 is a circuit diagram illustrating an example of the voltage dividing capacitor circuit in the SIMO converter of FIG. 15 according to some example embodiments.

FIG. 16 is a circuit diagram illustrating an example of the voltage dividing capacitor circuit in the SIMO converter of FIG. 15 according to some example embodiments.

Referring to FIG. 16, the voltage dividing circuit 300g may include the first through seventh capacitor dividers 310-370 and first through eighth load capacitors CL1, CL2, CL3, CL4, CL5, CL6, CL7 and CL8.

The first capacitor divider 310 may include a plurality of transistors 311, 312, 313 and 314 which are connected in series between the first voltage node VN1 and the ground node GN, and a flying capacitor CF which is connected between a node N11 and a node N12. According to some example embodiments, the flying capacitor CF may be connected in parallel to one or more transistors, e.g., transistors 312 and/or 313.

The transistor 311 is connected between the first voltage node VN1 and the node N11, the transistor 312 is connected between the node N11 and the second voltage node VN2, the transistor 313 is connected between the second voltage node VN2 and the node N12, and the transistor 314 is connected between the second voltage node VN2 and the ground node GN.

Each gate of the plurality of transistors 311 and 313 receives a first phase control signal Φ1, and each gate of the plurality of transistors 312 and 314 receives a first inversion phase control signal Φ1B which has a phase difference of 180 degrees with respect to the first phase control signal Φ1. When the transistors 311 and 313 are turned on, and the transistors a 312 and 314 are turned off, the first capacitor divider 310 stores, in the flying capacitor CF, a voltage corresponding to a difference between the first voltage V1 and the second voltage V2. When the transistors 311 and 313 are turned off, and the transistors 312 and 314 are turned, the voltage stored in the flying capacitor CF is provided to the second voltage node VN2 and stored in the second load capacitor CL2.

The second capacitor divider 320 may include a plurality of transistors 321, 322, 323 and 324 which are connected in series between the first voltage node VN1 and the second voltage node VN2, and a flying capacitor CF which is connected between a node N21 and a node N22. Each gate of the transistors 321 and 323 receives a second phase control signal Φ2, and each gate of the transistors 322 and 324 receives a second inversion phase control signal Φ2B which has a phase difference of 180 degrees with respect to the second phase control signal Φ2.

The third capacitor divider 330 may include a plurality of transistors 331, 332, 333 and 334 which are connected in series between the second voltage node VN2 and the ground node GN, and a flying capacitor CF which is connected between a node N31 and a node N32. Each gate of the transistors 331 and 333 receives a third phase control signal Φ3, and each gate of the transistors 332 and 334 receives a third inversion phase control signal Φ3B which has a phase difference of 180 degrees with respect to the third phase control signal Φ3.

The fourth capacitor divider 340 may include a plurality of transistors 341, 342, 343 and 344 which are connected in series between the first voltage node VN1 and the first intermediate voltage node IVN1, and a flying capacitor CF which is connected between a node N41 and a node N42. Each gate of the transistors 341 and 343 receives a fourth phase control signal Φ4, and each gate of the transistors 342 and 344 receives a fourth inversion phase control signal Φ4B which has a phase difference of 180 degrees with respect to the fourth phase control signal Φ4. A node between the transistors 342 and 343 may be the third intermediate voltage node IVN3.

The fifth capacitor divider 350 may include a plurality of transistors 351, 352, 353 and 354 which are connected in series between the first intermediate voltage node IVN1 and the second voltage node VN2, and a flying capacitor CF which is connected between a node N51 and a node N52. Each gate of the transistors 351 and 353 receives a fifth phase control signal Φ5, and each gate of the transistors 352 and 354 receives a fifth inversion phase control signal Φ5B which has a phase difference of 180 degrees with respect to the fifth phase control signal Φ5. A node between the transistors 352 and 353 may be the fourth intermediate voltage node IVN4.

The sixth capacitor divider 360 may include a plurality of transistors 361, 362, 363 and 364 which are connected in series between the second voltage node VN2 and the second intermediate voltage node IVN2, and a flying capacitor CF which is connected between a node N61 and a node N62. Each gate of the transistors 361 and 363 receives a sixth phase control signal Φ6, and each gate of the transistors 362 and 364 receives a sixth inversion phase control signal Φ6B which has a phase difference of 180 degrees with respect to the sixth phase control signal Φ6. A node between the transistors 362 and 363 may be the fifth intermediate voltage node IVN5.

The seventh capacitor divider 370 may include a plurality of transistors 371, 372, 373 and 374 which are connected in series between the second intermediate voltage node IVN2 and the ground node GN, and a flying capacitor CF which is connected between a node N71 and a node N72. Each gate of the transistors 371 and 373 receives a seventh phase control signal Φ7, and each gate of the transistors 372 and 374 receives a seventh inversion phase control signal Φ7B which has a phase difference of 180 degrees with respect to the seventh phase control signal Φ7. A node between the transistors 372 and 373 may be the sixth intermediate voltage node IVN6.

Operation of each of the second through fourth capacitor dividers 320-370 in a first state and a second state of a corresponding phase control signal may be similar to the operations discussed in connection with FIGS. 6B and 6C.

Figure 17:
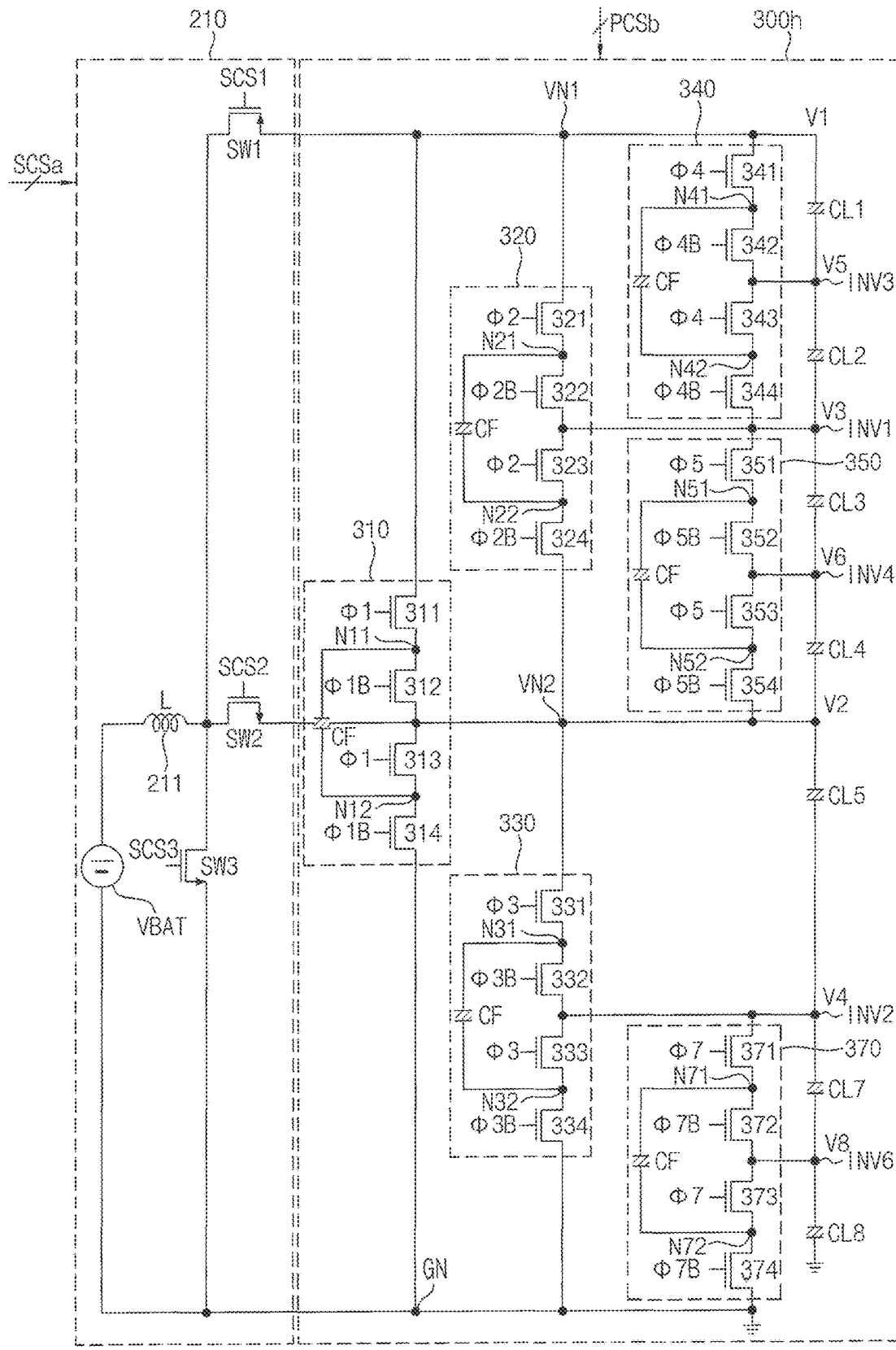
FIG. 17 is a circuit diagram illustrating another example of the voltage dividing capacitor circuit in the SIMO converter of FIG. 15 according to some example embodiments.

FIG. 17 is a circuit diagram illustrating another example of the voltage dividing capacitor circuit in the SIMO converter of FIG. 15 according to some example embodiments.

A voltage dividing capacitor circuit 300h in FIG. 17 differs from the voltage dividing capacitor circuit 300g in FIG. 16 in that the voltage dividing capacitor circuit 300h in FIG. 17 does not include the sixth capacitor divider 360 and the sixth load capacitor CL6. Therefore, the voltage dividing capacitor circuit 300h may have a reduced number of load capacitors and/or switches.

Figure 18:
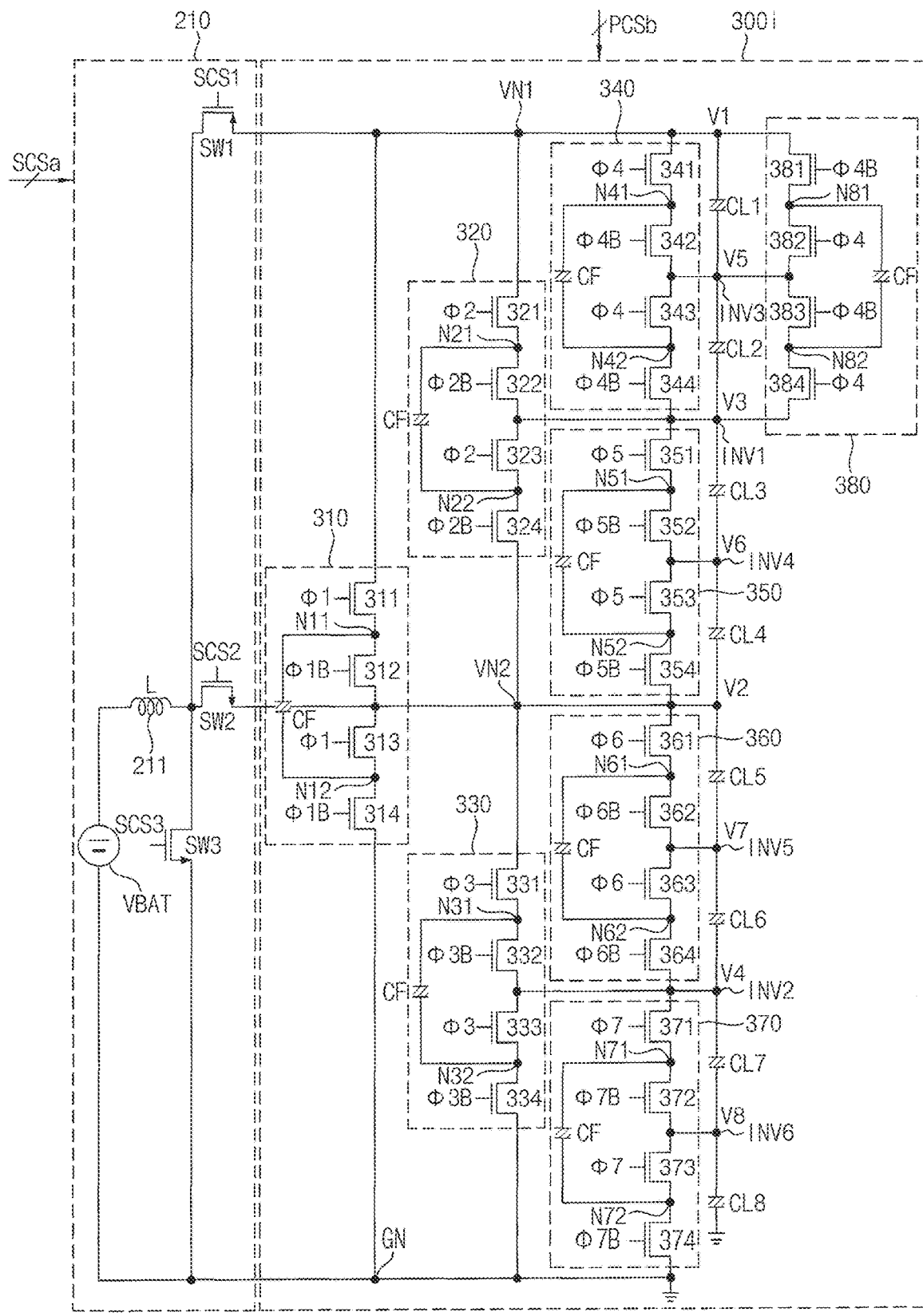
FIG. 18 is a circuit diagram illustrating another example of the voltage dividing capacitor circuit in the SIMO converter of FIG. 15 according to some example embodiments.

FIG. 18 is a circuit diagram illustrating another example of the voltage dividing capacitor circuit in the SIMO converter of FIG. 15 according to some example embodiments.

A voltage dividing capacitor circuit 300i in FIG. 18 differs from the voltage dividing capacitor circuit 300g in FIG. 16 in that the voltage dividing capacitor circuit 300i in FIG. 18 further includes an eighth capacitor divider 380.

Referring to FIG. 18, the eight capacitor divider 380 may be connected between first voltage node VN1 and the first intermediate voltage node IVN1 in parallel with the fourth capacitor divider 340.

The eight capacitor divider 380 may include a plurality of transistors 381, 382, 383 and 384 which are connected in series between the first voltage node VN1 and the first intermediate voltage node IVN1, and a flying capacitor CF which is connected between a node N81 and a node N82. Each gate of the transistors 381 and 383 receives the fourth phase control signal Φ4, and each gate of the transistors 382 and 384 receives the fourth inversion phase control signal Φ4B.

The fourth capacitor divider 340 and the eighth capacitor divider 380 may operate complementarily in response to the fourth phase control signal Φ4 and the fourth inversion phase control signal Φ4B, and may provide additional current to the third intermediate voltage node IVN3 when a current provided to the load from the third intermediate voltage node IVN3 increases as described in connection with FIGS. 8A and 8B. At least one additional capacitor divider operating complementarily may be connected to a load which consumes too much current and/or more current than desired, and the additional capacitor divider may supply additional current to the desired node rapidly.

Figure 19:
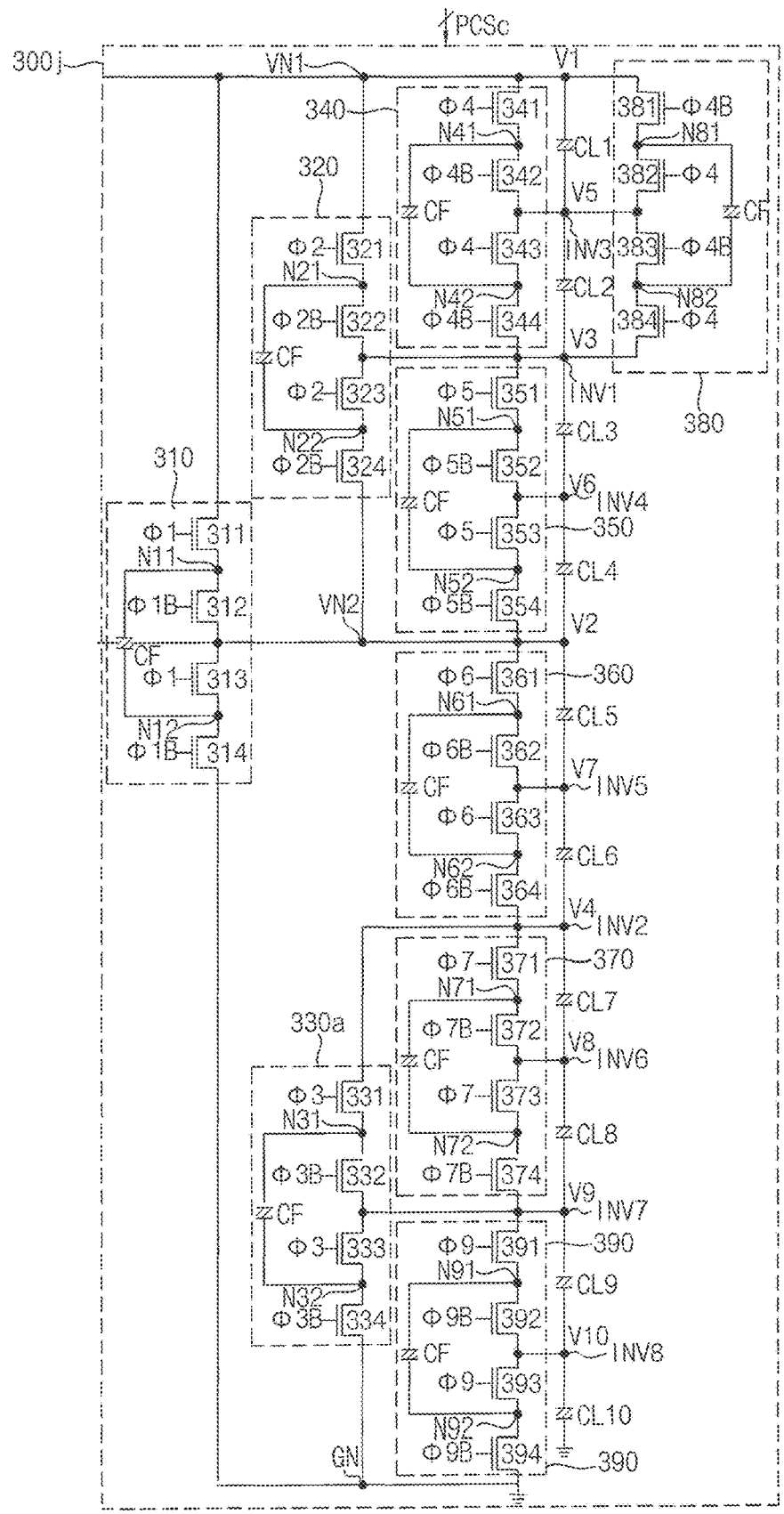
FIG. 19 is a circuit diagram illustrating an example of the voltage dividing capacitor circuit in the SIMO converter of FIG. 15 according to some example embodiments.

FIG. 19 is a circuit diagram illustrating an example of the voltage dividing capacitor circuit in the SIMO converter of FIG. 15 according to some example embodiments.

A voltage dividing circuit 300j in FIG. 19 differs from the voltage dividing circuit 300i in FIG. 18 in a connection of a third capacitor divider 330a and in that the voltage dividing circuit 300i further include a ninth capacitor divider 390, a ninth load capacitor CL9 and a tenth load capacitor CL10.

Referring to FIG. 19, the third capacitor divider 330a may be connected between the second voltage node VN2 and the ground node GN and may include a flying capacitor CL connected to a seventh intermediate voltage node IVN7. The ninth capacitor divider 390 may include a plurality of switches 391, 392, 393 and 394 which are connected in series between the seventh intermediate voltage node IVN and the ground voltage, and a flying capacitor CF which is connected between a node N91 and a node N92. Each gate of the transistors 391 and 393 receives a ninth phase control signal Φ9, and each gate of the transistors 382 and 384 receives a ninth inversion phase control signal Φ9B which has a phase difference of 180 degrees with respect to the ninth phase control signal Φ9.

A set of phase control signal PCSc may be applied to the voltage dividing circuit 300i.

Figure 20:
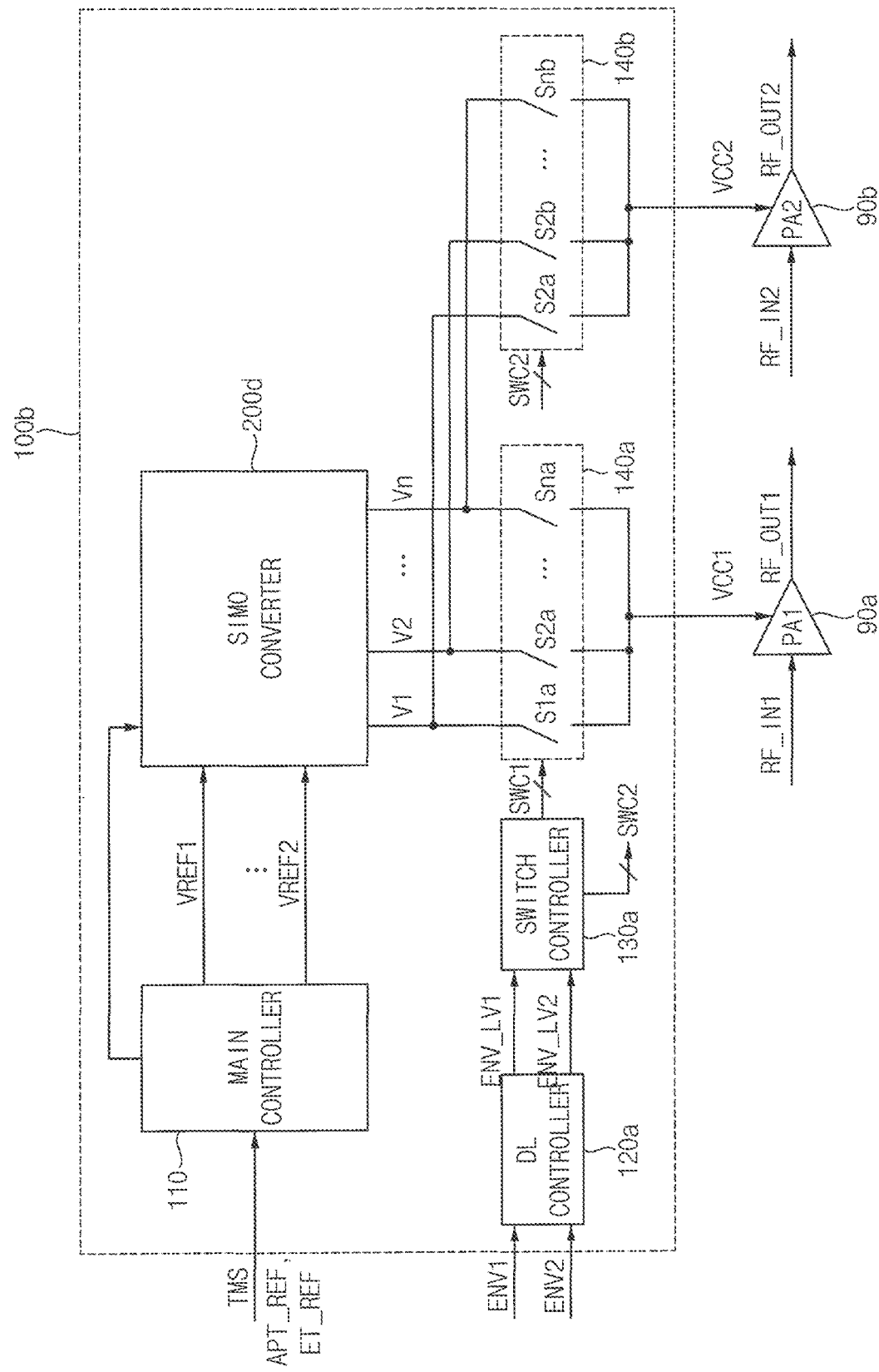
FIG. 20 is a block diagram illustrating an example of a supply modulator according to some example embodiments.

FIG. 20 is a block diagram illustrating an example of a supply modulator according to some example embodiments.

In FIG. 20, a first power amplifier 90a and a second power amplifier 90b are illustrated together for the sake of brevity and convenience of explanation.

Referring to FIG. 20, a supply modulator 100b may include a main controller 110, a discrete level (DL) controller 120a, a switch controller 130a, a first switch array 140a, a second switch array 140b, a third switch S31, a fourth switch S32 and/or a SIMO converter 200d.

The main controller 110 may receive the tracking mode signal TMS, the average power signal ART_REF, and the ET reference signal ET_REF from a modem, such as the modem 40 in FIG. 1, and the main controller 110 may determine a tracking mode of the supply modulator 100d based on the tracking mode signal TMS. Additionally, the main controller 110 may generate a plurality of reference voltages VREF1~VREFn based on the ET reference signal ET_REF while in the ET mode, and may provide the plurality of reference voltages VREF1~VREFn to the SIMO converter 200b. The main controller 110 may control the discrete level controller 120a, the switch controller 130a and/or the SIMO converter 200d.

The SIMO converter 200d may generate a plurality of voltages V1~Vn based on the battery voltage VBAT under the control of (and/or based on signals received from) the main controller 110, and may provide the plurality of voltages V1~Vn to the first switch array 140a and/or the second switch array 140b. The SIMO converter 200d may generate a plurality of APT voltages, such as first APT voltage APT_V and a second APT voltage APT_V2, based on the average power signal ART_REF while in the APT mode. The SIMO converter 200d may provide the first APT voltage APT_V to the first power amplifier 90a through the third switch S32 or may provide the second APT voltage APT_V2 to the second power amplifier 90b through the fourth switch S33.

The SIMO converter 200d may generate the plurality of voltages V1~Vn having different voltage levels based on the plurality of reference voltages VREF1~VREFn and the battery voltage VBAT in the ET mode. The SIMO converter 200d may output the plurality of voltages V1~Vn to the first switch array 140a and the second switch array 140b.

The first switch array 140a may include a plurality of switches S1a~Sna corresponding to the plurality of voltages V1~Vn having different voltage levels. The second switch array 140b may include a plurality of switches S2a~Snb corresponding to the plurality of voltages V1~Vn having different voltage levels. The opening and closing operations of the plurality of switches S1a~Sna may be controlled by a switch control signal SWC1 provided from the switch controller 130a. The opening and closing operations of the plurality of switches S2a~Snb may be controlled by a switch control signal SWC2 provided from the switch controller 130a.

The switch controller 130a may control on/off of the third switch S31 and the fourth switch S32 using switch control signals SWC3 and SWC4 under the control of (and/or based on signals received from) the main controller 110 while in the APT mode.

When the SIMO converter 200d operates in an APT-APT mode, the switch controller 130a may turn off the switches S1a~Sna and the switches S2a~Snb, and may turn on the third switch S31 and the fourth switch S32. When the SIMO converter 200d operates in an ET-ET mode, the switch controller 130a may turn on one of the switches S1a~Sna and one of the switches S2a~Snb, and may turn off the third switch S31 and the fourth switch S32.

The discrete level controller 120a may generate a first level control signal ENV_LV1 including envelope level information based on a first envelope signal ENV1 from the modem 40. The discrete level controller 120a may generate a second level control signal ENV_LV2 including envelope level information based on a second envelope signal ENV2 from the modem 40. The discrete level controller 120 may provide the first level control signal ENV_LV1 and/or the second level control signal ENV_LV2 to the switch controller 130a.

In the ET mode, the first switch array 140a may select a first voltage among the plurality of voltages V1~Vn, and may provide the selected first voltage to the first power amplifier 90a as a first supply voltage VCC1. In the ET mode, the second switch array 140b may select a second voltage among the plurality of voltages V1~Vn and may provide the selected second voltage to the second power amplifier 90b as a second supply voltage VCC2. In addition, in the APT mode, the switch controller 130 may control at least one of the plurality of switches S1~Sn such that a voltage having a nearest level (e.g., closest voltage level) is selected. The nearest level may be a one of the plurality of voltages V1~Vn with a level greater than the desired and/or required level and/or and with the voltage level nearest the desired and/or required level.

The first power amplifier 90a may amplify a first RF input signal RF_IN1 based on the first supply voltage VCC1 or the first APT voltage APT_V1 to generate a first RF output signal RF_OUT1. The second power amplifier 90b may amplify a second RF input signal RF_IN2 based on the second supply voltage VCC2 or the second APT voltage APT_V2 to generate a second RF output signal RF_OUT2.

The SIMO converter 200d may operate in one of APT-APT mode, ET-APT mode and ET-ET mode, and may provide the plurality of voltages V1~Vn to the first switch array 140a and the second switch array 140b.

Figure 21:
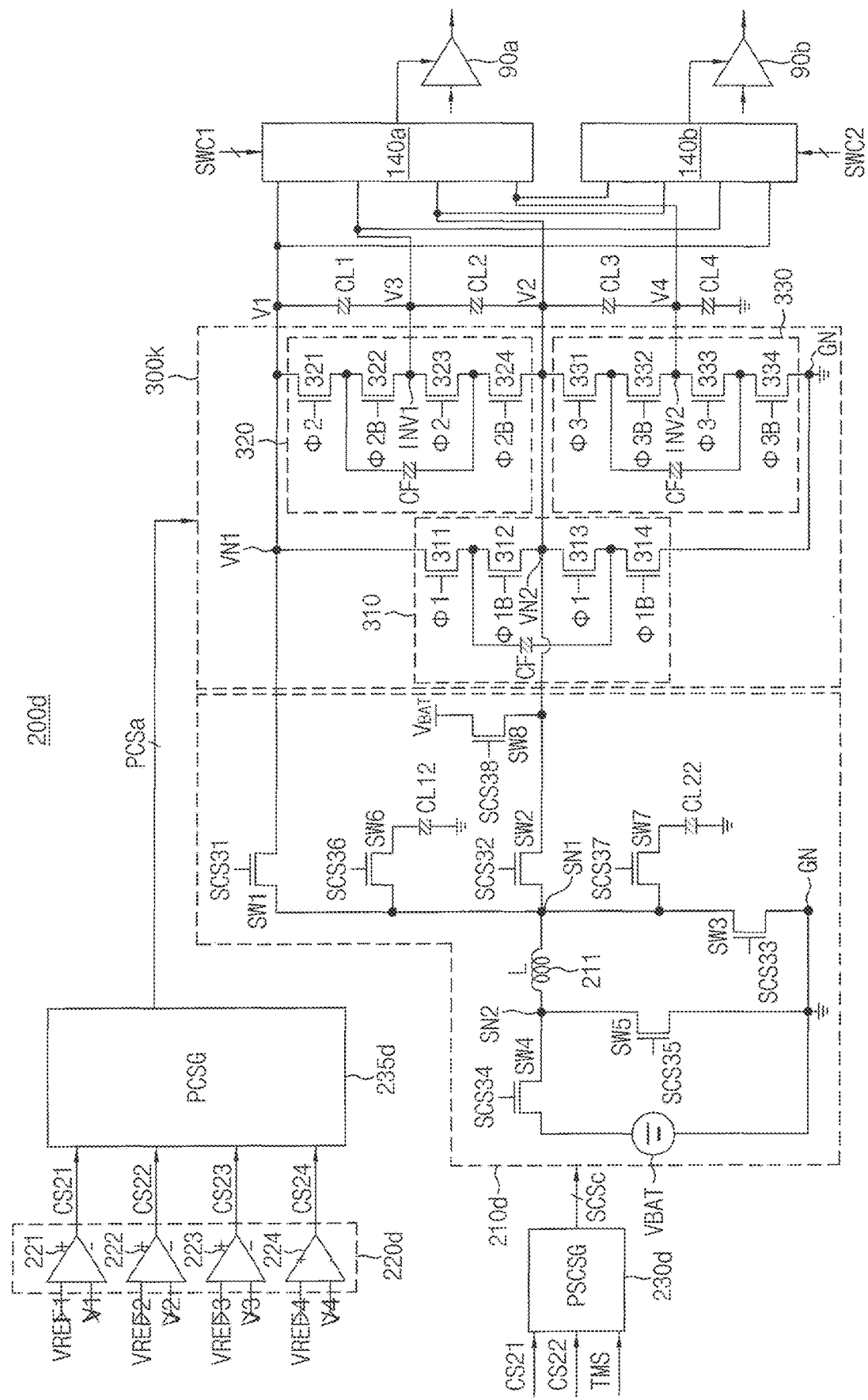
FIG. 21 is a block diagram illustrating an example of the SIMO converter in the supply modulator in FIG. 20 according to some example embodiments.

FIG. 21 is a block diagram illustrating an example of the SIMO converter in the supply modulator in FIG. 20 according to some example embodiments.

In FIG. 21, the first switch array 140a, the second switch array 140b, the first power amplifier 90a and the second power amplifier 90b are illustrated together for the sake of brevity and convenience of explanation.

Referring to FIG. 21, a SIMO converter 200d may include a DC-DC converter 210, a voltage dividing capacitor circuit 300k, a comparator block 220d, PSCSG 230d, a PCSG 235d, and first through fourth load capacitors CL1, CL2, CL3 and CL4. The first through fourth load capacitors CL1, CL2, CL3 and CL4 may be included in the voltage dividing capacitor circuit 300j.

The comparator block 220d may include a plurality of comparators 221, 222, 223 and 224 that compare each of a plurality of voltages V1, V2, V3 and V4 with one of a plurality of reference voltages VREF1, VREF2, VREF3 and VREF4, respectively, to generate and output a plurality of comparison signals CS21, CS22, CS23 and CS24 based on the results of the respective comparisons.

The first load capacitor CL1 is connected between the first voltage node VN1 and the first intermediate voltage node IVN1. The second load capacitor CL2 is connected between the first intermediate voltage node IVN1 and the second voltage node VN2. the third load capacitor CL3 is connected between the second voltage node VN2 and the second intermediate voltage node IVN2. And the fourth load capacitor CL4 is connected between the second intermediate voltage node IVN2 and the ground voltage. The first through fourth load capacitors CL1, CL2, CL3 and CL4 may be connected in series between the first voltage node VN1 and the ground voltage.

The PSCSG 230d may generate a first set of switch control signal SCSc based on a first comparison signal CS21, a second comparison signal CS22, and/or the tracking mode signal TMS, and the PSCSG 230d may provide the first set of switch control signal SCSc to the DC-DC converter 210d.

The PCSG 235d may generate a phase control signal PCSa based on the plurality of comparison signals CS21, CS22, CS23 and CS24, and may provide the phase control signal PCSa to the voltage dividing capacitor circuit 300k. According to some example embodiments, the configuration of the voltage dividing capacitor circuit 300k of FIG. 21 may be the same as the configuration of the voltage dividing capacitor circuit 300a in FIG. 4.

The DC-DC converter 210d may include the inductor 211, first through eighth power switches SW1, SW2, SW3, SW4, SW5, SW6, SW7 and SW8, and load capacitors CL12 and CL22.

The inductor 211 may be connected between a first switching node SN1 and a second switching node SN2. The first power switch SW1 may be connected between the first switching node SN1 and the first voltage node VN1, and the first power switch SW1 may have a gate to receive a first switch control signal SCS31. The second power switch SW2 may be connected between the first switching node SN1 and the second voltage node VN2. The second power switch SW2 may have a gate to receive a second switch control signal SCS32. The third power switch SW3 may be connected between the first switching node SN1 and the ground node GN. The third power switch SW3 may have a gate to receive a third switch control signal SCS33. The fourth power switch SW4 may be connected between the second switching node SN2 and the battery voltage VBAT, and the fourth power switch SW4 may have a gate to receive a fourth switch control signal SCS34.

The fifth power switch SW5 may be connected between the second switching node SN2 and the ground node GN. The fifth power switch SW5 may have a gate to receive a fifth switch control signal SCS35. The sixth power switch SW6 may be connected between the first switching node SN1 and the load capacitor CL12. The sixth power switch SW6 may have a gate to receive a sixth switch control signal SCS36. The seventh power switch SW7 may be connected between the first switching node SN1 and the load capacitor CL22 The seventh power switch SW7 may have a gate to receive a seventh switch control signal SCS37. The eighth power switch SW8 may be connected between the battery voltage VBAT and the second voltage node VN2. The eighth power switch SW8 may have a gate to receive an eighth switch control signal SCS38.

The SIMO converter 200d as shown in FIG. 21 may provide the first power amplifier 140a and the second power amplifier 140b with a first supply voltage and a second supply voltage having different voltage levels through the first switch array 140a and the second switch array 140. The SIMO converter 200d may support APT mode and the ET mode.

The SIMO converter 200d may support at least one of an APT-APT mode, APT-ET mode, ET-APT mode, and/or ET-ET mode according to and/or based on a driving mode (e.g., operating mode, etc.) of the supply modulator including the SIMO converter 200d.

When the SIMO converter 200d operates in the ET-ET mode, the SIMO converter 200d may provide at least one of the voltages V1, V2, V3 and V4 generated in the voltage dividing capacitor circuit 300k to the first power amplifier 140a and the second power amplifier 140b through the first switch array 140a and the second switch array 140.

When the SIMO converter 200d operates in the APT-ET mode, the DC-DC converter 210d provides a current to the voltage dividing capacitor circuit 300d via the first power switch SW1, and the voltage dividing capacitor circuit 300k generates the voltages V2, V3 and V4 based on the voltage V1 to support the ET mode. In addition, the DC-DC converter 210d may generate an APT voltage using the sixth power switch SW6 coupled to the load capacitor CL12 and the seventh power switch SW7 coupled to the load capacitor CL22, and the DC-DC converter 210d may provide the APT voltage to the second power amplifier 90b using the second voltage node VN2 and the switch S32 to support the APT mode.

When the SIMO converter 200d operates in the APT-APT mode, the DC-DC converter 210d maintains the voltages V1, V2, V3 and V4 in the voltage dividing capacitor circuit 300k by using the eighth power switch SW8 coupled to the battery voltage VBAT as a low-voltage drop out regulator. The DC-DC converter 210d may provide an APT voltage using the sixth power switch SW6 coupled to the load capacitor CL12 and the seventh power switch SW7 coupled to the load capacitor CL22.

Figure 22:
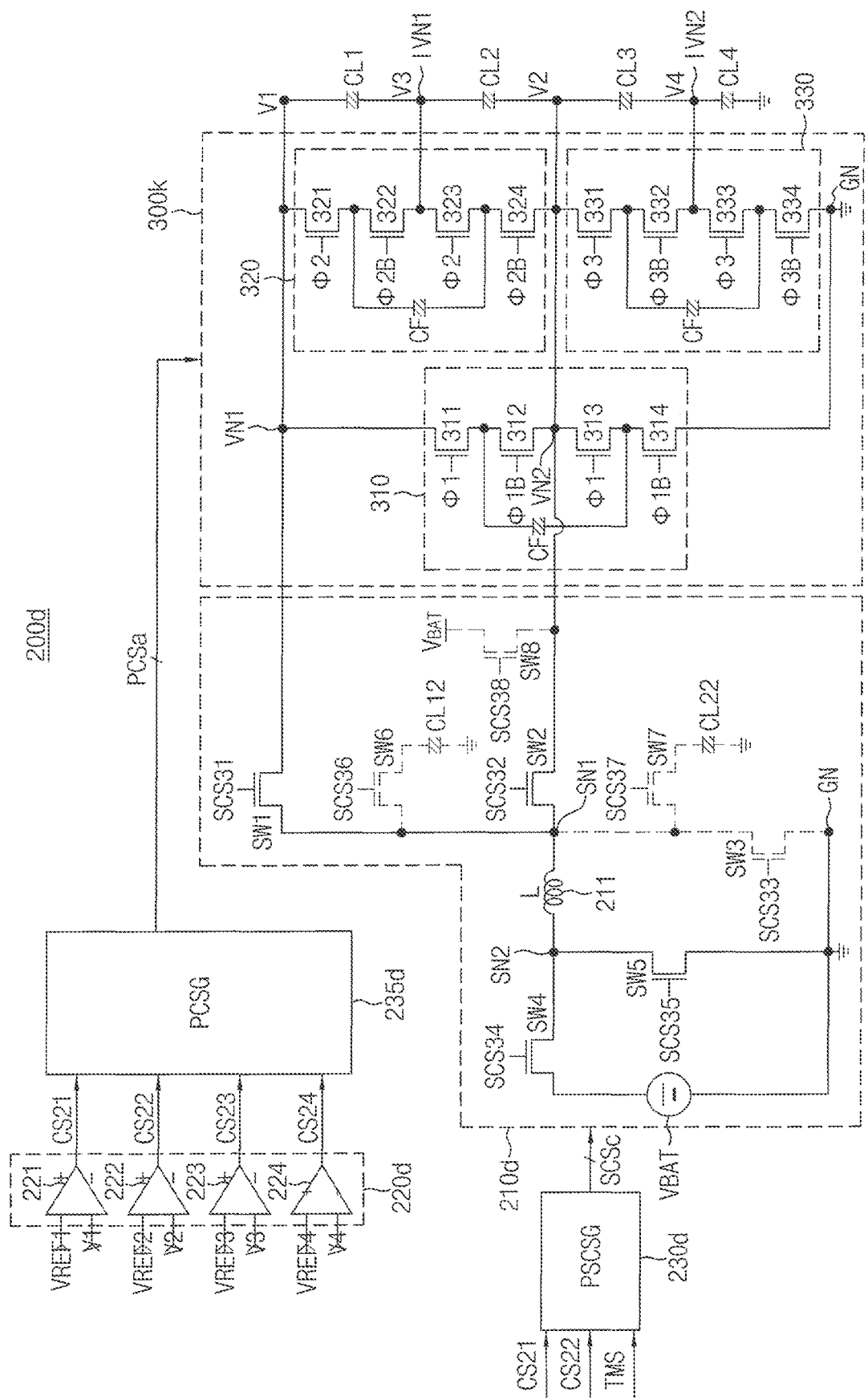
FIG. 22 illustrates that the SIMO converter in FIG. 21 drives two power amplifiers in ET-ET mode.

FIG. 22 illustrates that the SIMO converter in FIG. 21 drives two power amplifiers in ET-ET mode.

Referring to FIG. 22, each of the plurality of power switches SW1, SW2, SW4 and SW5, etc., in the DC-DC converter 210d is switched in response to one of the switch control signals SCS31, SCS32, SCS34 and SCS35, respectively, and each of the power switches SW3, SW6, SW7 and SW8 in the DC-DC converter 210d is turned off in response to one of the switch control signals SCS33, SCS36, SCS37 and SCS38, respectively. Accordingly, the DC-DC converter 210d supplies current to the first voltage node VN1 and the second voltage node VN2, the voltage dividing capacitor circuit 300k generates the third voltage V3 and the fourth voltage V4 based on the first voltage V1 and the second voltage V2, and the voltage dividing capacitor circuit 300k provides the first through fourth voltages V1, V2, V3 and V4 to the first switch array 140a and the second switch array 140b.

The first switch array 140a may select one of the first through fourth voltages V1, V2, V3 and V4 based on the first switch control signal SWC1. The first switch control signal SWC1 may be generated based on a voltage level of the first envelope signal ENV1. The first switch array 140a may provide the selected voltage to the first power amplifier 90a, and the second switch array 140b may select one of the first through fourth voltages V1, V2, V3 and V4 based on the second switch control signal SWC2 generated based on a voltage level of the second envelope signal ENV2, and the second switch array 140b may provide the selected voltage to the second power amplifier 90b.

Figure 23:
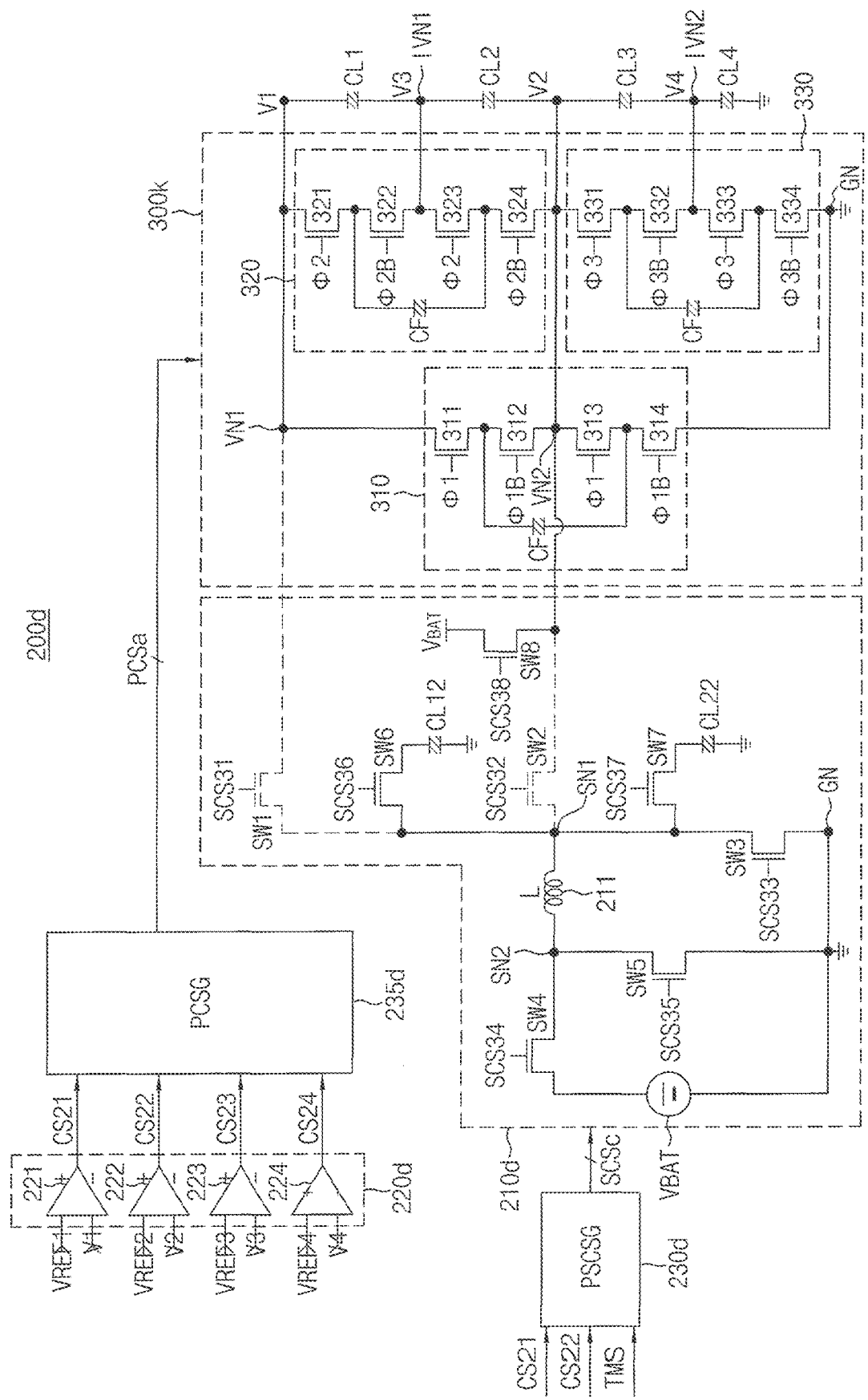
FIG. 23 illustrates that the SIMO converter in FIG. 21 drives two power amplifiers in APT-APT mode.

FIG. 23 illustrates that the SIMO converter in FIG. 21 drives two power amplifiers in APT-APT mode.

Referring to FIG. 23, each of the plurality of power switches SW3, SW4, SW5, SW6, SW7 and SW8, etc., in the DC-DC converter 210d is switched in response to one of the switch control signals SCS33, SCS34, SCS35, SWC36, SWC37 and SCS38, respectively. Each of the power switches SW1 and SW8 in the DC-DC converter 210d is turned off in response to one of the switch control signals SCS31 and SCS32, respectively. Accordingly, the DC-DC converter 210d provides the second voltage V2 to the voltage dividing capacitor circuit 300k by using the eighth power switch SW8 coupled to the battery voltage VBAT as a low-voltage drop out regulator, and the voltage dividing capacitor circuit 300k generates a plurality of voltages V1, V2, V3, and V4. The plurality of voltages V1, V2, V3, and V4 are prepared for a next ET mode. The DC-DC converter 210d may provide an APT voltage using the sixth power switch SW6 coupled to the load capacitor CL12 and the seventh power switch SW7 coupled to the load capacitor CL22 as described with reference to FIG. 21.

Figure 24A:
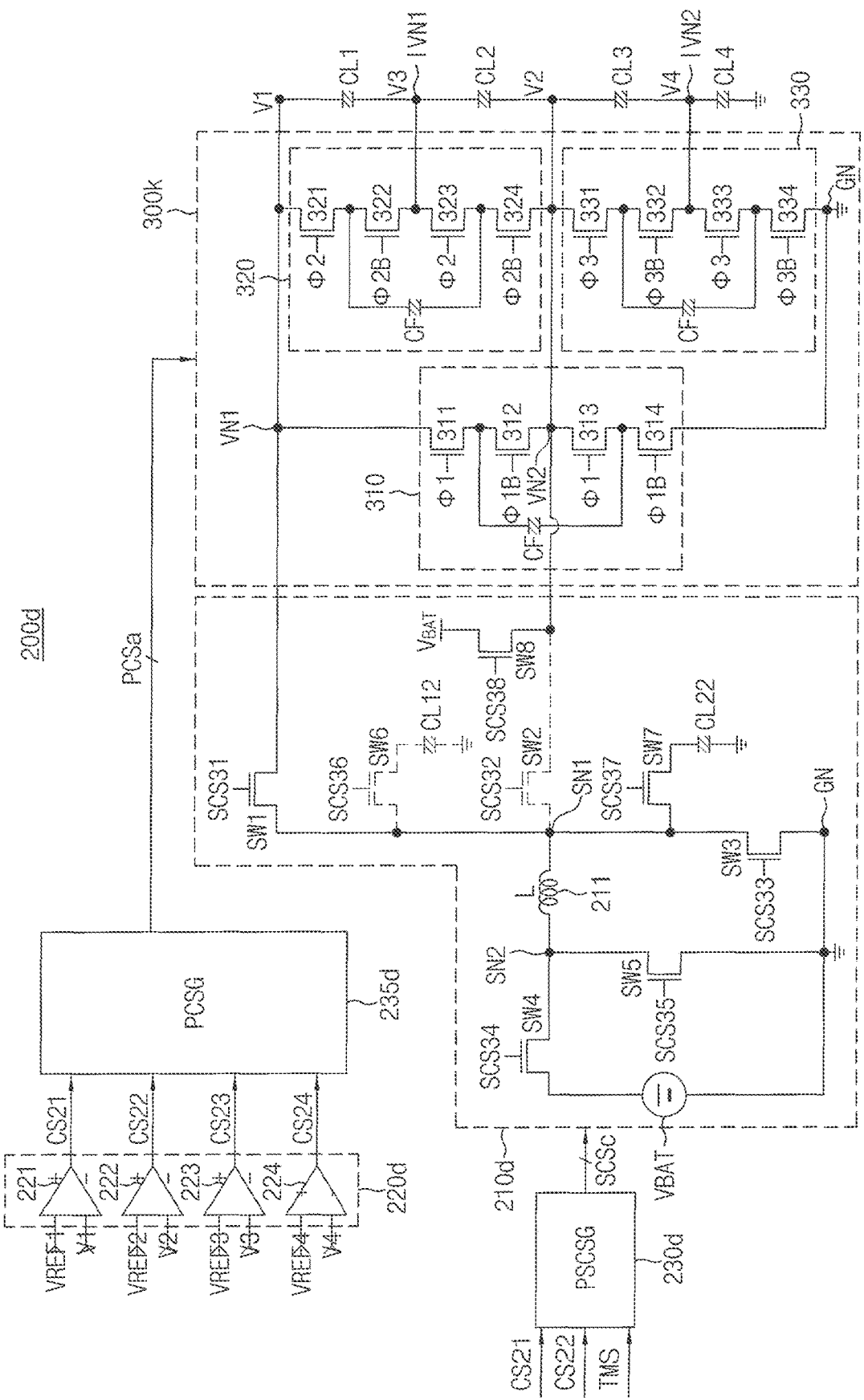
FIG. 24A illustrates that the SIMO converter in FIG. 21 drives two power amplifiers in ET-APT mode.

FIG. 24A illustrates that the SIMO converter in FIG. 21 drives two power amplifiers in ET-APT mode.

Referring to FIG. 24A, each of the plurality of power switches SW1, SW3, SW4, SW5, SW7 and SW8 in the DC-DC converter 210d is switched in response to one of the plurality of switch control signals SCS31, SCS33, SCS34, SWC35, SWC37 and SCS38, respectively, and each of the power switches SW2 and SW6 in the DC-DC converter 210d is turned off in response to one of the switch control signals SCS32 and SCS36, respectively. Accordingly, the DC-DC converter 210d supplies current to the first voltage node VN1 through the power switch SW1, and supplies current to the second voltage node VN2 through the power switch SW8. The voltage dividing capacitor circuit 300k generates the third voltage V3 and the fourth voltage V4 based on the first voltage V1 and the second voltage V2. In addition, the DC-DC converter 210d generates the APT voltage using the power switch SW7 coupled to the load capacitor CL22 and may provide the APT voltage through the first voltage node VN1.

Figure 24B:
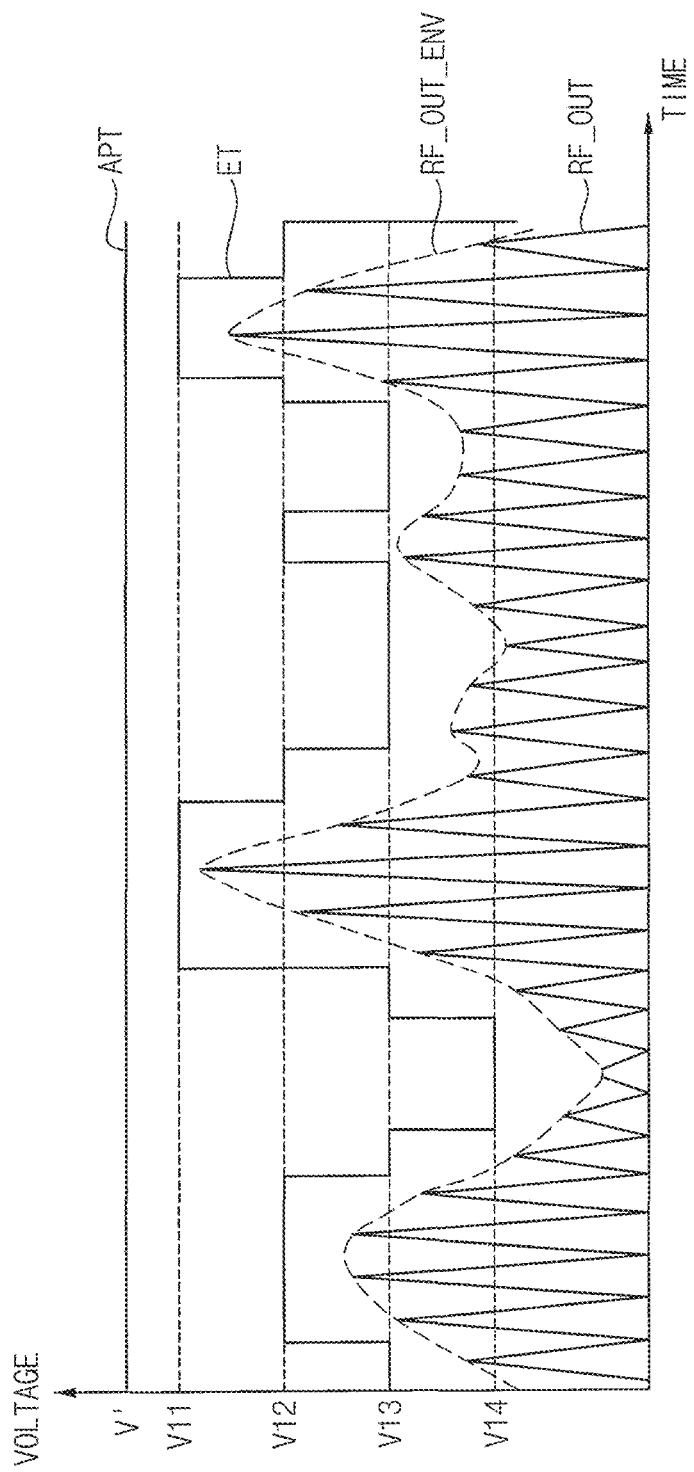
FIG. 24B illustrates waveforms of the output voltage according to a tracking mode in the SIMO converter in FIG. 21.

FIG. 24B illustrates waveforms of the output voltage according to a tracking mode in the SIMO converter in FIG. 21.

FIG. 24B illustrates an output voltage waveform APT_V in the APT mode and an output voltage waveform ET_V in the ET mode.

Here, the APT is a technique for applying a modulation voltage to a power amplifier (e.g., the power amplifier 90 in FIG. 1, etc.), the modulation voltage varying based on a peak level of an envelope RF_OUT_ENV of a RF output signal RF_OUT for each desired and/or predetermined transmission time interval (TTI). The ET is a technique for applying a modulation voltage to a power amplifier (e.g., the power amplifier 90 in FIG. 1, etc.), which instantaneously follows (and/or corresponds to, etc.) a voltage level of the envelope RF_OUT_ENV of the RF output signal RF_OUT, but the example embodiments are not limited thereto. The modulation voltage is limited to a plurality of voltages (for example, V11, V12, V13 and V14, etc.) having different voltage levels which the voltage dividing capacitor circuit 300k is capable of generating. In FIG. 24B, it is assumed that the output voltage waveform APT_V has a level V'.

The envelope RF_OUT_ENV of the RF output signal RF_OUT may be generated based on amplitude of the RF output signal RF_OUT.

Figure 25:
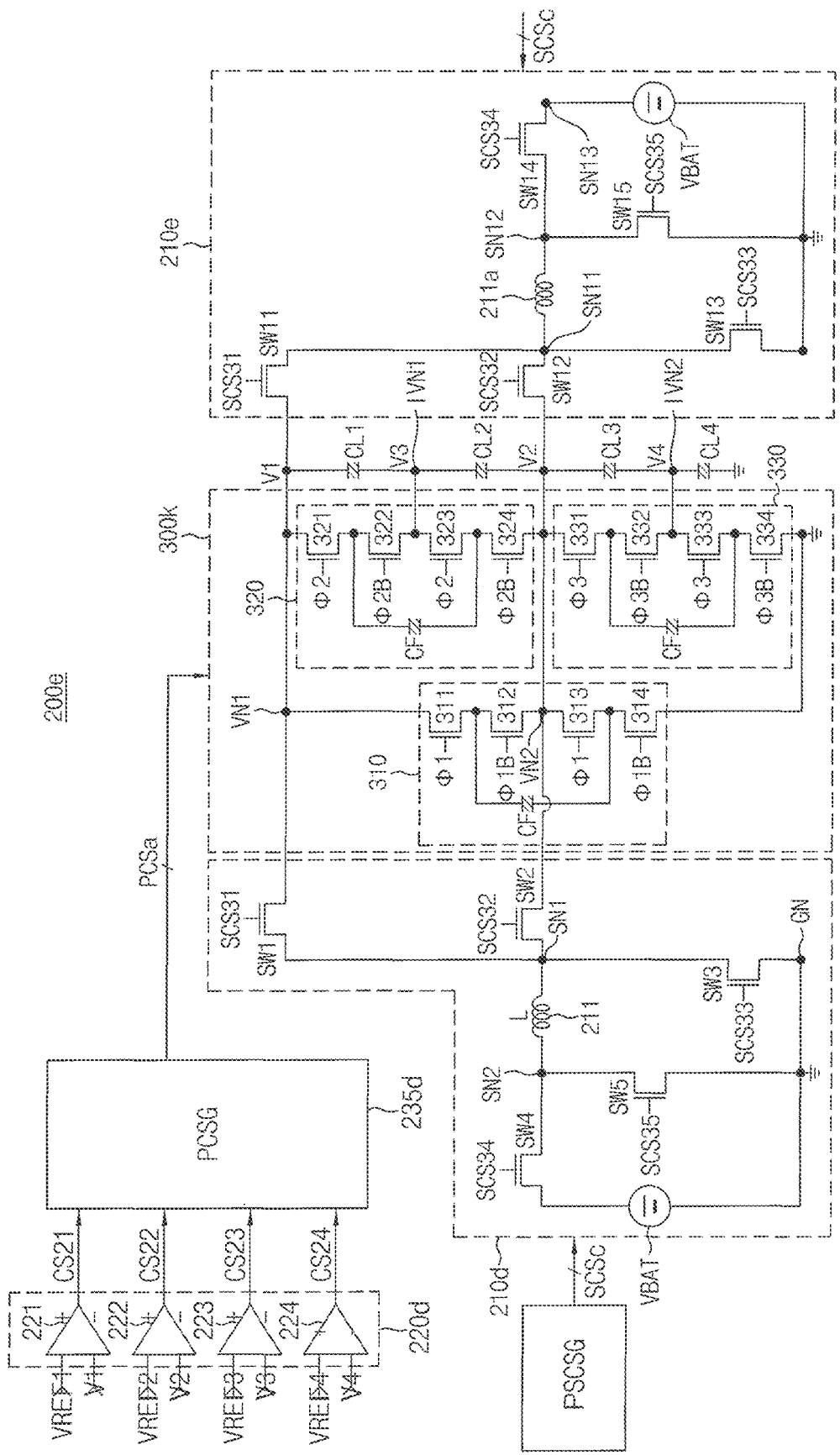
FIG. 25 is a circuit diagram illustrating a converter that employs two DC-DC converters according to some example embodiments.

FIG. 25 is a circuit diagram illustrating a converter that employs two DC-DC converters according to some example embodiments.

Referring to FIG. 25, a converter 200e may include a DC-DC converter 210d, a voltage dividing capacitor circuit 300k, a comparator block 220d, a PSCSG 230d, a PCSG 235d, and/or a second DC-DC converter 210e.

The converter 200e of FIG. 25 differs from the SIMO converter 200f of FIG. 21 in that the converter 200e further includes the second DC-DC converter 210e.

The second DC-DC converter 210e may include an inductor 211a and a first through fifth power switches SW11, SW12, SW13, SW14 and SW15. The inductor 211a may be connected between a first switching node SN11 and a second switching node SN12.

The first power switch SW11 may be connected between the first switching node SN11 and the first voltage node VN1, and the first power switch SW11 may have a gate to receive the first switch control signal SW31. The second power switch SW12 may be connected between the first switching node SN11 and the second voltage node VN2, and the second power switch SW12 may have a gate to receive the second switch control signal SW32. The third power switch SW13 may be connected between the first switching node SN11 and the ground node GN, and the third power switch SW13 may have a gate to receive the third switch control signal SW33. The fourth power switch SW14 may be connected between the second switching node SN12 and the battery voltage VBAT, and the fourth power switch SW14 may have a gate to receive the fourth switch control signal SCS34. The fifth power switch SW15 may be connected between the second switching node SN12 and the ground node GN, and the fifth power switch SW15 may have a gate to receive the fifth switch control signal SCS35.

The DC-DC converter 210d and the second DC-DC converter 210e may be connected to the same nodes, and the DC-DC converter 210d and the second DC-DC converter 210e may share the voltage dividing capacitor circuit 300d and increase the processing capacity and/or efficiency of the circuit.

Figure 26:
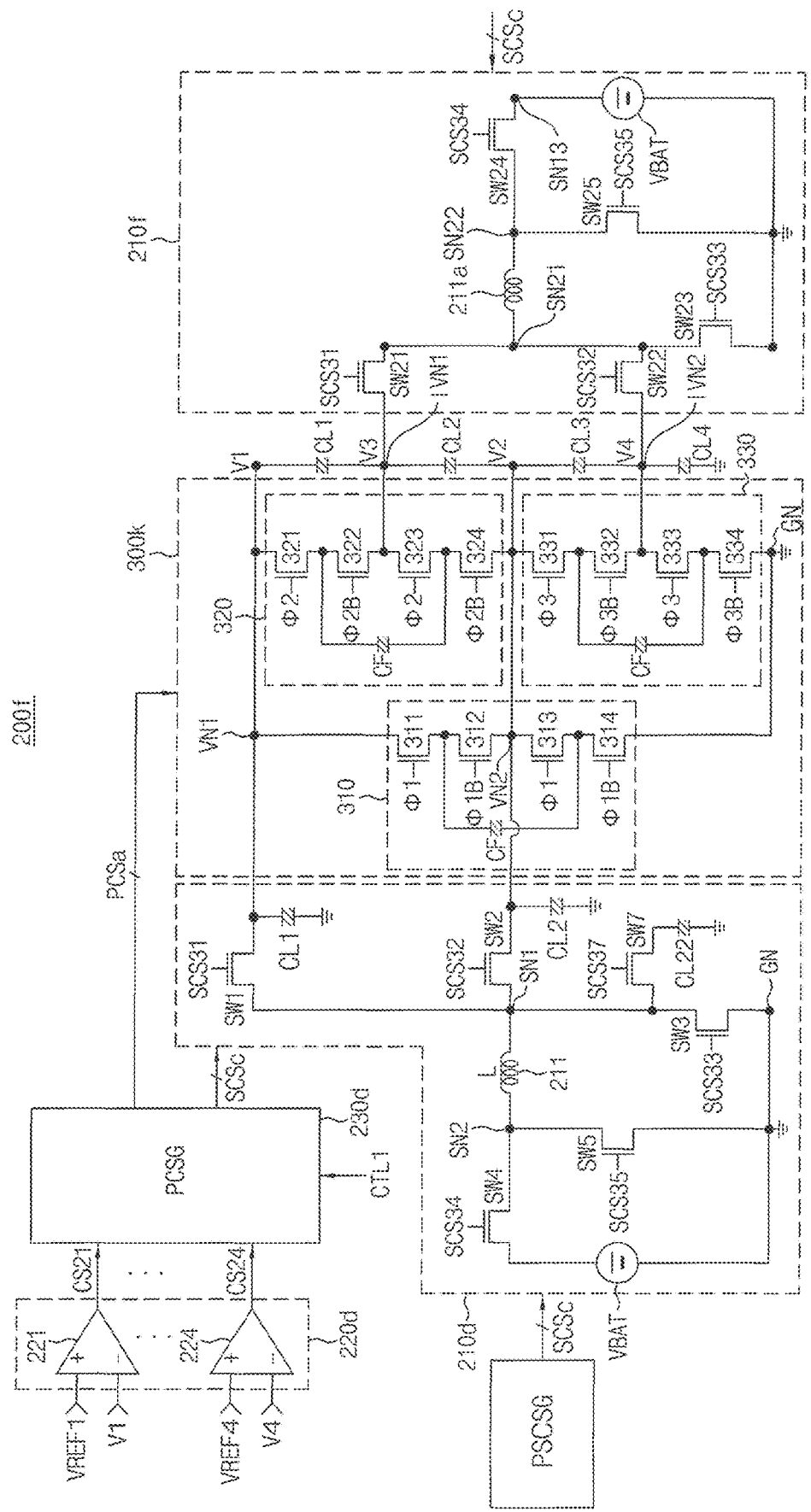
FIG. 26 is a circuit diagram illustrating a converter that employs two DC-DC converters according to some example embodiment.

FIG. 26 is a circuit diagram illustrating a converter that employs two DC-DC converters according to some example embodiments.

Referring to FIG. 26, a converter 200f may include a DC-DC converter 210d, a voltage dividing capacitor circuit 300k, a comparator block 220d, a PSCSG 230d, a PCSG 235d, and/or a second DC-DC converter 210f.

The converter 200f of FIG. 26 differs from the SIMO converter 200d of FIG. 21 in that the converter 200f further includes the second DC-DC converter 210f.

The second DC-DC converter 210f may include an inductor 211a and first through fifth power switches SW21, SW22, SW23, SW24 and SW25. The inductor 211a may be connected between a first switching node SN21 and a second switching node SN22.

The first power switch SW21 may be connected between the first switching node SN21 and the first intermediate voltage node IVN1, and the first power switch SW21 may have a gate to receive the first switch control signal SW31. The second power switch SW22 may be connected between the first switching node SN21 and the second intermediate voltage node IVN2, and the second power switch SW22 may have a gate to receive the second switch control signal SW32.

The third power switch SW23 may be connected between the first switching node SN21 and the ground node GN, and the third power switch SW23 may have a gate to receive the third switch control signal SW33. The fourth power switch SW24 may be connected between the second switching node SN22 and the battery voltage VBAT, and the fourth power switch SW24 may have a gate to receive the fourth switch control signal SCS34. The fifth power switch SW15 may be connected between the second switching node SN22 and the ground node GN, and the fifth power switch SW15 may have a gate to receive the fifth switch control signal SCS35.

The DC-DC converter 210d may supply current to the first voltage node VN1 and the second voltage node VN2 based on the battery voltage VBAT, and the second DC-DC 210f may supply current to the first intermediate voltage node IVN1 and the second intermediate voltage node IVN2 based on the battery voltage VBAT. Therefore, the converter 200f may provide current to the first voltage node VN1, the second voltage node VN2, the first intermediate voltage node IVN1, and/or the second intermediate voltage node IVN2 without passing through the capacitor divider, and thereby may increase the efficiency of the circuit.

According to some example embodiments, the DC-DC converter 210d and the second DC-DC converter 210f may employ DC-DC converters with different configurations.

The voltage dividing capacitor circuit, the SIMO converter and the supply modulator according to some example embodiments may be employed in various communication devices, may reduce power consumption of the communication device, and may enhance performance of the communication device.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the inventive concept. Accordingly, all such modifications are intended to be included within the scope of the inventive concept as defined in the claims.

What is claimed is:

1. A voltage dividing capacitor circuit comprising:
    a first capacitor divider including a first flying capacitor and a plurality of first switches, the first capacitor divider connected to a first voltage node, a ground node, and a second voltage node between the first voltage node and the ground node, the plurality of first switches being connected in series between the first voltage node and the ground node, the ground node coupled to a ground voltage;
    a second capacitor divider connected to the first voltage node, the second voltage node, and a first intermediate voltage node between the first voltage node and the second voltage node, the second capacitor divider including a second flying capacitor and a plurality of second switches, the plurality of second switches being connected in series between the first voltage node and the second voltage node;
    a third capacitor divider connected to the second voltage node, the ground node, and a second intermediate voltage node between the second voltage node and the ground node; and
    a first load capacitor, a second load capacitor, a third load capacitor and a fourth load capacitor which are connected in series between the first voltage node and the ground node.

2. The voltage dividing capacitor circuit of claim 1, wherein the first capacitor divider is configured to,
receive a first voltage at the first voltage node,
generate a second voltage corresponding to one half of the first voltage, and
output the second voltage to the second voltage node.

3. The voltage dividing capacitor circuit of claim 2, wherein:
the second capacitor divider is configured to,
generate a third voltage based on the first voltage and the second voltage, and
output the third voltage to the first intermediate voltage node, the first intermediate voltage node coupled between two of the plurality of second switches;
the third capacitor divider includes a third flying capacitor and a plurality of third switches, the plurality of third switches connected in series between the second voltage node and the ground node, and
the third capacitor divider is configured to, generate a fourth voltage based on the second voltage and the ground voltage, and output the fourth voltage to the second intermediate voltage node, the second intermediate voltage node coupled between two of the plurality of third switches;
the third voltage corresponds to one half of a sum of the first voltage and the second voltage; and
the fourth voltage corresponds to one half of the second voltage.

4. The voltage dividing capacitor circuit of claim 3, wherein
each of the first capacitor divider, the second capacitor divider and the third capacitor divider is configured to operate individually in response to respective ones of first phase control signals, second phase control signals and third phase control signals.

5. The voltage dividing capacitor circuit of claim 3, further comprising:
a fourth capacitor divider connected between the first voltage node and the second voltage node in parallel with the second capacitor divider,
wherein the fourth capacitor divider includes a fourth flying capacitor and a plurality of fourth switches, the plurality of fourth switches connected in series between the first voltage node and the second voltage node, and
wherein the second capacitor divider and the fourth capacitor divider are configured to operate complementarily with respect to each other.

6. The voltage dividing capacitor circuit of claim 1, wherein the first capacitor divider is configured to:
receive a second voltage at the second voltage node;
generate a first voltage corresponding to double the second voltage; and
output the first voltage to the first voltage node.

7. A voltage dividing capacitor circuit comprising:
a first capacitor divider including a first flying capacitor and a plurality of first switches, the first capacitor divider being connected to a first voltage node, a second voltage node and a first intermediate voltage node between the first voltage node and the second voltage node, the plurality of first switches connected in series between the first voltage node and the second voltage node;
a second capacitor divider including a second flying capacitor and a plurality of second switches, the second capacitor divider connected to the second voltage node, a third voltage node and a second intermediate voltage node between the second voltage node and the third voltage node, the plurality of second switches connected in series between the second voltage node and the third voltage node;
a third capacitor divider including a third flying capacitor and a plurality of third switches, the third capacitor divider connected to the third voltage node and a ground node, and a third intermediate voltage node between the third voltage node and the ground node, the plurality of third switches connected in series between the third voltage node and the ground node, the ground node coupled to a ground voltage; and
a first load capacitor, a second load capacitor, a third load capacitor, a fourth load capacitor, a fifth load capacitor and a sixth load capacitor which are connected in series between the first voltage node and the ground node.

8. The voltage dividing capacitor circuit of claim 7, further comprising:
a fourth capacitor divider including a fourth flying capacitor and a plurality of fourth switches, the fourth capacitor divider connected to the second voltage node, the ground voltage and the third voltage node, the plurality of fourth switches connected in series between the second voltage node and the ground node; and
a fifth capacitor divider including a fifth flying capacitor and a plurality of fifth switches, the fifth capacitor divider connected to the first voltage node, the third voltage node and the second voltage node, the plurality of fifth switches connected in series between the first voltage node and the third voltage node.

9. The voltage dividing capacitor circuit of claim 8, wherein:
the fourth capacitor divider is configured to receive a second voltage at the second voltage node, generate a third voltage based on the second voltage and the ground voltage; and output the third voltage to the third voltage node coupled between two of the plurality of fourth switches;
the fifth capacitor divider is configured to generate a first voltage based on the second voltage and the third voltage and output the first voltage to the second voltage node coupled between two of the plurality of first switches;
the first capacitor divider is configured to generate a fourth voltage based on the first voltage and the second voltage and output the fourth voltage to the first intermediate voltage node coupled between two of the plurality of first switches;
the second capacitor divider is configured to generate a fifth voltage based on the second voltage and the third voltage and output the fifth voltage to the second intermediate voltage node coupled between two of the plurality of second switches;
the third capacitor divider is configured to generate a sixth voltage based on the third voltage and the ground voltage and output the sixth voltage to the third intermediate voltage node coupled between two of the plurality of third switches;
the fourth voltage corresponds to 5/6 of the first voltage;
the second voltage corresponds to 4/6 of the first voltage;
the fifth voltage corresponds to 3/6 of the first voltage;
the third voltage corresponds to 2/6 of the first voltage; and
the sixth voltage corresponds to 1/6 of the first voltage.

10. The voltage dividing capacitor circuit of claim 7, further comprising:
a fourth capacitor divider including a fourth flying capacitor, a fifth flying capacitor and a plurality of fourth switches, the fourth capacitor divider connected to first voltage node, the ground node, the second voltage node, and the third voltage node, the plurality of fourth switches connected in series between the first voltage node and the ground node.

11. The voltage dividing capacitor circuit of claim 10, wherein:
the fourth capacitor divider is configured to receive a first voltage at the first voltage node, generate a second voltage and a third voltage based on the first voltage and the ground voltage; and output the second voltage and the third voltage to the second voltage node and the third voltage node respectively;
the first capacitor divider is configured to generate a fourth voltage based on the first voltage and the second voltage and output the fourth voltage to the first intermediate voltage node;
the second capacitor divider is configured to generate a fifth voltage based on the second voltage and the third voltage and output the fifth voltage to the second intermediate voltage node;
the third capacitor divider is configured to generate a sixth voltage based on the third voltage and the ground voltage and output the sixth voltage to the third intermediate voltage node;
the fourth voltage corresponds to 5/6 of the first voltage;
the second voltage corresponds to 4/6 of the first voltage;
the fifth voltage corresponds to 3/6 of the first voltage;
the third voltage corresponds to 2/6 of the first voltage; and
the sixth voltage corresponds to 1/6 of the first voltage.

12. A supply modulator comprising:
a voltage dividing capacitor circuit including at least two capacitor dividers and at least two load capacitors, the at least two capacitor dividers connected to a first voltage node, a ground node and a second voltage node between the first voltage node and the ground node, the ground node being coupled to a ground voltage, the at least two load capacitors being connected in series between the first voltage node and the ground node; and
a DC-DC converter configured to generate a current based on a battery voltage, and output the current to at least one of the first voltage node and the second voltage node, and
wherein the voltage dividing capacitor circuit is configured to generate a plurality of voltages based on the current, and output the plurality of voltages to the first voltage node, the second voltage node and first and second intermediate voltage nodes, respectively, the plurality of voltages having a plurality of respective levels, the first intermediate voltage node connected between the first voltage node and the second voltage node, and the second intermediate voltage node connected between the second voltage node and the ground node.

13. The supply modulator of claim 12, further comprising:
a comparator block including a plurality of comparators, the plurality of comparators each configured to, compare one of the plurality of voltages and one of a plurality of reference voltages, and generate a plurality of comparison signals based on results of the comparisons; and
a phase control signal generator configured to generate a set of phase control signals based on the plurality of comparison signals, the phase control signal generator configured to provide the phase control signal to the voltage dividing capacitor circuit.

14. The supply modulator of claim 12, wherein the DC-DC converter includes:
a first transistor connected between the battery voltage and the second voltage node and having a first gate to receive a first switch control signal;
a second transistor connected between the second voltage node and the ground node and having a second gate to receive a second switch control signal;
a comparator configured to compare a second voltage at the second voltage node with a second reference voltage of a plurality of reference voltages and generate an internal comparison signal based on the comparison; and
a controller configured to generate the first switch control signal and the second switch control signal based on the internal comparison signal.

15. The supply modulator of claim 12, further comprising:
a comparator block including a plurality of comparators, the plurality of comparators each configured to, compare one of the plurality of voltages and one of a plurality of reference voltages, and generate a plurality of comparison signals based on results of the comparisons;
a power switch control signal generator configured to generate a first set of power switch control signals based on a first comparison signal of the plurality of comparison signals, and a second comparison signal of the plurality of comparison signals, the first comparison signal associated with the first voltage node, the second comparison signal associated with the second voltage node, the power switch control signal generator configured to provide the first set of power switch control signals to the DC-DC converter; and
a phase control signal generator configured to generate a set of phase control signals based on the plurality of comparison signals, the phase control signal generator configured to provide the phase control signal to the voltage dividing capacitor circuit.

16. The supply modulator of claim 15, wherein the DC-DC converter includes:
an inductor coupled to the battery voltage;
a first power switch connected between the inductor and the first voltage node;
a second power switch connected between the inductor and the second voltage node; and
a third power switch connected between the inductor and the ground node,
wherein the DC-DC converter is configured to generate a current based on an energy stored in the inductor, and output the current to at least one of the first voltage node and the second voltage node based on the first set of power switch control signals.

17. The supply modulator of claim 15, wherein the voltage dividing capacitor circuit includes:
a first capacitor divider connected between the first voltage node and the ground node;
a second capacitor divider connected between a first terminal of a first load capacitor of the at least two load capacitors and a first terminal of a second load capacitor of the at least two load capacitors; and
a third capacitor divider connected between the second voltage node and the ground node, wherein
the first capacitor divider includes a plurality of first switches connected in series between the first voltage node and the ground node, and a first flying capacitor connected between two of the plurality of first switches, the second capacitor divider includes a plurality of second switches connected in series between the first voltage node and the second voltage node, and a second flying capacitor connected between two of the plurality of second switches, and the third capacitor divider includes a plurality of third switches connected in series between the second voltage node and the ground node, and a third flying capacitor connected between two of the plurality of third switches and wherein the at least two load capacitors include the first load capacitor, the second load capacitor, a third load capacitor and a fourth load capacitor which are connected in series between the first voltage node and the ground node.

18. The supply modulator of claim 17, wherein:

the first capacitor divider is configured to receive a first voltage at the first voltage node, generate a second voltage corresponding to one half of the first voltage, and output the second voltage to the second voltage node;

the second capacitor divider is configured to generate a third voltage based on the first voltage and the second voltage, and output the third voltage to the first intermediate voltage node, the first intermediate voltage node coupled between the plurality of second switches; and the third capacitor divider is configured to generate a fourth voltage based on the second voltage and the ground voltage, and output the fourth voltage to the second intermediate voltage node, the second intermediate voltage node coupled between the plurality of third switches, the third voltage corresponds to one half of a sum of the first voltage and the second voltage; and the fourth voltage corresponds to one half of the second voltage.

19. The supply modulator of claim 17, wherein the DC-DC converter is configured to:

provide the current to the first voltage node to charge the first load capacitor, the second load capacitor, the third load capacitor and the fourth load capacitor;

regulate a voltage charged in the first flying capacitor using a first error amplifier;

regulate a voltage charged in the second flying capacitor using a second error amplifier;

regulate a voltage charged in the third flying capacitor using a third error amplifier; and soft-start the voltage dividing capacitor circuit.

20. The supply modulator of claim 12, wherein the voltage dividing capacitor circuit includes:

a first capacitor divider connected to the first voltage node and the ground node;

a second capacitor divider connected to the first voltage node, the second voltage node, and the first intermediate voltage node;

a third capacitor divider connected to the second voltage node, the ground node, and to the second intermediate voltage node;

a fourth capacitor divider connected to the first voltage node, the first intermediate voltage node, and a third intermediate voltage node;

a fifth capacitor divider connected to the first intermediate voltage node, the second voltage node, and a fourth intermediate voltage node;

a sixth capacitor divider connected to the second voltage node, the second intermediate voltage node, and a fifth intermediate voltage node; and a seventh capacitor divider connected to the second intermediate voltage node, the ground node, and a sixth intermediate voltage node, and wherein the at least two load capacitors include first through eighth load capacitors which are connected in series between the first voltage node and the ground node.

* * * * *